United States Patent
Nakamura

(10) Patent No.: US 11,073,760 B2
(45) Date of Patent: Jul. 27, 2021

(54) COLORING COMPOSITION, COLOR FILTER, PATTERN FORMING METHOD, SOLID-STAGE IMAGING ELEMENT, AND IMAGE DISPLAY DEVICE

(71) Applicant: FUJIFILM Corporation, Tokyo (JP)

(72) Inventor: Shoichi Nakamura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 196 days.

(21) Appl. No.: 16/249,578

(22) Filed: Jan. 16, 2019

(65) Prior Publication Data

US 2019/0163053 A1 May 30, 2019

Related U.S. Application Data

(63) Continuation of application No. PCT/JP2017/026475, filed on Jul. 21, 2017.

(30) Foreign Application Priority Data

Jul. 29, 2016 (JP) .............................. JP2016-149996
Jul. 20, 2017 (JP) .............................. JP2017-140992

(51) Int. Cl.

| G03F 7/004 | (2006.01) |
|---|---|
| G03F 7/033 | (2006.01) |
| G03F 7/038 | (2006.01) |
| G03F 7/039 | (2006.01) |
| G03F 7/16 | (2006.01) |
| G03F 7/20 | (2006.01) |
| G03F 7/32 | (2006.01) |
| G03F 7/029 | (2006.01) |
| C09B 47/04 | (2006.01) |
| C09B 57/04 | (2006.01) |
| C09B 67/00 | (2006.01) |
| G02B 5/20 | (2006.01) |
| G02F 1/1335 | (2006.01) |
| G02B 5/22 | (2006.01) |
| G03F 7/00 | (2006.01) |
| C09B 67/22 | (2006.01) |
| G03F 7/027 | (2006.01) |
| G03F 7/105 | (2006.01) |
| G03F 7/031 | (2006.01) |
| H01L 27/32 | (2006.01) |
| H01L 27/146 | (2006.01) |

(52) U.S. Cl.

CPC ............ *G03F 7/0007* (2013.01); *C09B 47/04* (2013.01); *C09B 57/04* (2013.01); *C09B 67/0033* (2013.01); *G02B 5/20* (2013.01); *G02B 5/223* (2013.01); *G02F 1/1335* (2013.01); *G03F 7/027* (2013.01); *G03F 7/029* (2013.01); *G03F 7/031* (2013.01); *G03F 7/033* (2013.01); *G03F 7/038* (2013.01); *G03F 7/039* (2013.01); *G03F 7/0388* (2013.01); *G03F 7/105* (2013.01); *G03F 7/162* (2013.01); *G03F 7/168* (2013.01); *G03F 7/2004* (2013.01); *G03F 7/322* (2013.01); *H01L 27/322* (2013.01); *H01L 27/14621* (2013.01)

(58) Field of Classification Search

CPC ........ G03F 7/031; G03F 7/0007; G03F 7/105; G03F 7/027; G03F 7/0388; G03F 7/00; G03F 7/029; G03F 7/038; G03F 7/033; G03F 7/39; G03F 7/039; G03F 7/16; G03F 7/20; G03F 7/32; G03F 7/162; G03F 7/168; G03F 7/2004; G03F 7/322; G02B 5/20; G02B 5/201; G02B 5/233; G02B 5/223; G02F 1/1335; G02F 1/133514; C09B 47/04; C09B 57/04; C09B 67/0033

See application file for complete search history.

(56) References Cited

U.S. PATENT DOCUMENTS

| 2015/0285973 A1* | 10/2015 | Ho | ................... G02F 1/133516 522/62 |
|---|---|---|---|
| 2016/0077428 A1* | 3/2016 | Wu | ........................ G03F 7/027 252/586 |
| 2016/0139507 A1* | 5/2016 | Kim | ...................... G03F 7/0388 252/586 |
| 2019/0155150 A1* | 5/2019 | Nakamura | ............... G02B 5/20 |
| 2019/0163053 A1 | 5/2019 | Nakamura | |

FOREIGN PATENT DOCUMENTS

| JP | 2010-097172 A | | 4/2010 | |
|---|---|---|---|---|
| JP | 2011-039307 | * | 2/2011 | ............. G03F 7/004 |
| JP | 2011-099975 | * | 5/2011 | |
| JP | 2011-102945 | * | 5/2011 | ............. G03F 7/004 |
| JP | 2013-064999 A | | 4/2013 | |
| JP | 2014043556 A | | 3/2014 | |
| JP | 2014-142582 | * | 8/2014 | ............. G03F 7/027 |

(Continued)

OTHER PUBLICATIONS

Machine translation of JP 2014-142582 (2014).*

(Continued)

*Primary Examiner* — Martin J Angebranndt
(74) *Attorney, Agent, or Firm* — Sughrue Mion, PLLC

(57) ABSTRACT

A coloring composition contains a halogenated zinc phthalocyanine pigment A, an isoindoline pigment B, a resin C, and a curable compound D having an ethylenically unsaturated bonding group, in which the resin C includes a resin C1 having a repeating unit derived from a polymerizable compound Cm having a C Log P value of 3.0 or more with the C Log P value being a calculated value of a Log P which is the common logarithm of a partition coefficient P of 1-octanol/water, and having a cyclic structure in a molecule thereof, and the ratio of the mass of the halogenated zinc phthalocyanine pigment A to the mass of the isoindoline pigment B is 55:45 to 85:15 in terms of the mass of the halogenated zinc phthalocyanine pigment A:the mass of the isoindoline pigment B.

17 Claims, No Drawings

(56) References Cited

FOREIGN PATENT DOCUMENTS

| JP | 2015-102612 | A | | 6/2015 | | |
|---|---|---|---|---|---|---|
| JP | 2015-151465 | A | | 8/2015 | | |
| JP | 2015-169880 | A | | 9/2015 | | |
| JP | 2015-180712 | A | | 10/2015 | | |
| JP | 2015-197677 | A | | 11/2015 | | |
| JP | 2016-003288 | | * | 1/2016 | ............ | G03F 7/004 |
| JP | 2016065115 | A | | 4/2016 | | |
| JP | 2016-106270 | A | | 6/2016 | | |
| JP | 2016-145975 | | * | 8/2016 | ............ | G03F 7/004 |
| JP | 2016-145977 | | * | 8/2016 | | |
| JP | 2016-191745 | | * | 11/2016 | ............ | G03F 7/004 |
| KR | 20120046462 | | * | 5/2012 | | |
| KR | 1020190005979 | A | | 1/2019 | | |
| TW | 201612636 | A | | 4/2016 | | |

OTHER PUBLICATIONS

Machine translation of JP 2011-102945 (2011).*
Machine translation of JP 2011-039307 (2011).*
Machine translation of JP 2016-003288 (2016).*
Machine translation of JP 2011-099975 (2011).*
Machine translation of KR 20120046462 (2012).*
Fujii et al., "crystal structure of pigment yellow 138 derivative", Anal. Sci. vol. 20 pp. x35-x36 (2004).*
Machine translation of JP 2016-145977 (2016).*
Machine translation of JP 2016-191745 (Nov. 2016).*
Machine translation of JP 2016-145975 (Aug. 2016).*
Written Opinion of PCT/JP2017/026475 dated Sep. 26, 2017.
International Preliminary Report on Patentabiliy with English Translation of the Written Opinion of PCT/JP2017/026475 dated Jan. 29, 2019.
International Search Report of PCT/JP2017/026475 dated Sep. 26, 2017.
Communication dated Oct. 15, 2019, from the Korean Intellectual Property Office in application No. 10-2018-7035819.
Communication dated Jul. 1, 2020, from the Korean Intellectual Property Office in application No. 10-2020-7014987.
Communication dated Oct. 29, 2020 from the Taiwanese Intellectual Property Office in TW Application No. 106124857.

* cited by examiner

COLORING COMPOSITION, COLOR FILTER, PATTERN FORMING METHOD, SOLID-STAGE IMAGING ELEMENT, AND IMAGE DISPLAY DEVICE

CROSS-REFERENCE TO RELATED APPLICATIONS

This application is a Continuation of PCT International Application No. PCT/JP2017/26475, filed on Jul. 21, 2017, which claims priority under 35 U.S.C. § 119(a) to Japanese Patent Application No. 2016-149996, filed on Jul. 29, 2016 and Japanese Patent Application No. 2017-140992, filed on Jul. 20, 2017. Each of the above application(s) is hereby expressly incorporated by reference, in its entirety, into the present application.

BACKGROUND OF THE INVENTION

1. Field of the Invention

The present invention relates to a coloring composition. It further relates to a color filter, a pattern forming method, a solid-state imaging element, and an image display device, each using the coloring composition.

2. Description of the Related Art

In recent years, as a digital camera, a mobile phone with a camera, and the like have been further spreading, there has been an increasing demand for a solid-state imaging element such as a charge coupled device (CCD) image sensor. A color filter has been used as a key device in a display or optical element.

In some cases, a pigment is used as a coloring agent in a coloring composition for a color filter. Further, as a coloring composition for producing a green color filter, a coloring composition including a green pigment and a yellow pigment, and the like are known.

For example, JP2015-197677A describes a coloring composition containing (A) coloring agent, (B) alkali-soluble resin, (C) photopolymerizable compound, (D) photopolymerization initiator, and (E) solvent, in which (A) coloring agent includes a green pigment of Pigment Green 7, and (B) alkali-soluble resin contains a first resin including an epoxy group, an acid functional group capable of reacting with an epoxy group, and a second resin having an acid value of 170 to 300 mgKOH/g.

Furthermore, JP2010-097172A describes a coloring composition including (A) halogenated zinc phthalocyanine pigment, (B) yellow pigment, (C) polymerizable compound, (D) binder resin, and (E) photopolymerization initiator, in which ( ) polymerizable compound includes (C-1) polymerizable compound having two polymerizable groups in a molecule thereof and (C-2) polymerizable compound having five or six polymerizable groups in a molecule thereof, and the content of (C-1) polymerizable compound having two polymerizable groups in a molecule thereof is 15% to 40% by mass with respect to the total amount of (C-1) polymerizable compound having two polymerizable groups in a molecule thereof and (C-2) polymerizable compound having five or six polymerizable groups in a molecule thereof.

In addition, JP2013-064999A describes a coloring composition including Color Index (C. I.) Pigment Green 58, C. I. Pigment Yellow 185, and the like.

SUMMARY OF THE INVENTION

On the other hand, in recent years, color filters are required to have further improved light resistance.

Therefore, an object of the present invention is to provide a coloring composition capable of producing a film or the like having excellent light resistance, a color filter, a pattern forming method, a solid-state imaging element, and an image display device.

The present inventors have conducted extensive studies on a film including a halogenated zinc phthalocyanine pigment and an isoindoline pigment, and have thus found that the light resistance of the film is easily lowered. A reason therefor is presumed that the halogenated zinc phthalocyanine pigment and the isoindoline pigment are brought into contact with each other in the film, and thus, the both cause interaction.

In addition, according to the studies conducted by the present inventors, it could be seen that the light resistance of the film is particularly easily lowered in an environment with a high humidity. In the environment with a high humidity, the moisture is easily incorporated into the film, the components in the film easily move due to a moisture present in the film, and as a result, the halogenated zinc phthalocyanine pigment and the isoindoline pigment are more easily brought into contact with each other and the light resistance is easily lowered.

Therefore, the present inventors have considered that in a case where the contact of the halogenated zinc phthalocyanine pigment with the isoindoline pigment in the film can be suppressed, their mutual interaction can be suppressed, and the light resistance can be improved. Furthermore, as a result of extensive studies, the present inventors have found that it is possible to produce a film having excellent light resistance by using a coloring composition which will be described later, thereby leading to completion of the present invention. The present invention provides the followings.

<1> A coloring composition comprising:
a halogenated zinc phthalocyanine pigment A;
an isoindoline pigment B;
a resin C; and
a curable compound D,
in which the resin C includes a resin C1 having a repeating unit derived from a polymerizable compound Cm having a C Log P value of 3.0 or more with the C Log P value being a calculated value of a Log P which is the common logarithm of a partition coefficient P of 1-octanol/water, and having a cyclic structure in a molecule thereof, and
a ratio of the mass of the halogenated zinc phthalocyanine pigment A to the mass of the isoindoline pigment B is 55:45 to 85:15 in terms of the mass of the halogenated zinc phthalocyanine pigment A:the mass of the isoindoline pigment B.

<2> The coloring composition as described in <1>,
in which the resin C1 is contained in the amount of 5% by mass or more with respect to the total mass of the resin C.

<3> The coloring composition as described in <1> or <2>,
in which the repeating unit derived from the polymerizable compound Cm is contained in the amount of 5% to 95% by mole with respect to all the repeating units of the resin C1.

<4> The coloring composition as described in any one of <1> to <3>,
in which the resin C1 further has a repeating unit having an acid group.

<5> The coloring composition as described in any one of <1> to <4>,
in which the polymerizable compound Cm has at least one selected from an aliphatic ring or an aromatic hydrocarbon ring.
<6> The coloring composition as described in any one of <1> to <5>,
in which an acid value of the resin C1 is 10 to 160 mgKOH/g.
<7> The coloring composition as described in any one of <1> to <6>,
in which the curable compound D includes a polymerizable compound.
<8> The coloring composition as described in <7>, further comprising a photopolymerization initiator.
<9> The coloring composition as described in any one of <1> to <8>,
in which the curable compound D includes a compound having an epoxy group.
<10> A color filter using the coloring composition as described in any one of <1> to <9>.
<11> A pattern forming method comprising:
forming a coloring composition layer on a support using the coloring composition as described in any one of <1> to <9>; and
forming a pattern on the coloring composition layer by a photolithographic method or a dry etching method.
<12> A solid-state imaging element comprising the color filter as described in <10>.
<13> An image display device comprising the color filter as described in <10>.

According to the present invention, it is possible to provide a coloring composition capable of producing a film having excellent light resistance, a color filter, a pattern forming method, a solid-state imaging element, and an image display device.

DESCRIPTION OF THE PREFERRED EMBODIMENTS

Hereinafter, the contents of the present invention will be described in detail.

In citations for a group (atomic group) in the present specification, in a case where the group is denoted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

In the present specification, "exposure" includes, unless otherwise specified, not only exposure using light but also lithography using particle rays such as electron beams and ion beams. In addition, examples of light used for the exposure generally include actinic rays or radiation such as a bright line spectrum of a mercury lamp, far ultraviolet rays typified by an excimer laser, extreme ultraviolet rays (EUV light), X-rays, electron beams, or the like.

In the present specification, a numerical range expressed using "to" means a range that includes the preceding and succeeding numerical values of "to" as the lower limit value and the upper limit value, respectively.

In the present specification, the total solid content refers to a total amount of the components other than a solvent from all the components of a composition.

In the present specification, "(meth)acrylate" represents either or both of acrylate and methacrylate, "(meth)acryl" represents either or both of acryl and methacryl, "(meth)allyl" represents either or both of allyl and methallyl, and "(meth)acryloyl" represents either or both of acryloyl and methacryloyl.

In the present specification, a term "step" not only means an independent step, but also includes a step which is not clearly distinguished from other steps in a case where an intended action of the step is obtained.

In the present specification, a weight-average molecular weight (Mw) and a number-average molecular weight (Mn) are each defined as a value in terms of polystyrene through measurement by means of gel permeation chromatography (GPC).

In the present invention, a pigment means an insoluble compound which is sparingly soluble in a specific solvent. It typically means a compound which exists in a state where it is dispersed as particles in a composition. Here, examples of the solvent include the solvents exemplified in the section of a solvent which will be described later. The pigment used in the present invention is preferably, for example, an insoluble compound which is sparingly soluble in propylene glycol monomethyl ether acetate.

<Coloring Composition>

The coloring composition of an embodiment of the present invention contains a halogenated zinc phthalocyanine pigment A, an isoindoline pigment B, a resin C, and a curable compound D having an ethylenically unsaturated group,
in which the resin C includes a resin C1 having a repeating unit derived from a polymerizable compound Cm having a C Log P value of 3.0 or more and having a cyclic structure in a molecule thereof, and
a ratio of the mass of the halogenated zinc phthalocyanine pigment A to the mass of the isoindoline pigment B is 55:45 to 85:15 in terms of the mass of the halogenated zinc phthalocyanine pigment A:the mass of the isoindoline pigment B.

By using a coloring composition having the configuration, it is possible to produce a film having excellent light resistance. In particular, it is possible to produce a film having excellent light resistance even in an environment with a high humidity. Further, a film obtained by using the coloring composition of the embodiment of the present invention can suppress the fading of the halogenated zinc phthalocyanine pigment due to irradiation with light and can suppress variation in green spectral. Thus, the film has particularly preferred characteristics for a green color filter. A mechanism for obtaining the effect of the present invention is presumed to be as follows.

In the coloring composition of the embodiment of the present invention, a resin C1 having a repeating unit derived from a polymerizable compound Cm having a C Log P value of 3.0 or more and having a cyclic structure in a molecule thereof is used. The polymerizable compound Cm which is a copolymerization component of the resin C1 is a material which has a C Log P value of 3.0 or more and has high hydrophobicity. That is, the resin C1 is a material having a high-hydrophobicity structure. Further, the polymerizable compound Cm has a cyclic structure, in addition to having a C Log P value of 3.0 or more, and therefore, the resin C1 having a repeating unit derived from a polymerizable compound Cm has an effect of increasing the glass transition temperature (Tg) of the film. As a result, it is presumed that in a case where the coloring composition of the embodiment of the present invention includes the resin C1, it is possible to effectively suppress a moisture from being incorporated into the film from the external environment, and in addition, even in a case where the moisture remains in the film, the movement of the components in the film due to the moisture can be effectively suppressed. Therefore, it is presumed that the contact of the halogenated zinc phthalocyanine pigment A with the isoindoline pigment B can be effectively suppressed, and thus, excellent light resistance is obtained.

<<Halogenated Zinc Phthalocyanine Pigment A>>

The coloring composition of the embodiment of the present invention includes a halogenated zinc phthalocyanine pigment A. The halogenated zinc phthalocyanine pigment A is a compound in which zinc as a metal in the center is positioned in a region surrounded by four nitrogen atoms of an isoindole ring. The halogenated zinc phthalocyanine pigment A is preferably a compound represented by Formula (A1).

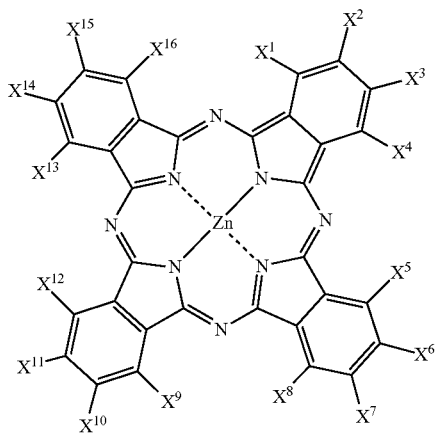

(A1)

It is preferable that in Formula (A1), any 8 to 16 members of $X^1$ to $X^{16}$ each independently represent a halogen atom, and the others each represent a hydrogen atom or a substituent.

Examples of the halogen atom include a chlorine atom, a bromine atom, a fluorine atom, and an iodine atom, and the bromine atom or the chlorine atom is particularly preferable. With regard to the substituent, reference can be made to the description in paragraph Nos. 0025 to 0027 of JP2013-209623A, the contents of which are incorporated herein by reference.

As for specific examples of the halogenated zinc phthalocyanine pigment A, for example, the aspects shown in <1> and <2> below may be mentioned as preferred examples.

<1> A halogenated zinc phthalocyanine pigment in which the average number of halogen atoms per molecule of the phthalocyanine is 8 to 12. In this aspect, it is preferable that $X^1$ to $X^{16}$ include one or more of chlorine atoms, bromine atoms, or hydrogen atoms. In addition, it is preferable that $X^1$ to $X^{16}$ have 0 to 4 chlorine atoms, 8 to 12 bromine atoms, and 0 to 4 hydrogen atoms. With regard to the specific examples, reference can be made to the description in paragraph Nos. 0013 to 0039, 0084, and 0085 of JP2007-284592A, the contents of which are incorporated herein by reference.

<2> A halogenated zinc phthalocyanine pigment in which the average number of halogen atoms per molecule of the phthalocyanine is 10 to 14, and the average number of bromine atoms per molecule of the phthalocyanine is 8 to 12, and the average number of chlorine atoms per molecule of the phthalocyanine is 2 to 5. Specific examples thereof include the compounds described in WO2015/118720A.

Examples of the halogenated zinc phthalocyanine pigment A include C. I. Pigment Green 58, 59, and the like which are compounds classified into Pigments in Color Index (C. I.; published by The Society of Dyers and Colourists).

<<Isoindoline Pigment B>>

The coloring composition of the embodiment of the present invention includes an isoindoline pigment B. Examples of the isoindoline pigment B include a compound having an isoindoline skeleton. The isoindoline pigment B is preferably a yellow pigment. The isoindoline pigment B is preferably a compound represented by Formula (B1).

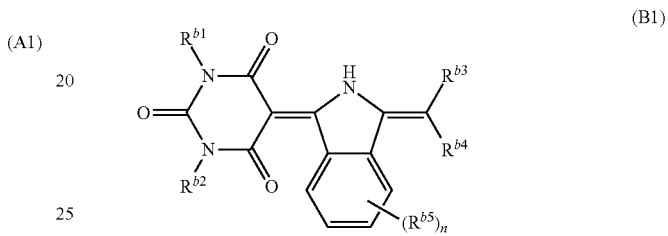

(B1)

In Formula (B1), $R^{b1}$ and $R^{b2}$ each independently represent a hydrogen atom or a substituent.

$R^{b3}$ and $R^{b4}$ each independently represent a substituent, and $R^{b3}$ and $R^{b4}$ may be bonded to each other to form a ring. $R^{b5}$ represents a substituent and n represents an integer of 0 to 4. In a case where n is 2 or more, a plurality of $R^{b5}$'s may be the same as or different from each other.

Examples of the substituent represented by $R^{b1}$ to $R^{b5}$ include a halogen atom, a cyano group, a nitro group, an alkyl group, an aryl group, a heterocyclic group, an aralkyl group, —$OR_Z^1$, —$COR_Z^1$, —$COOR_Z^1$, —$OCOR_Z^1$, —$NR_Z^1R_Z^2$, —$NHCOR_Z^1$, —$CONR_Z^1R_Z^2$, —$NHCONR_Z^1R_Z^2$, —$NHCOOR_Z^1$, —$SR_Z^1$, —$SO_2R_Z^1$, —$SO_2OR_Z^1$, —$NHSO_2R_Z^1$, and —$SO_2NR_Z^1R_Z^2$. $R_Z^1$ and $R_Z^2$ each independently represent a hydrogen atom, an alkyl group, an aryl group, a heterocyclic group, or an aralkyl group, and $R_Z^1$ and $R_Z^2$ may be bonded to each other to form a ring.

Examples of the halogen atom include a fluorine atom, a chlorine atom, a bromine atom, and an iodine atom.

The number of carbon atoms of the alkyl group is preferably 1 to 20, more preferably 1 to 15, and still more preferably 1 to 8. The alkyl group may be linear, branched, or cyclic.

The number of carbon atoms of the aryl group is preferably 6 to 20, and more preferably 6 to 12.

The alkyl moiety of the aralkyl group is the same as that of the alkyl group. The aryl moiety of the aralkyl group is the same as that of the aryl group. The number of carbon atoms of the aralkyl group is preferably 7 to 20, and more preferably 7 to 15.

The heterocyclic group is preferably a monocycle or a fused ring, preferably a monocycle or a fused ring having 2 to 8 fusions, and more preferably a monocycle or a fused ring having 2 to 4 fusions. The number of heteroatoms constituting the ring of the heteroaryl group is preferably 1 to 3. The heteroatom constituting the ring of the heterocyclic group is preferably a nitrogen atom, an oxygen atom, or a sulfur atom. The heterocyclic group is preferably a 5- or 6-membered ring. The number of carbon atoms constituting a ring of the heterocyclic group is preferably 3 to 20, more preferably 3 to 18, and still more preferably 3 to 12.

The alkyl group, the aralkyl group, the aryl group, and the heterocyclic group may have a substituent or may be unsubstituted. Examples of the substituent include the above-mentioned substituents, for example, an alkyl group, an aryl group, a heterocyclic group, and a halogen atom.

Examples of the ring formed by $R^{b3}$ and $R^{b4}$ include an aliphatic ring, an aromatic hydrocarbon ring, and a heterocycle, and the heterocycle is preferable. As the heterocycle, an imide ring is preferable, and barbituric acid is more preferable.

In Formula (B1), $R^{b1}$ and $R^{b2}$ are each independently preferably a hydrogen atom or an alkyl group, and more preferably a hydrogen atom.

In Formula (B1), n is preferably 0 or 1, and more preferably 0.

In Formula (B1), it is preferable that one of $R^{b3}$ or $R^{b4}$ represents a cyano group, and the other represents $-CONR_Z^1R_Z^2$, or $R^{b3}$ and $R^{b4}$ are bonded to each other to form a ring.

The isoindoline pigment B is preferably a compound represented by Formula (B1-1) or Formula (B1-2), and more preferably a compound represented by Formula (B1-2).

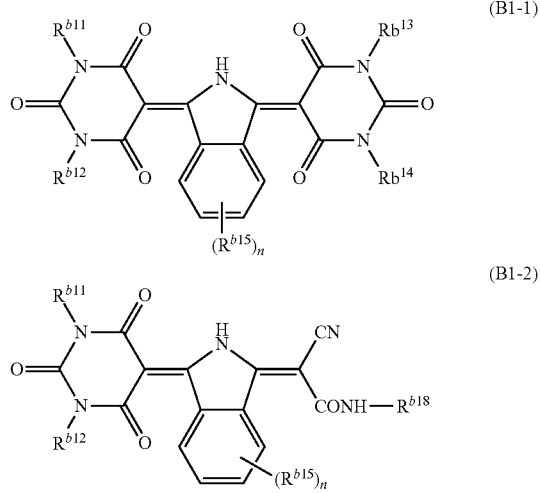

In Formula (B1-1), $R^{b11}$ to $R^{b14}$ each independently represent a hydrogen atom or a substituent. $R^{b15}$ represents a substituent, and n represents an integer of 0 to 4. In a case where n is 2 or more, a plurality of $R^{b15}$'s may be the same as or different from each other.

In Formula (B1-2), $R^{b11}$ and $R^{b12}$ each independently represent a hydrogen atom or a substituent. $R^{b15}$ and $R^{b16}$ represent a substituent, and n represents an integer of 0 to 4. In a case where n is 2 or more, a plurality of $R^{b15}$'s may be the same as or different from each other.

Examples of the substituent represented by $R^{b11}$ to $R^{b16}$ include the above-mentioned substituents described for Formula (B). $R^{b11}$ to $R^{b14}$ are each independently preferably a hydrogen atom or an alkyl group, and more preferably a hydrogen atom. $R^{b16}$ is preferably an alkyl group or an aryl group, and more preferably an alkyl group. n is preferably 0 or 1, and more preferably 0.

As the isoindoline pigment B, C. I. Pigment Yellow 139, 185, or the like can also be used. Among those, for a reason that it is easy to produce a film having excellent light resistance, C. I. Pigment Yellow 185 is preferable.

In the coloring composition of the embodiment of the present invention, the ratio of the mass of the halogenated zinc phthalocyanine pigment A to the mass of the isoindoline pigment B is 55:45 to 85:15, preferably 60:40 to 85:15, more preferably 65:35 to 85:15, still more preferably 66:34 to 85:15, particularly preferably 66:34 to 80:20, and most preferably 66:34 to 79:21, in terms of the mass of the halogenated zinc phthalocyanine pigment A:the mass of the isoindoline pigment B. In a case where the ratio of the mass of the halogenated zinc phthalocyanine pigment A to the mass of the isoindoline pigment B is within the range, it is possible to produce a film having excellent light resistance as shown in Examples which will be described later.

In the coloring composition of the embodiment of the present invention, the content of the halogenated zinc phthalocyanine pigment A is preferably 10% to 80% by mass with respect to the total solid content of the coloring composition. The lower limit thereof is, for example, more preferably 15% by mass or more, and still more preferably 18% by mass or more. The upper limit thereof is, for example, more preferably 70% by mass or less, and still more preferably 65% by mass or less.

In the coloring composition of the embodiment of the present invention, the content of the isoindoline pigment B is preferably 3% to 41% by mass with respect to the total solid content of the coloring composition. The lower limit thereof is, for example, more preferably 4% by mass or more, and still more preferably 5% by mass or more. The upper limit thereof is, for example, more preferably 36% by mass or less, and still more preferably 32% by mass or less.

In the coloring composition of the embodiment of the present invention, the total content of the halogenated zinc phthalocyanine pigment A and the isoindoline pigment B is preferably 20% to 90% by mass with respect to the total solid content of the coloring composition. The lower limit thereof is, for example, more preferably 30% by mass or more, and still more preferably 35% by mass or more. The upper limit thereof is, for example, more preferably 80% by mass or less, and still more preferably 75% by mass or less. In a case where the total content of the halogenated zinc phthalocyanine pigment A and the isoindoline pigment B is within the range, the effect of the present invention is effectively obtained.

The halogenated zinc phthalocyanine pigment A and the isoindoline pigment B may be used singly or in combination of two or more kinds thereof. In a case where two or more kinds of the halogenated zinc phthalocyanine pigment A and/or the isoindoline pigment B are included, the total content thereof is preferably within the range.

<<Other Coloring Agents>>

For the coloring composition of the embodiment of the present invention, coloring agents other than the halogenated zinc phthalocyanine pigment A and the isoindoline pigment B can further be used. Such other coloring agents may be either dyes or pigments, both of which may be used in combination. Examples of the pigments include various inorganic pigments or organic pigments known in the related art. Further, whether the pigments are inorganic or organic, taking the view that high transmittance is preferable into consideration, the pigments of which the average particle diameter is as fine as possible are preferably used, and taking handleability into consideration, the average particle diameter of the pigments is preferably 0.01 to 0.1 μm, and more preferably 0.01 to 0.05 μm.

Examples of the inorganic pigments include metal compounds such as a metal oxide and a metal complex salt. Further, examples thereof include black pigments such as carbon black and titanium black, oxides of metals such as iron, cobalt, aluminum, cadmium, lead, copper, titanium, magnesium, chromium, zinc, and antimony, and complex oxides of the metals.

Examples of the organic pigments include the following organic pigments.

C. I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 147, 148, 150, 151, 152, 153, 154, 155, 156, 161, 162, 164, 166, 167, 168, 169, 170, 171, 172, 173, 174, 175, 176, 177, 179, 180, 181, 182, 187, 188, 193, 194, 199, 213, and 214

C. I. Pigment Green 7, 10, 36, and 37

C. I. Pigment Orange 2, 5, 13, 16, 17:1, 31, 34, 36, 38, 43, 46, 48, 49, 51, 52, 55, 59, 60, 61, 62, 64, 71, and 73

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279

C. I. Pigment Violet 1, 19, 23, 27, 32, 37, and 42

C. I. Pigment Blue 1, 2, 15, 15:1, 15:2, 15:3, 15:4, 15:6, 16, 22, 60, 64, 66, 79, and 80

In addition, as the blue pigment, an aluminum phthalocyanine compound having a phosphorus atom can also be used. Specific examples thereof include the compounds described in paragraph Nos. 0022 to 0030 of JP2012-247591A and the compounds described in paragraph No. 0047 of JP2011-157478A.

As the dye, for example, the dyes disclosed in JP1989-090403A (JP-S64-090403A), JP1989-091102A (JP-S64-091102A), JP1989-094301A (JPH01-094301A), JP1994-011614A (JP-H06-011614A), JP2592207B, U.S. Pat. Nos. 4,808,501B, 5,667,920B, JP1993-333207A (JP-H05-333207A), JP1994-035183A (JP-H06-035183A), JP1994-051115A (JP-H06-51115A), and JP1994-194828A (JP-H06-194828A) can be used. In terms of classification based on the chemical structure, examples of the dye include a pyrazoleazo compound, a pyrromethene compound, an anilinoazo compound, a triarylmethane compound, an anthraquinone compound, a benzylidene compound, an oxonol compound, a pyrazolotriazoleazo compound, a pyridoneazo compound, a cyanine compound, a phenothiazine compound, and a pyrrolopyrazoleazomethine compound.

Moreover, as the coloring agent, a dye multimer can be used. The dye multimer is preferably a dye that is used after being dissolved in a solvent, but the dye multimer may form a particle. In a case where the dye multimer is the particle, it is usually used in a state of being dispersed in a solvent or the like. The dye multimer in the particle state can be obtained by, for example, emulsion polymerization. Examples of the dye multimer in the state of particles include the compounds described in JP2015-214682A. In addition, as the dye multimer, the compounds described in JP2011-213925A, JP2013-041097A, JP2015-028144A, JP2015-030742A, or the like can also be used.

In addition, as the yellow coloring agent, the quinophthalone compounds described in paragraph Nos. 0011 to 0034 of JP2013-054339A, the quinophthalone compounds described in paragraph Nos. 0013 to 0058 of JP2014-026228A, or the like can also be used.

In a case where the coloring composition of the embodiment of the present invention contains other coloring agents, the content of such other coloring agents is preferably 3% to 50% by mass with respect to the total solid content of the coloring composition. The upper limit thereof is preferably 45% by mass or less, and more preferably 40% by mass or less. The lower limit thereof is preferably 5% by mass or more, and more preferably 10% by mass or more. Such other coloring agents may be of one kind or two or more kinds. In a case where two or more kinds of such other coloring agents are included, the total amount thereof is preferably within the range.

<<Resin C>>

The coloring composition of the embodiment of the present invention includes a resin C. The resin C is blended in applications, such as an application for dispersing particles such as a pigment in the composition or an application as a binder. Incidentally, a resin which is usually used for dispersing particles such as a pigment is also referred to as a dispersant. However, such applications of the resin are only exemplary, and the resin can also be used for other purposes, in addition to the above-mentioned applications.

<<<Resin C1>>>

The coloring composition of the embodiment of the present invention includes a resin which has a repeating unit derived from a polymerizable compound Cm having a C Log P value of 3.0 or more and having a cyclic structure in a molecule thereof (hereinafter also referred to as a resin C1) as the resin C.

Here, the C Log P value is a calculated value of a Log P which is the common logarithm of a partition coefficient P of 1-octanol/water. A material having a high value of C log P means a hydrophobic material. Accordingly, the above-mentioned polymerizable compound Cm means a compound having high hydrophobicity. Further, the above-mentioned resin C1 including a repeating unit derived from a polymerizable compound Cm means a resin having a repeating unit having high hydrophobicity.

Furthermore, in the present specification, the C Log P value is a value calculated by the program "C LOG P" available from Daylight Chemical Information System, Inc. This program provides a value of the "calculation Log P" as calculated with a fragment approach of Hansch, Leo (see the following reference). The fragment approach is based on the chemical structure of a compound, and divides a chemical structure thereof into partial structures (fragments) to estimate the Log P value of the compound by summing the Log P contributions allocated for the fragments. In the present specification, as the fragment value, a Fragment database ver. 23 (Biobyte Corp.) was used. Examples of the calculation software include Bio Loom ver 1.5.

The polymerizable compound Cm constituting the resin C1 will be described. The C Log P value of the polymerizable compound Cm is 3.0 or more, preferably 3.2 or more, more preferably 3.5 or more, still more preferably 3.8 or more, and particularly preferably 4.0 or more. The upper limit thereof is preferably 10.0 or less, more preferably 7.0 or less, and still more preferably 5.0 or less. In a case where the C Log P value of the polymerizable compound Cm is 3.0 or more, it is possible to form a film having excellent light resistance. Further, in a case where the C Log P value of the polymerizable compound Cm is the upper limit value or less, incorporation of a developer is good, generation of development residues can be inhibited, and thus, an excellent lithographic property is obtained.

Examples of the polymerizable group contained in the polymerizable compound Cm include a vinyl group, a (meth)allyl group and a (meth)acryloyl group, and the (meth)allyl group and the (meth)acryloyl group are preferable. The number of the polymerizable groups contained in the polymerizable compound Cm is preferably 1 to 3, more preferably 1 or 2, and still more preferably 1.

Examples of the cyclic structure contained in the polymerizable compound Cm include an aliphatic ring, an aromatic hydrocarbon ring, and a heterocycle. For a reason that it is easy to produce a film having excellent light resistance, the aliphatic ring and the aromatic hydrocarbon ring are preferable, and the aliphatic ring is more preferable.

The number of carbon atoms constituting the ring of the aliphatic group is preferably 5 to 30, more preferably 5 to 20, and still more preferably 5 to 15. The aliphatic ring is preferably a saturated aliphatic ring. The aliphatic ring may be a monocycle or a fused ring. Further, the aliphatic ring may have a crosslinked structure. Incidentally, the aliphatic ring of the fused ring not having a crosslinked structure is also referred to as an aliphatic fused ring. Further, the monocyclic aliphatic ring having a crosslinked structure is also referred to as an aliphatic crosslinked ring. In addition, the aliphatic ring of the fused ring having a crosslinked structure is also referred to as an aliphatic crosslinked fused ring. In the present invention, the aliphatic ring is preferably the aliphatic crosslinked fused ring for a reason that the Tg of the film increases, and thus, the movement of the pigment can be suppressed. Specific examples of the aliphatic ring include cyclohexane, pinane, bornane, norpinane, norbornane, bicyclooctane (bicyclo[2.2.2]octane, bicyclo[3.2.1]octane, and the like), homobredane, adamantane, tricyclo[5.2.1.0$^{2,6}$]decane, tricyclo[4.3.1.1$^{2,5}$]undecane, tetracyclo[4.4.0.1$^{2,5}$.1$^{7,10}$]dodecane, and perhydro-1,4-methano-5,8-methanonaphthalene.

The aromatic hydrocarbon ring may be a monocycle or a fused ring. The aromatic hydrocarbon ring is preferably a fused ring. The number of the fused rings is preferably 2 to 8, and more preferably 2 to 4. The number of carbon atoms constituting the ring of the aromatic hydrocarbon ring is preferably 6 to 20, more preferably 6 to 15, and most preferably 6 to 10. The aromatic hydrocarbon ring is preferably a naphthalene ring.

The heterocycle may be a monocycle or a fused ring. The heterocycle is preferably the fused ring. The number of fusions of the fused ring is preferably 2 to 8, and more preferably 2 to 4. The number of the heteroatoms constituting the ring of the heterocycle is preferably 1 to 3. The heteroatoms constituting the ring of the heterocycle is preferably a nitrogen atom, an oxygen atom, or a sulfur atom. The heterocycle is preferably a 5- or 6-membered ring. The number of the carbon atoms constituting the ring of the heterocycle is preferably 3 to 20, more preferably 3 to 18, and still more preferably 3 to 12.

The polymerizable compound Cm is preferably a compound represented by Formula (Cm-100).

In the formula, $Z^{100}$ represents a polymerizable group, $L^{100}$ represents a single bond or a (n+m)-valent linking group, $A^{100}$ represents an aliphatic ring, an aromatic hydrocarbon ring, or a heterocycle, n represents an integer of 1 or more, and m represents an integer of 1 or more, and in a case where $L^{100}$ is the single bond, n and m are each 1.

Examples of the polymerizable group represented by $Z^{100}$ include a vinyl group, a (meth)allyl group, and a (meth)acryloyl group, and the (meth)allyl group and the (meth)acryloyl group are preferable.

Details of the aliphatic ring, the aromatic hydrocarbon ring, and the heterocycle represented by $A^{100}$ are the same as the above-mentioned ranges. $A^{100}$ is preferably an aliphatic ring, and more preferably a saturated aliphatic ring. Further, $A^{100}$ is particularly preferably an aliphatic crosslinked fused ring.

$L^{100}$ represents a single bond or an (n+m)-valent linking group. Examples of the (n+m)-valent linking group include a group formed of 1 to 100 carbon atoms, 0 to 10 nitrogen atoms, 0 to 50 oxygen atoms, 1 to 200 hydrogen atoms, and 0 to 20 sulfur atoms.

n represents an integer of 1 or more, and m represents an integer of 1 or more. n is preferably 1 to 3, more preferably 1 or 2, and still more preferably 1. m is preferably 1 to 3, more preferably 1 or 2, and still more preferably 1.

The polymerizable compound Cm is preferably a compound represented by Formula (Cm1) to Formula (Cm4), more preferably a compound represented by Formula (Cm1), Formula (Cm3), or Formula (Cm4), still more preferably a compound represented by Formula (Cm1) or Formula (Cm4), and particularly preferably a compound represented by Formula (Cm4).

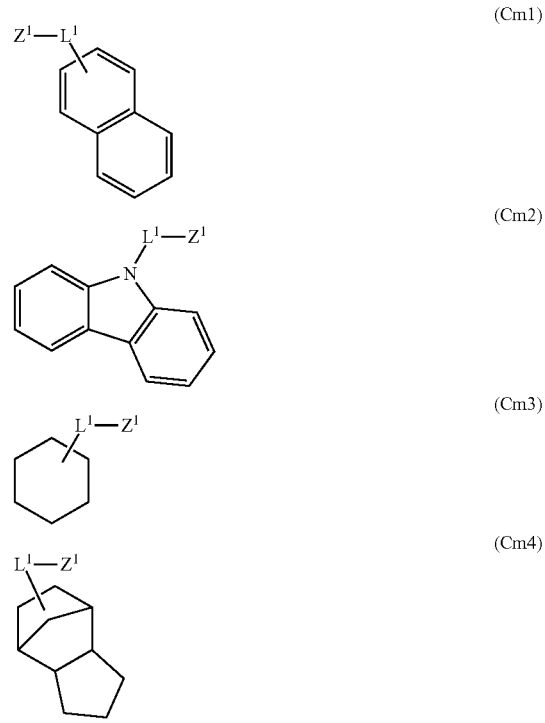

In the formulae, $L^1$ represents a single bond or a divalent linking group, an $Z^1$ represents a polymerizable group.

Examples of the divalent linking group represented by $L^1$ include an alkylene group (preferably an alkylene group having 1 to 10 carbon atoms), —NH—, —SO—, —SO$_2$—, —CO—, —O—, —COO—, —OCO—, —S—, and a group formed by combination of two or more thereof. $L^1$ is preferably a single bond or —O—.

Examples of the polymerizable group represented by $Z^1$ include a vinyl group, a (meth)allyl group, and a (meth)acryloyl group, the (meth)allyl group or the (meth)acryloyl group is preferable, and the (meth)acryloyl group is more preferable.

Specific examples of the polymerizable compound Cm include the following compounds. Further, the numerical values of the C Log P appended to the following structural formulae are C Log P values of the compounds.

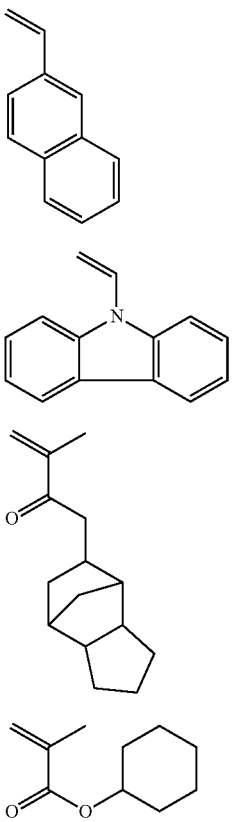

CLogP: 4.0

CLogP: 4.2

CLogP: 4.3

CLogP: 3.1

In the present invention, it is preferable that the resin C1 contains a repeating unit derived from a polymerizable compound Cm (hereinafter also referred to as a repeating unit Cm) in the amount of 5% to 95% by mole with respect to all the repeating units of the resin C1. The lower limit thereof is preferably 15% by mole or more, more preferably 20% by mole or more, still more preferably 23% by mole or more, and particularly preferably 25% by mole or more. The upper limit thereof is preferably 90% by mole or less, and more preferably 85% by mole or less. In a case where the content of the repeating unit Cm is within the range, it is easy to produce a film having excellent light resistance.

In the present invention, it is also preferable that the resin C1 further has a repeating unit having an acid group. Examples of the acid group include a carboxyl group, a sulfo group, and a phosphoric acid group, the carboxyl group or the sulfo group is preferable, and the carboxyl group is more preferable. In a case where the resin C1 further has a repeating unit having an acid group, it can be preferably used as an alkali-soluble resin. In addition, the resin C1 can also be used as a dispersant or a binder.

In a case where the resin C1 has a repeating unit having an acid group, the repeating unit having an acid group is preferably contained in the amount of 5% to 60% by mole with respect to all the repeating units of the resin C1. The lower limit thereof is preferably 10% by mole or more, and more preferably 15% by mole or more. The upper limit thereof is preferably 55% by mole or less, more preferably 50% by mole or less, still more preferably 45% by mole or less, and particularly preferably 40% by mole or less. In a case where the content of the repeating unit having an acid group is within the range, it is easy to produce a film having excellent light resistance. In addition, the developability of the coloring composition is also excellent.

The acid value of the resin C1 is preferably 10 to 220 mgKOH/g, more preferably 10 to 200 mgKOH/g, still more preferably 10 to 180 mgKOH/g, and particularly preferably 10 to 160 mgKOH/g. The lower limit thereof is preferably 20 mgKOH/g or more, more preferably 30 mgKOH/g or more, still more preferably 40 mgKOH/g or more, and particularly preferably 50 mgKOH/g or more. In a case where the acid value of the resin C1 is within the range, it is easy to produce a film having excellent light resistance. In addition, the developability of the coloring composition is also excellent. In particular, in a case where the resin C1 is used as an alkali-soluble resin, with the acid value of the resin C1 of 50 to 160 mgKOH/g, the developability of the coloring composition can be further improved.

In the present invention, it is also preferable that the resin C1 further has a repeating unit having a polymerizable group. Examples of the polymerizable group include a vinyl group, a (meth)allyl group, and a (meth)acryloyl group, and the (meth)allyl group or the (meth)acryloyl group is preferable. According to this aspect, the light resistance and the like can be further improved. The polymerizable group may be included in the above-mentioned repeating unit having an acid group or included in a repeating unit other than the above-mentioned repeating unit having an acid group. Further, only one or two or more polymerizable groups may be included in one repeating unit.

The resin C1 may have a repeating unit derived from a maleimide compound. Examples of the maleimide compound include an N-alkylmaleimide and an N-phenylmaleimide. Examples of the repeating unit derived from a maleimide compound include a repeating unit represented by Formula (C-mi).

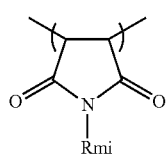

(C-mi)

In Formula (C-mi), Rmi represents an alkyl group or an aryl group. The number of carbon atoms of the alkyl group is preferably 1 to 20. The alkyl group may be linear, branched, or cyclic. The number of carbon atoms of the aryl group is preferably 6 to 20, more preferably 6 to 15, and still more preferably 6 to 10. Rmi is preferably an aryl group. Examples of the repeating unit represented by Formula (C-mi) include a repeating unit shown below.

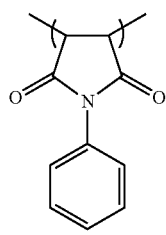

The resin C1 may include a repeating unit derived from a compound represented by Formula (ED1) described in the section of an alkali-soluble resin which will be described later or a repeating unit derived from a compound represented by Formula (X).

The weight-average molecular weight of the resin C1 is preferably 1,000 to 50,000, more preferably 3,000 to 30,000, and still more preferably 3,000 to 25,000. In a case where the weight-average molecular weight of the resin C1 is within the range, it is easy to produce a film having excellent light resistance.

Specific examples of the resin C1 include the following resins. The numerical values appended to the main chains are molar ratios. In C-12, x is 10 or 40, y is 30, and z is 30 or 60. In C-13, x is 20, y is 30, and z is 50.

C-1
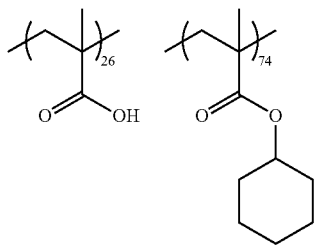

C-2
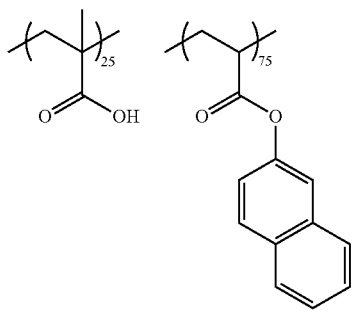

C-3
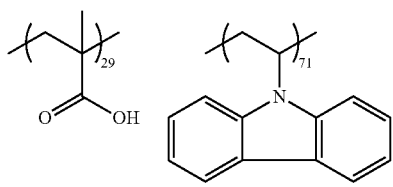

C-4
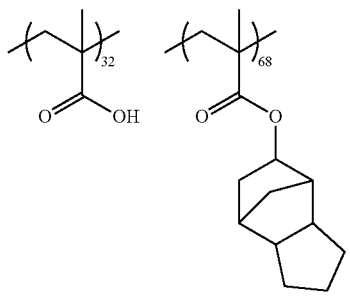

-continued

C-5
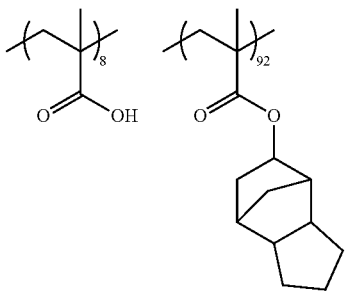

C-6
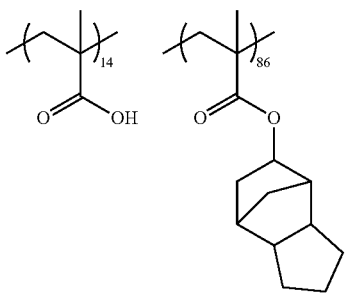

C-7
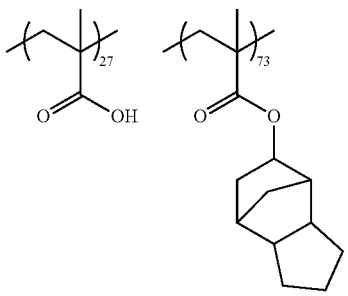

C-8
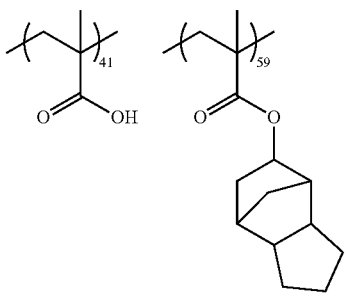

C-9
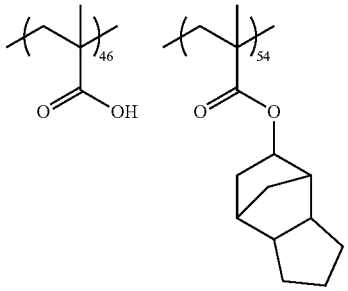

C-10 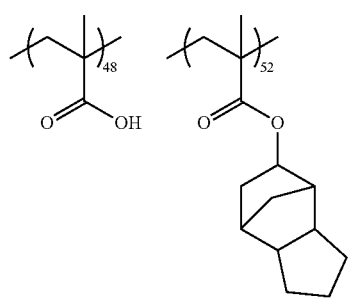
C-11 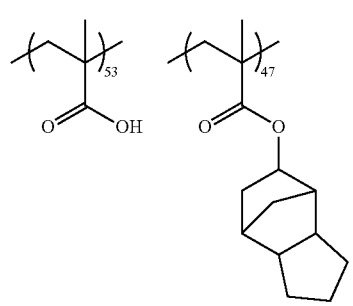
C-12 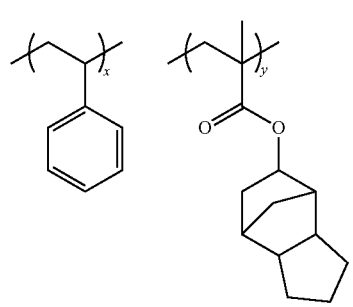
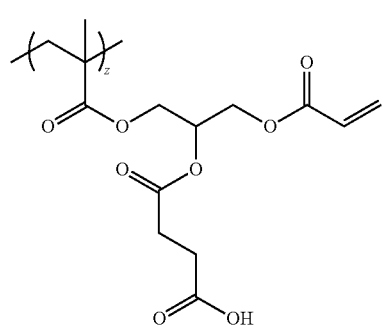
C-13 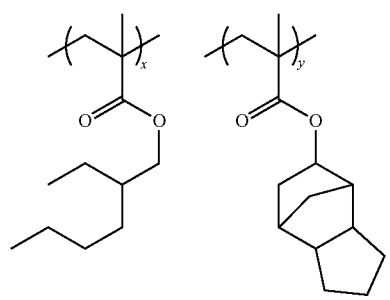
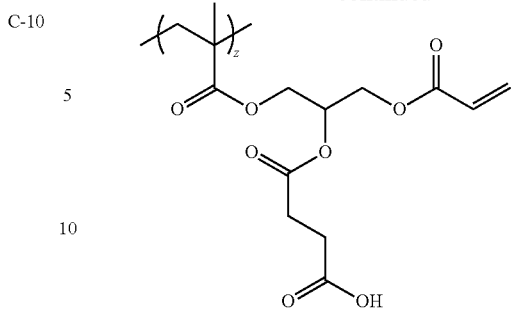
C-14 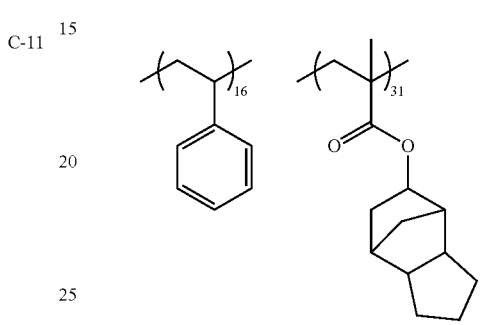
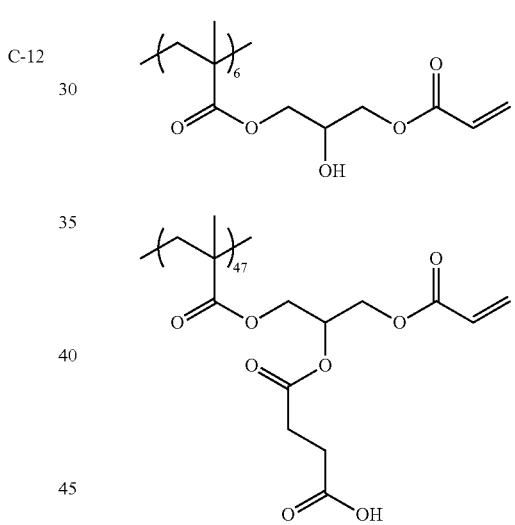
C-15 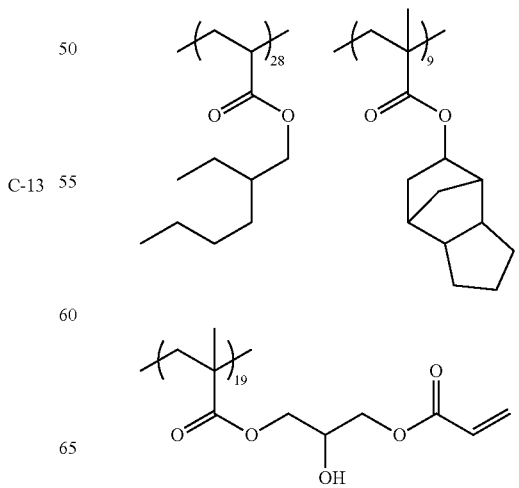

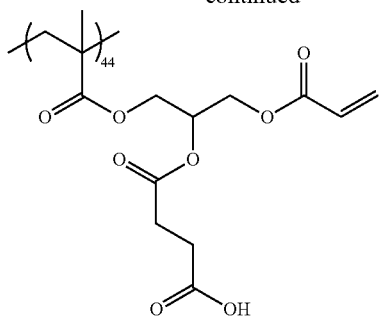

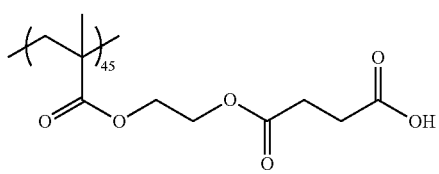

C-16

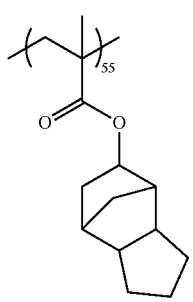

C-17

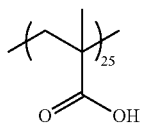 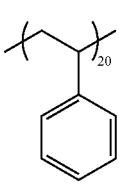 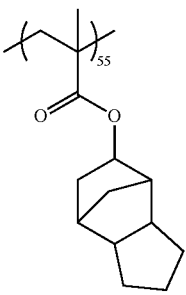

C-18

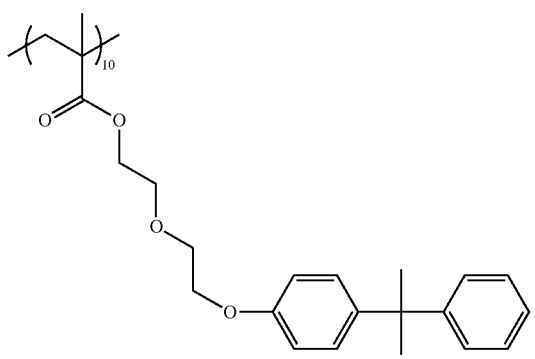

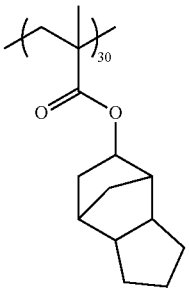

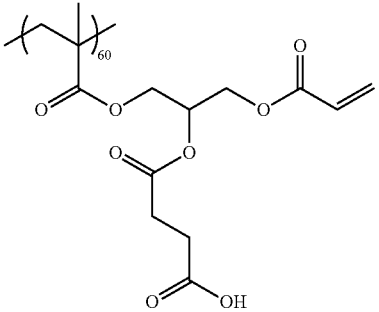

C-19

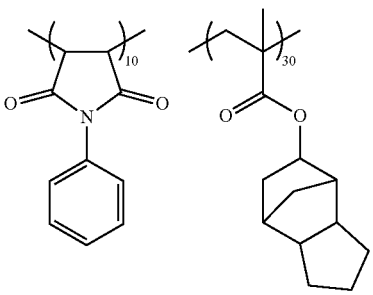

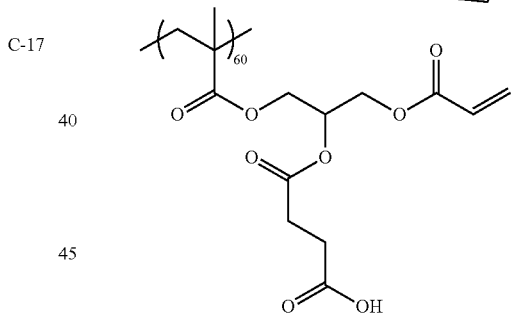

As the resin C1, a commercially available product can be used. Examples thereof include SPC-1110, SPC-1200, SPC-1210, SPC-1310, SPC-3100, SPC-3400, SPC-3500, SPC-3610, and SPC-3700 (all manufactured by Showa Denko K. K.), which are resins including repeating units derived from dicyclopentanyl acrylate. The C Log P value of the dicyclopentanyl acrylate is 4.3.

In the coloring composition of the embodiment of the present invention, the content of the resin C is preferably 1% to 80% by mass with respect to the total solid content of the coloring composition. The lower limit thereof is more preferably 5% by mass or more, and still more preferably 10% by mass or more. The upper limit thereof is more preferably 70% by mass or less, and still more preferably 60% by mass or less.

Furthermore, the resin C1 is contained in the amount of preferably 5% by mass or more, more preferably 10% by mass or more, still more preferably 20% by mass or more, even still more preferably 40% by mass or more, even still more preferably 50% by mass or more, and particularly preferably 80% by mass or more, in the total amount of the resin C. The upper limit thereof can be set to 100% by mass.

<<<Dispersant>>>

The coloring composition of the embodiment of the present invention can contain a dispersant as the resin C. Examples of the dispersant include an acidic dispersant (acidic resin) and a basic dispersant (basic resin). Incidentally, the above-mentioned resin C1 can also be used as the dispersant.

dispersants described in JP2007-277514A are also preferably used, the contents of which are incorporated herein by reference.

For the resin (dispersant), a graft copolymer can be used. With regard to details of the graft copolymer, reference can be made to the description in paragraph Nos. 0025 to 0094 of JP2012-255128A, the contents of which are incorporated herein by reference. Other examples thereof include the resins described in paragraph Nos. 0072 to 0094 of JP2012-255128A, the contents of which are incorporated herein by reference. Further, the following resin can be used.

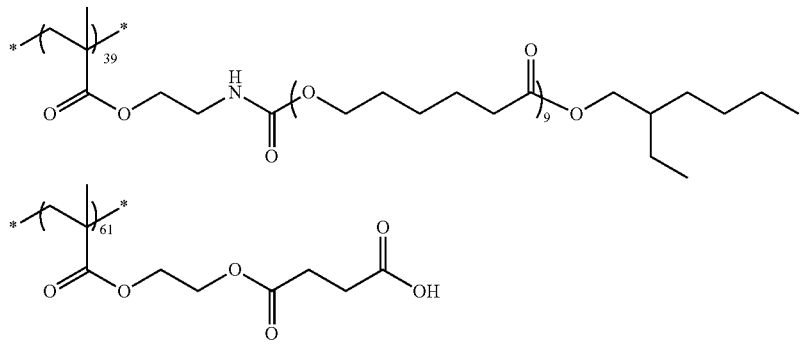

Here, the acidic dispersant (acidic resin) represents a resin in which the amount of acid groups is more than that of basic groups. As the acidic dispersant (acidic resin), a resin in which the amount of the acid groups is 70% by mole or more with respect to 100% by mole of the total amount of the acid groups and the basic groups is preferable, and a resin which is only substantially composed of acid groups is more preferable. The acid group contained in the acidic dispersant (acidic resin) is preferably a carboxyl group. The acid value of the acidic dispersant (acidic resin) is preferably 10 to 105 mgKOH/g.

Furthermore, the basic dispersant (basic resin) is a resin in which the amount of acid groups is more than that of basic groups. As the basic dispersant (basic resin), a resin in which the amount of the basic groups is 50% by mole or more with respect to 100% by mole of the total amount of the acid groups and the basic groups is preferable. The basic group contained in the basic dispersant is preferably an amino group.

Examples of the dispersant include a polymer dispersant [for example, a polyamidoamine and a salt thereof, a polycarboxylic acid and a salt thereof, a high-molecular-weight unsaturated acid ester, a modified polyurethane, a modified polyester, a modified poly(meth)acrylate, a (meth)acrylic copolymer, and a naphthalene sulfonic acid/formalin polycondensate], a polyoxyethylene alkyl phosphoric acid ester, a polyoxyethylene alkylamine, and an alkanolamine.

The polymer dispersants can further be classified into a linear polymer, a terminal-modified polymer, a graft type polymer, and a block type polymer, depending on its structure. The polymer dispersant is adsorbed on a surface of a pigment, and thus, acts to prevent re-aggregation. For this reason, examples of a preferable structure thereof include a terminal-modified polymer, a graft-type polymer, and a block-type polymer, which have an anchoring site for the surface of a pigment. Incidentally, the dispersants described in paragraph Nos. 0028 to 0124 of JP2011-070156A or the Furthermore, as the resin (dispersant), an oligoimine-based dispersant having a nitrogen atom in at least one of the main chain or a side chain can be used. As the oligoimine-based dispersant, a resin having a side chain including a repeating unit having a partial structure X having a functional group with a pKa of 14 or less and a side chain including a side chain Y having 40 to 10,000 atoms, and having a basic nitrogen atom in at least one of the main chain or the side chain is preferable. The basic nitrogen atom is not particularly limited as long as it is a nitrogen atom exhibiting basicity.

With regard to the oligoimine-based dispersant, reference can be made to the description in paragraph Nos. 0102 to 0174 of JP2012-255128A, the contents of which are incorporated herein by reference. Specific examples of the oligoimine-based dispersant include the resins described in paragraph Nos. 0168 to 0174 of JP2012-255128A.

The dispersant is also available as a commercially available product, and specific examples thereof include "Disperbyk-101 (polyamidamine phosphate), 107 (carboxylic acid ester), 110 (copolymer including an acid group), 111 (phosphoric acid-based dispersant), 130 (polyamide), 161, 162, 163, 164, 165, 166, and 170 (polymeric copolymers), and BYK-P104 and P105 (unsaturated high-molecular-weight polycarboxylic acid)" manufactured by BYK-Chemie, "EFKA 4047, and 4050 to 4165 (polyurethane-based), EFKA 4330 to 4340 (block copolymer), 4400 to 4402 (modified polyacrylate), 5010 (polyesteramide), 5765 (high-molecular-weight polycarboxylate), 6220 (fatty acid polyester), 6745 (phthalocyanine derivative), and 6750 (azo pigment derivative)" manufactured by EFKA, "AJISPER PB821, PB822, PB880, and PB881" manufactured by Ajinomoto Fine-Techno Co., Inc., "FLOWLEN TG-710 (urethane oligomer)" and "POLYFLOW No. 50E, No. 300 (acrylic copolymer)" manufactured by KYOEISHA CHEMICAL Co., LTD., "DISPARLON KS-860, 873SN, 874, and #2150 (aliphatic polyvalent carboxylic acid), #7004 (polyether ester), DA-703-50, DA-705, DA-725, and DA-7301" manufactured by Kusumoto Chemicals, Ltd., "DEMOL RN and N (naphthalene sulfonate formaldehyde condensate), MS, C, and SN-B (aromatic sulfonate formaldehyde condensate)", "HOMOGENOL L-18 (polymeric polycarboxylic acid)", "EMULGEN 920, 930, 935, and 985 (polyoxyethylene nonyl phenyl ether)", and "ACETAMINE 86 (stearylamine acetate)" manufactured by Kao Corporation, "SOLSPERSE 5000 (phthalocyanine derivative), 22000 (azo pigment derivative), 13240 (polyesteramine), 3000, 12000, 17000, 20000, and 27000 (polymers having a functional portion in the terminal portion), and 24000, 28000, 32000, and 38500 (graft polymers)" manufactured by The Lubrizol Corporation, "NIKKOL T106 (polyoxyethylene sorbitan monooleate) and MYS-IEX (polyoxyethylene monostearate)" manufactured by NIKKO CHEMICALS Co., Ltd., "HINOACT T-8000E" manufactured by Kawaken Fine Chemicals Co., Ltd., "Organosiloxane Polymer KP341" manufactured by Shin-Etsu Chemical Co., Ltd., "EFKA-46, EFKA-47, EFKA-47EA, EFKA POLYMER 100, EFKA POLYMER 400, EFKA POLYMER 401, and EFKA POLYMER 450" manufactured by MORISHITA SANGYO Corporation, polymer dispersants such as "DISPERSE AID 6, DISPERSE AID 8, DISPERSE AID 15, and DISPERSE AID 9100" manufactured by SAN NOPCO Ltd., "ADEKA PLURONIC L31, F38, L42, L44, L61, L64, F68, L72, P95, F77, P84, F87, P94, L101, P103, F108, L121, and P-123" manufactured by ADEKA CORPORATION, and "IONET (trade name) S-20" manufactured by Sanyo Chemical Industries, Ltd.

The content of the dispersant is preferably 1 to 200 parts by mass with respect to 100 parts by mass of the pigment. The lower limit thereof is preferably 5 parts by mass or more, and more preferably 10 parts by mass or more. The upper limit thereof is preferably 150 parts by mass or less, and more preferably 100 parts by mass or less.

<<<Alkali-Soluble Resin>>>

The coloring composition of the embodiment of the present invention can contain an alkali-soluble resin as the resin C. By incorporation of the alkali-soluble resin, the developability or the pattern formability is improved. Incidentally, the above-mentioned resin C1 can also be used as the alkali-soluble resin.

The alkali-soluble resin can be appropriately selected from resins having a group enhancing alkali solubility. Examples of the group enhancing alkali solubility (hereinafter also referred to as an acid group) include a carboxyl group, a phosphoric acid group, a sulfo group, and a phenolic hydroxyl group, and the group is preferably the carboxyl group. The alkali-soluble resin may have one kind or two or more kinds of the acid groups.

The weight-average molecular weight (Mw) of the alkali-soluble resin is preferably 5,000 to 100,000. Further, the number-average molecular weight (Mn) of the alkali-soluble resin is preferably 1,000 to 20,000.

As the alkali-soluble resin, from the viewpoint of heat resistance, a polyhydroxystyrene-based resin, a polysiloxane-based resin, an acrylic resin, an acrylamide-based resin, and an acryl/acrylamide copolymer resin are preferable. Further, from the viewpoint of controlling developability, an acrylic resin, an acrylamide-based resin, and an acryl/acrylamide copolymer resin are preferable.

As the alkali-soluble resin, a polymer having a carboxyl group in a side chain is preferable. Examples thereof include copolymers having a repeating unit derived from monomers such as methacrylic acid, acrylic acid, itaconic acid, crotonic acid, maleic acid, 2-carboxyethyl (meth)acrylic acid, vinylbenzoic acid, and a partially esterified maleic acid, an alkali-soluble phenol resin such as a novolac resin, an acidic cellulose derivative having a carboxyl group in a side chain, and a polymer obtained by adding an acid anhydride to a polymer having a hydroxyl group. In particular, a copolymer of a (meth)acrylic acid and another monomer copolymerizable with the (meth)acrylic acid is suitable as the alkali-soluble resin. Examples of another monomer copolymerizable with a (meth)acrylic acid include alkyl (meth)acrylate, aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, cyclohexyl (meth)acrylate, glycidyl methacrylate, and tetrahydrofurfuryl methacrylate. Examples of the vinyl compound include styrene, α-methylstyrene, vinyltoluene, acrylonitrile, vinyl acetate, N-vinylpyrrolidone, a polystyrene macromonomer, and a polymethyl methacrylate macromonomer. Further, examples of other monomer include the N-position-substituted maleimide monomers described in JP1998-300922A (JP-H10-300922A), such as N-phenylmaleimide and N-cyclohexylmaleimide. Such other monomers copolymerizable with (meth)acrylic acids may be of one kind or of two or more kinds thereof.

As the alkali-soluble resin, a benzyl (meth)acrylate/(meth)acrylic acid copolymer, benzyl (meth)acrylate/(meth)acrylic acid/2-hydroxyethyl (meth)acrylate copolymer, or a multicomponent copolymer including benzyl (meth)acrylate/(meth)acrylic acid/other monomers can be preferably used. Further, a copolymer obtained by copolymerizing 2-hydroxyethyl (meth)acrylate and other monomers, the 2-hydroxypropyl (meth)acrylate/polystyrene macromonomer/benzyl methacrylate/methacrylic acid copolymer described in JP1995-140654A (JP-H07-140654A), a 2-hydroxy-3-phenoxypropylacrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, a 2-hydroxyethyl methacrylate/polystyrene macromonomer/benzyl methacrylate/methacrylic acid copolymer, and the like can also be preferably used. In addition, as a commercially available product thereof, for example, FF-426 (manufactured by Fujikura Kasei Co., Ltd.) or the like can also be used.

As the alkali-soluble resin, an alkali-soluble resin having a polymerizable group can also be used. Examples of the polymerizable group include a (meth)allyl group and a (meth)acryloyl group. As the alkali-soluble resin having a polymerizable group, an alkali-soluble resin having a polymerizable group on a side chain thereof, and the like are useful. Examples of commercially available products of the alkali-soluble resin having a polymerizable group include DIANAL NR Series (manufactured by Mitsubishi Rayon Co., Ltd.), PHOTOMER 6173 (carboxyl group-containing polyurethane acrylic oligomer, manufactured by Diamond Shamrock Co., Ltd.), VISCOAT R-264 and KS RESIST 106 (both manufactured by Osaka Organic Chemical Industry, Ltd.), CYCLOMER P Series (for example, ACA230AA) and PLACCEL CF200 Series (both manufactured by Daicel Corporation), Ebecryl 3800 (manufactured by Daicel-UCB Co., Ltd.), ACRYCURE RD-F8 (manufactured by Nippon Shokubai Co., Ltd.), and DP-1305 (manufactured by Fujifilm Fine Chemicals Co., Ltd.).

It is also preferable that the alkali-soluble resin includes a polymer formed by polymerizing monomer components including at least one compound selected from a compound represented by Formula (ED1) and the compound represented by Formula (1) of JP2010-168539A (these compounds are hereinafter also referred to as an "ether dimer" in some cases).

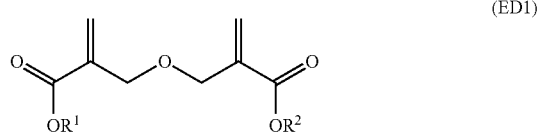

(ED1)

In Formula (ED1), $R^1$ and $R^2$ each independently represent a hydrogen atom or a hydrocarbon group having 1 to 25 carbon atoms, which may have a substituent.

With regard to specific examples of the ether dimer, reference can be made to paragraph No. 0317 of JP2013-029760A, the contents of which are incorporated herein by reference. These ether dimers may be of one kind or of two or more kinds.

Examples of the polymer formed by polymerization of monomer components including ether dimers include polymers having the following structures.

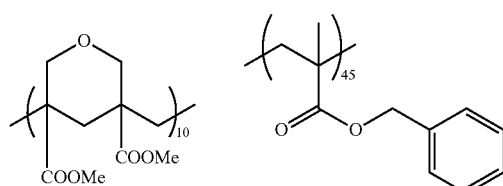

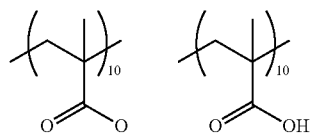

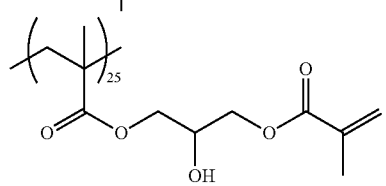

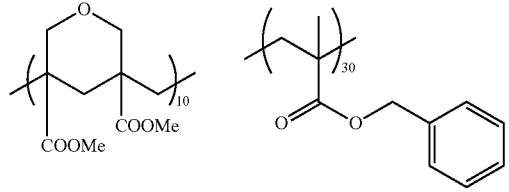

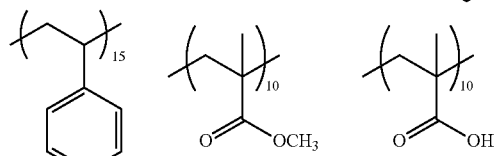

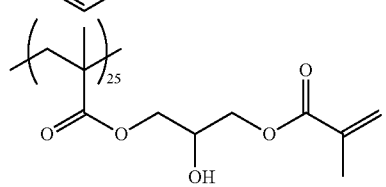

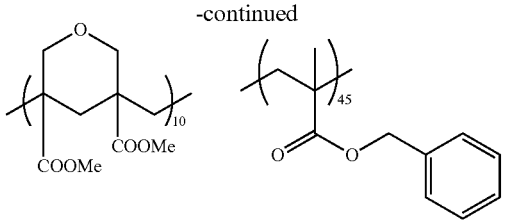

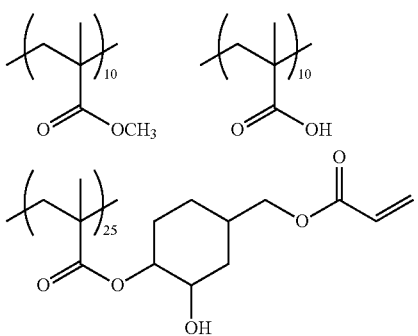

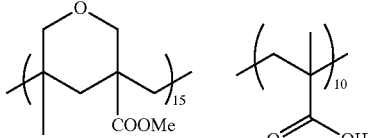

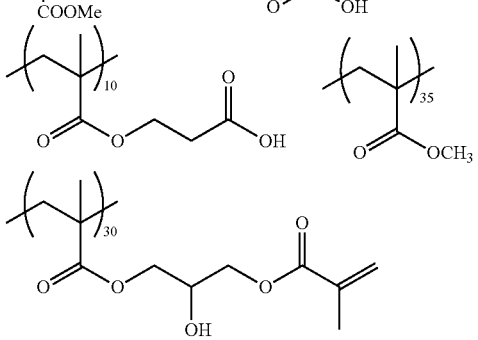

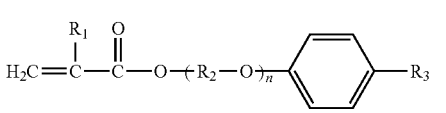

(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms, which may include a benzene ring. n represents an integer of 1 to 15.

In Formula (X), the number of carbon atoms in the alkylene group of $R_2$ is preferably 2 or 3. Further, the number of carbon atoms in the alkyl group of $R_3$ is preferably 1 to 10, and the alkyl group of $R_3$ may include a benzene ring. Examples of the alkyl group including a benzene ring, represented by $R_3$, include a benzyl group and a 2-phenyl(iso)propyl group.

With regard to the alkali-soluble resin, reference can be made to the description in paragraph Nos. 0558 to 0571 of JP2012-208494A (paragraph Nos. 0685 to 0700 of the corresponding US2012/0235099A), the contents of which are incorporated herein by reference. In addition, the copolymers (B) described in paragraph Nos. 0029 to 0063 of JP2012-032767A and the alkali-soluble resins used in Examples of the document, the binder resins described in paragraph Nos. 0088 to 0098 of JP2012-208474A and the binder resins used in Examples of the document, the binder resins described in paragraph Nos. 0022 to 0032 of JP2012-137531A and the binder resins used in Examples of the document, the binder resins described in paragraph Nos. 0132 to 0143 of JP2013-024934A and Examples of the document, the binder resins described in paragraph Nos. 0092 to 0098 of JP2011-242752A and the binder resins used in Examples of the document, or the binder resins described in paragraph Nos. 0030 to 0072 of JP2012-032770A can be used, and the contents of these publications are incorporated herein by reference.

The acid value of the alkali-soluble resin is preferably 30 to 500 mgKOH/g. The lower limit is more preferably 50 mgKOH/g or more, and still more preferably 70 mgKOH/g or more. The upper limit is more preferably 400 mgKOH/g or less, still more preferably 200 mgKOH/g or less, even still more preferably 150 mgKOH/g or less, and further still more preferably 120 mgKOH/g or less.

The content of the alkali-soluble resin is preferably 1% to 80% by mass with respect to the total solid content of the coloring composition. The lower limit is more preferably 2% by mass or more, and still more preferably 3% by mass or more. The upper limit is more preferably 70% by mass or less, and still more preferably 60% by mass or less. The coloring composition of the embodiment of the present invention may include one kind or two or more kinds of the alkali-soluble resins. In a case where two or more kinds of the alkali-soluble resins are included, the total amount thereof is preferably within the range.

<<Curable Compound D>>

The coloring composition of the embodiment of the present invention contains a curable compound D. As the curable compound D, known compounds which can be crosslinked by a radical, an acid, or heat can be used.

In the present invention, examples of the curable compound D include a polymerizable compound and a compound having an epoxy group. Examples of the polymerizable compound include a compound having an ethylenically unsaturated bonding group such as a vinyl group, a (meth) allyl group, and a (meth)acryloyl group. The polymerizable compound is more preferably a radically polymerizable compound. Further, it is also preferable that the curable compound D includes a compound having an epoxy group.

In the coloring composition of the embodiment of the present invention, the content of the curable compound D is preferably 0.1% to 50% by mass with respect to the total solid content of the coloring composition. The lower limit is, for example, more preferably 0.5% by mass or more, and still more preferably 1% by mass or more. The upper limit is, for example, more preferably 45% by mass or less, and still more preferably 40% by mass or less. The curable compounds may be used singly or in combination of two or more kinds thereof. In a case where the curable compounds are used in combination of two or more kinds thereof, the total amount thereof is preferably within the range.

(Polymerizable Compound)

The polymerizable compound may be any one of chemical forms such as a monomer, a prepolymer, and an oligomer, but is preferably a monomer. The molecular weight of the polymerizable compound is preferably 100 to 3,000. The upper limit is more preferably 2,000 or less, and still more preferably 1,500 or less. The lower limit is more preferably 150 or more, and still more preferably 250 or more.

The polymerizable compound is preferably a trifunctional to pentadecafunctional (meth)acrylate compound, and more preferably a trifunctional to hexafunctional (meth)acrylate compound. With regard to these specific compounds, reference can be made to the compounds described in paragraph Nos. 0095 to 0108 of JP2009-288705A, paragraph No. 0227 of JP2013-029760A, and paragraph Nos. 0254 to 0257 of JP2008-292970A, the contents of which are incorporated herein by reference.

As the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd., A-DPH-12E manufactured by Shin-Nakamura Chemical Co., Ltd.), and a structure in which these (meth)acryloyl groups are bonded via an ethylene glycol and/or propylene glycol residue (for example, SR454 and SR499, commercially available from Sartomer Company, Inc.) are preferable. Oligomer types of these can also be used.

Furthermore, as the polymerizable compound, a trifunctional (meth)acrylate compound such as trimethylolpropane tri(meth)acrylate, trimethylolpropane propyleneoxy-modified tri(meth)acrylate, trimethylolpropane ethyleneoxy-modified tri(meth)acrylate, isocyanuric acid ethyleneoxy-modified tri(meth)acrylate, and pentaerythritol tri(meth) acrylate can also be preferably used. Examples of commercially available products of the trifunctional (meth) acrylate compound include ARONIX M-309, M-310, M-321, M-350, M-360, M-313, M-315, M-306, M-305, M-303, M-452, and M-450 (manufactured by Toagosei Chemical Industry Co., Ltd.), NK Ester A9300, A-GLY-9E, A-GLY-20E, A-TMM-3, A-TMM-3L, A-TMM-3LM-N, A-TMPT, TMPT, and A-TMMT (manufactured by Shin-Nakamura Chemical Co., Ltd.), and KAYARAD GPO-303, TMPTA, THE-330, TPA-330, and PET-30 (manufactured by Nippon Kayaku Co., Ltd.).

As the polymerizable compound, a polymerizable compound having an acid group can be used. By using the polymerizable compound having an acid group, the polymerizable compound in the unexposed areas are easily removed during the development, and generation of development residues can be suppressed. Examples of the acid group include a carboxyl group, a sulfo group, and a phosphoric acid group, and the carboxyl group is preferable. Examples of a commercially available product of the polymerizable compound having an acid group include ARONIX M-510 and M-520 (manufactured by Toagosei Chemical Industry Co., Ltd.).

The acid value of the polymerizable compound having an acid group is preferably 0.1 to 40 mgKOH/g, and more preferably 5 to 30 mgKOH/g. In a case where the acid value of the polymerizable compound is 0.1 mgKOH/g or more, the solubility in a developer is good, whereas in a case where the acid value is 40 mgKOH/g or less, it is advantageous in production or handling. In addition, the curability is excellent.

As the polymerizable compound, a polymerizable compound having a caprolactone structure can also be used. Further, as the polymerizable compound, a polymerizable compound having an alkyleneoxy group can be used. The polymerizable compound having an alkyleneoxy group is preferably a polymerizable compound having an ethyleneoxy group and/or a propyleneoxy group, more preferably a polymerizable compound having an ethyleneoxy group, and still more preferably a trifunctional to hexafunctional (meth) acrylate compound having 4 to 20 ethyleneoxy groups. Examples of the commercially available product of the polymerizable compound having an alkyleneoxy group include SR-494 which is a tetrafunctional (meth)acrylate having four ethyleneoxy groups, manufactured by Sartomer Co., Inc., and KAYARAD TPA-330 which is a trifunctional (meth)acrylate having three isobutyleneoxy groups.

As the polymerizable compound, the urethane acrylates as described in JP1973-041708B (JP-S48-041708B), JP1976-037193A (JP-S51-037193A), JP1990-032293B (JP-H02-032293B), and JP1990-016765B (JP-H02-016765B), and the urethane compounds having an ethylene oxide-based skeleton described in JP1983-049860B (JP-S58-049860B), JP1981-017654B (JP-S56-017654B), JP1987-039417B (JP-S62-039417B), and JP1987-039418B (JP-S62-039418B) are also suitable. In addition, it is also preferable to use the addition-polymerizable compounds having an amino structure or a sulfide structure in a molecule, which are described in JP1988-277653A (JP-S63-277653A), JP1988-260909A (JP-S63-260909A), and JP1989-105238A (JP-H01-105238A).

Examples of a commercially available product thereof include urethane oligomers UAS-10 and UAB-140 (manufactured by Sanyo-kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600, and AI-600 (manufactured by Kyoeisha Chemical Co., Ltd.).

In the present invention, as the polymerizable compound, a polymerizable compound having a C Log P value of 4.0 or more (hereinafter also referred to as a polymerizable compound D1) can be used. According to this aspect, it is easy to produce a film having more excellent light resistance.

The polymerizable compound D1 is preferably a compound having a cyclic structure. Among those, for a reason that the light resistance of the obtained film can be further improved, the polymerizable compound D1 is more preferably a compound having an aromatic ring, and still more preferably a compound having an aromatic hydrocarbon ring. Further, the aromatic hydrocarbon ring is preferably a fused ring, and more preferably a fluorene ring. The polymerizable compound D1 is particularly preferably a compound having a fluorene ring.

The C Log P value of the polymerizable compound D1 is preferably 4.0 to 15.0. The lower limit value is preferably 4.5 or more, more preferably 5.0 or more, still more preferably 5.5 or more, particularly preferably 6.0 or more, and most preferably 6.5 or more. The upper limit value is preferably 13.0 or less, and more preferably 12.0 or less. In a case where the C Log P value of the polymerizable compound D1 is within the range, it is easy to produce a film having excellent light resistance. Further, in a case where the C Log P value of the polymerizable compound D1 is the above-mentioned upper limit value or less, incorporation of a developer is good, generation of development residues can be inhibited, and thus, an excellent lithographic property is obtained.

The hydroxyl value of the polymerizable compound D1 is preferably 400 mgKOH/g or less, more preferably 300 mgKOH/g or less, and still more preferably 200 mgKOH/g or less. In a case where the hydroxyl value of the polymerizable compound D1 is within the range, it is easy to produce a film having excellent light resistance. Further, the hydroxyl value is a value representing a mass (mg) of potassium hydroxide required to neutralize the acetic acid bonded to a hydroxyl group upon acetylation of one gram of a sample.

The polymerizable compound D1 is preferably a compound including an alkyleneoxy group, and more preferably a compound (hereinafter also referred to as an alkyleneoxy chain) having a group including two or more alkyleneoxy groups as a repeating unit. By incorporation of an alkyleneoxy group into the polymerizable compound D1 (preferably an alkyleneoxy chain), it is to obtain a good lithographic property. A reason for obtaining such an effect is thought to be as follows: the alkyleneoxy chain and the developer are hydrogen-bonded to improve the incorporation of the developer. The number of carbon atoms of the alkyleneoxy group is preferably 2 or more, more preferably 2 to 10, still more preferably 2 to 4, and particularly preferably 2 or 3. The alkyleneoxy group may be linear or branched. The number of the repeating units of the alkyleneoxy groups in the alkyleneoxy chain is preferably 2 to 30. The lower limit thereof is preferably 3 or more, and more preferably 5 or more. The upper limit thereof is more preferably 25 or less, and still more preferably 20 or less.

The content of the polymerizable compound D1 with respect to the total mass of the polymerizable compound is preferably 10% by mass or more, more preferably 30% by mass or more, still more preferably 50% by mass or more, particularly preferably 70% by mass or more, and most preferably 75% by mass or more. The upper limit thereof can be set to, for example, 100% by mass. An aspect in which the polymerizable compound is only constituted with the polymerizable compound D1 is also available.

Specific examples of the polymerizable compound D1 include the following compounds. The numerical values of the C log P appended to the following structural formulae are the C Log P values of the compounds. Further, as the polymerizable compound D1, a commercially available product thereof can be used. Examples of the commercially available product include KAYARAD DPCA-20 (manufactured by Nippon Kayaku Co., Ltd., C Log P value=5.4), NK Oligo EA-1020 (manufactured by Shin-Nakamura Chemical Co., Ltd., C Log P value=4.2), and NK Ester A-BPEF (manufactured by Shin-Nakamura Chemical Co., Ltd., polymerizable compound having a fluorene ring, C Log P value=8.0).

D-1

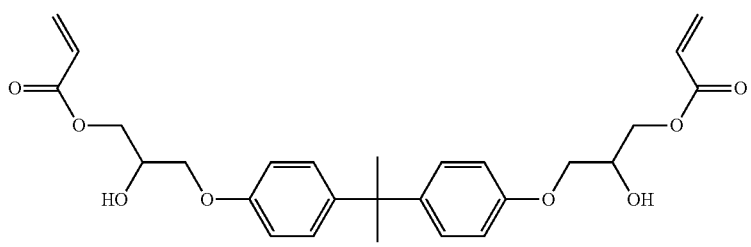

CLogP: 4.2

-continued
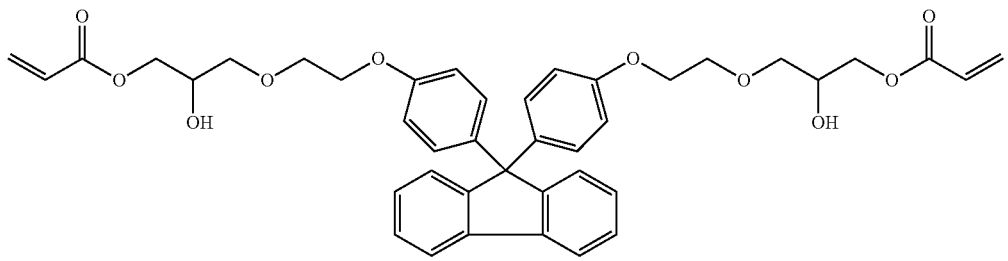
D-2
CLogP: 6.5
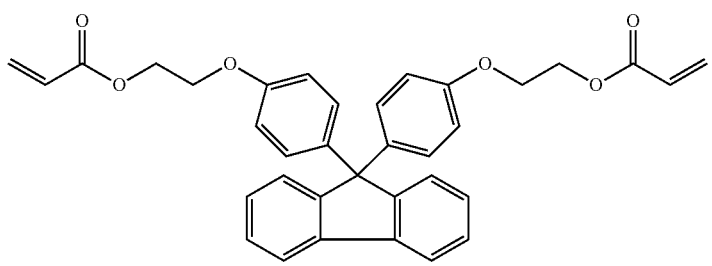
D-3
CLogP: 8.0
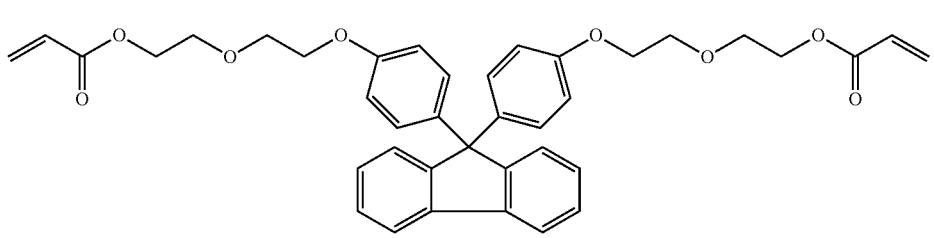
D-4
CLogP: 8.1
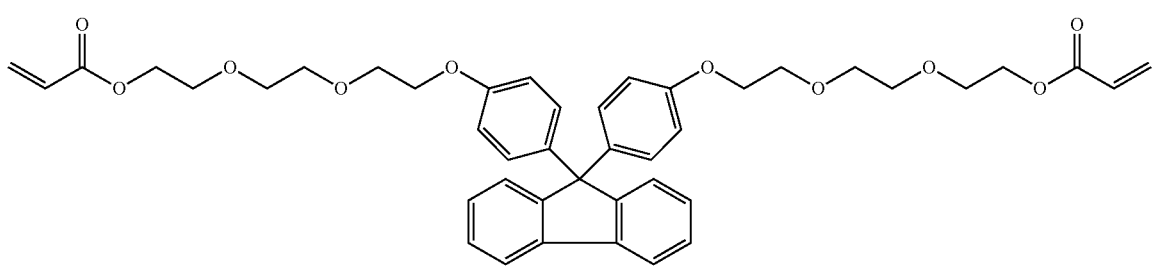
D-5
CLogP: 7.9
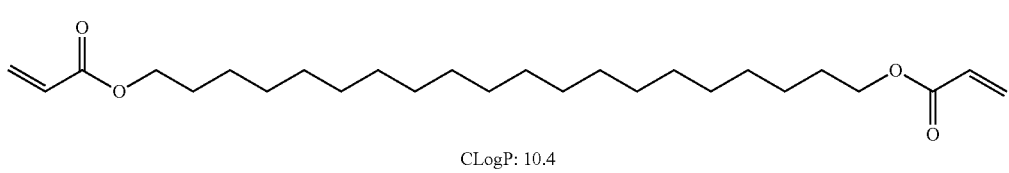
D-6
CLogP: 10.4

-continued
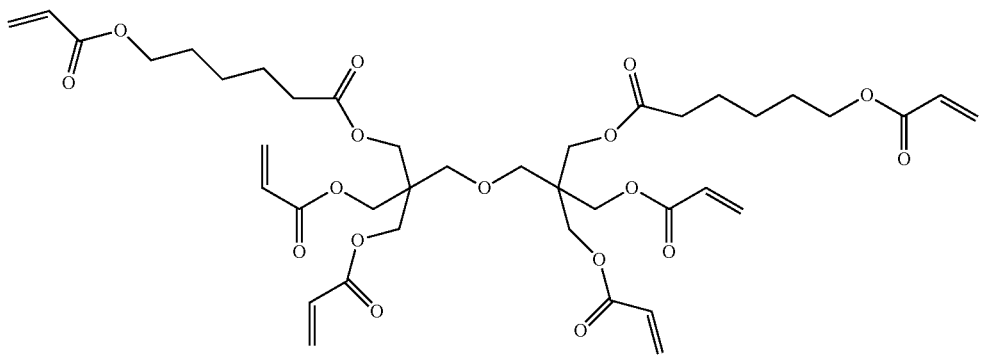
D-7
ClogP: 8.4
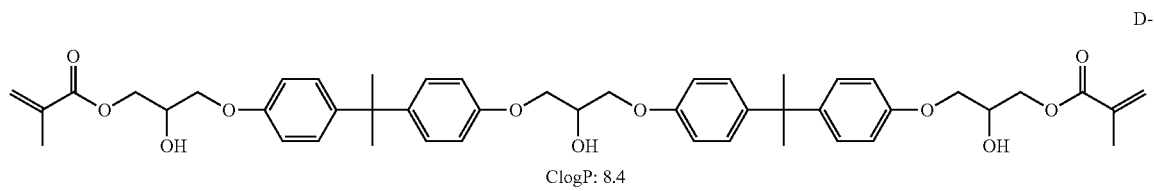
D-8
ClogP: 8.4
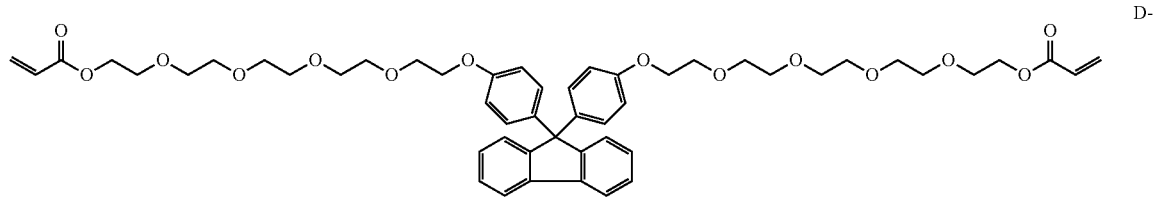
D-9
ClogP: 7.3
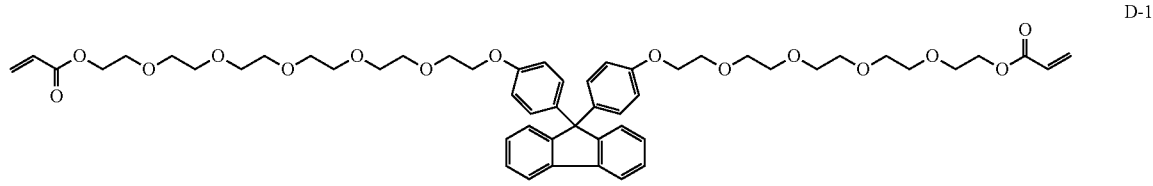
D-10
ClogP: 7.2
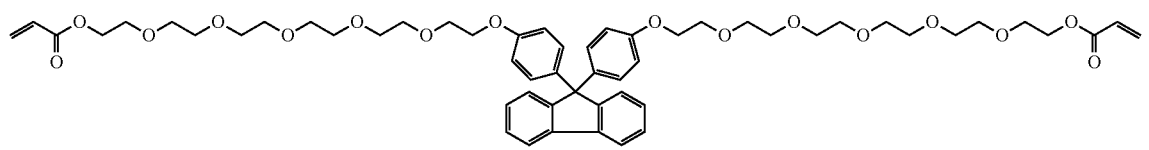
D-11
ClogP: 7.1

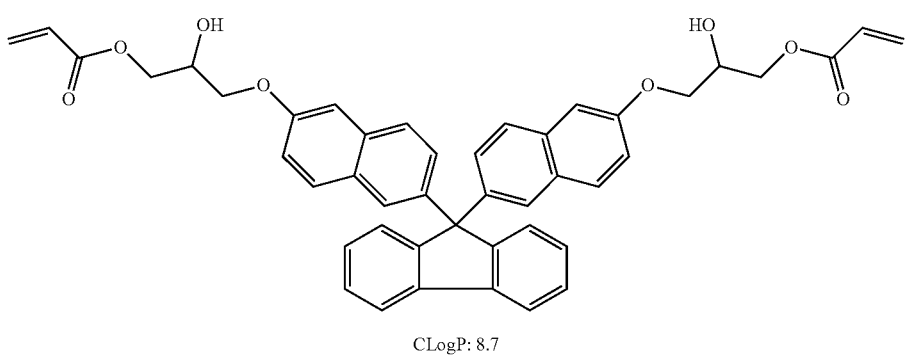

D-12

CLogP: 8.7

The content of the polymerizable compound is preferably 0.1% to 50% by mass with respect to the total solid content of the coloring composition. The lower limit is more preferably 0.5% by mass or more, and still more preferably 1% by mass or more. The upper limit is more preferably 45% by mass or less, and still more preferably 40% by mass or less. The polymerizable compound may be used singly or in combination of two or more kinds thereof. In a case where the polymerizable compound is used in combination of two or more kinds thereof, the total amount thereof is preferably within the range.

(Compound Having Epoxy Group)

The coloring composition of the embodiment of the present invention may contain a compound having an epoxy group. In a case where the coloring composition of the embodiment of the present invention contains the compound having an epoxy group, the mechanical strength or the like of a film can be improved. The compound having an epoxy group is preferably a compound having two or more epoxy groups per molecule. The number of epoxy groups per molecule is preferably 2 to 100. The upper limit can be set to, for example, 10 or less, or to 5 or less.

The compound having an epoxy group in the present invention preferably has a structure having an aromatic ring and/or an aliphatic ring, and more preferably has a structure having an aliphatic ring. The epoxy group is preferably bonded to an aromatic ring and/or an aliphatic ring via a single bond or a linking group. Examples of the linking group include an alkylene group, an arylene group, —NR'— (R' represents a hydrogen atom, an alkyl group which may have a substituent, or an aryl group which may have a substituent, and is preferably the hydrogen atom), —SO$_2$—, —CO—, —COO—, —OCO—, —O—, —S—, and a group formed by the combination thereof.

In a case of the compound having an aliphatic ring, a compound in which an epoxy group is bonded to an aliphatic ring via a direct bond (a single bond) is preferable. In a case of the compound having an aromatic ring, a compound in which an epoxy group is bonded to an aromatic ring via a linking group is preferable. The linking group is preferably an alkylene group, or a group formed by combination of an alkylene group with —O—.

In addition, as the compound having an epoxy group, a compound having a structure in which 2 or more aromatic rings are linked to a hydrocarbon group can also be used. The hydrocarbon group is preferably an alkylene group having 1 to 6 carbon atoms. The epoxy group is preferably linked via the linking group.

The epoxy equivalent (=the molecular weight of the compound having an epoxy group/the number of epoxy groups) of the compound having an epoxy group is preferably 500 g/eq or less, more preferably 100 to 400 g/eq, and still more preferably 100 to 300 g/eq.

The compound having an epoxy group may be either a low-molecular-weight compound (for example, a molecular weight of less than 1,000) or a high-molecular-weight compound (macromolecule) (for example, a molecular weight of 1,000 or more, and in a case of a polymer, a weight-average molecular weight of 1,000 or more). The molecular weight of the compound having an epoxy group (a weight-average molecular weight thereof in a case where the compound is a polymer) is preferably 200 to 100,000, and more preferably 500 to 50,000. The upper limit of the molecular weight (in a case of a polymer, the weight-average molecular weight) is preferably 3,000 or less, more preferably 2,000 or less, and still more preferably 1,500 or less.

As the compound having an epoxy group, the compounds described in paragraph Nos. 0034 to 0036 of JP2013-011869A, paragraph Nos. 0147 to 0156 of JP2014-043556A, or paragraph Nos. 0085 to 0092 of JP2014-089408A, the contents of the publications are incorporated herein by reference, can also be used. Examples of the commercially available products thereof include jER825, jER827, jER828, jER834, jER1001, jER1002, jER1003, jER1055, jER1007, jER1009, and jER1010 (all manufactured by Japan Epoxy Resins Co., Ltd.), EPICLON860, EPICLON1050, EPICLON1051, and EPICLON1055 (all manufactured by DIC Corporation) as a bisphenol A type epoxy resin; jER806, jER807, jER4004, jER4005, jER4007, and jER4010 (all manufactured by Japan Epoxy Resins Co., Ltd.), EPICLON830 and EPICLON835 (both manufactured by DIC Corporation), LCE-21 and RE-602S (both manufactured by Nippon Kayaku Co., Ltd.) as a bisphenol F type epoxy resin; jER152, jER154, jER157S70, and jER157S65 (all manufactured by Japan Epoxy Resins Co., Ltd.), EPICLON N-740, EPICLON N-770, and EPICLON N-775 (all manufactured by DIC Corporation) as a phenol novolac type epoxy resin; EPICLON N-660, EPICLON N-665, EPICLON N-670, EPICLON N-673, EPICLON N-680, EPICLON N-690, and EPICLON N-695 (all manufactured by DIC Corporation), EOCN-1020 (all manufactured by Nippon Kayaku Co., Ltd.) as a cresol novolac type epoxy resin; and ADEKA RESIN EP-4080S, ADEKA RESIN EP-4085S, and ADEKA RESIN EP-4088S (all manufactured by ADEKA Corporation), CELLOXIDE 2021P, CELLOXIDE 2081, CELLOXIDE 2083, CELLOXIDE 2085, EHPE3150, EPOLEAD PB3600, and EPOLEAD PB4700 (all manufactured by Daicel Chemical Industries, Ltd.), and DENACOL EX-212L, EX-214L, EX-216L, EX-321L, and EX-850L (all manufactured by Nagase ChemteX Corporation) as an aliphatic epoxy resin. Other examples include ADEKA RESIN EP-4000S, ADEKA RESIN EP-4003S, ADEKA RESIN EP-4010S, and ADEKA RESIN EP-4011S (all manufactured by ADEKA Corporation), NC-2000, NC-3000, NC-7300, XD-1000, EPPN-501, and EPPN-502 (all manufactured by ADEKA Corporation), and jER1031S (manufactured by Japan Epoxy Resins Co., Ltd.).

In a case where the coloring composition of the embodiment of the present invention contains a compound having an epoxy group, the content of the compound having an epoxy group is preferably 0.1% to 40% by mass with respect to the total solid content of the coloring composition. The lower limit is, for example, more preferably 0.5% by mass or more, and still more preferably 1% by mass or more. The upper limit is, for example, more preferably 30% by mass or less, and still more preferably 20% by mass or less. The compound having an epoxy group may be used singly or in combination of two or more kinds thereof. In a case where the polymerizable compound is used in combination of two or more kinds thereof, the total amount thereof is preferably within the range.

In addition, the mass ratio of the polymerizable compound to the compound having an epoxy group is preferably the mass of the polymerizable compound D:the mass of the compound having an epoxy group=100:1 to 100:400, more preferably 100:1 to 100:100, still more preferably 100:1 to 100:50.

<<Phthalimide Compound>>

The coloring composition of the embodiment of the present invention may include a phthalimide compound. By incorporation of the phthalimide compound, generation of acicular crystals, or the like can be suppressed.

The phthalimide compound is preferably a compound represented by General Formula (PI).

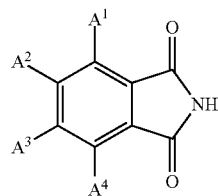
(PI)

In Formula (PI), $A^1$ to $A^4$ each independently represent a hydrogen atom, a halogen atom, or an alkyl group.

Examples of the halogen atom include a chlorine atom, a bromine atom, and a fluorine atom, and the chlorine atom or the fluorine atom is preferable.

The number of carbon atoms in the alkyl group is preferably 1 to 10, and more preferably 1 to 5. The alkyl group may be linear, branched, or cyclic, and is preferably linear or branched, and more preferably linear.

It is preferable that at least one of $A^1$, . . . , or $A^4$ is selected from a chlorine atom and a bromine atom, and more preferably a bromine atom. Further, it is more preferable that all of $A^1$ to $A^4$ are selected from a chlorine atom and a bromine atom, and it is still more preferable that all of $A^1$ to $A^4$ are bromine atoms.

In a case where the coloring composition of the embodiment of the present invention contains a phthalimide compound, the content of the phthalimide compound is preferably 0.01% to 5% by mass, more preferably 0.1% to 4% by mass, and still more preferably 0.5% to 3.5% by mass, with respect to the total solid content in the coloring composition.

Furthermore, the phthalimide compound is contained in the amount of preferably 0.1 to 10 parts by mass, and more preferably 1 to 5 parts by mass, with respect to 100 parts by mass of the halogenated zinc phthalocyanine pigment A.

The phthalimide compounds may be of one kind or two or more kinds. In a case where two or more kinds of the phthalimide compounds are included, the total content thereof is preferably in the range.

<<Solvent>>

The coloring composition of the embodiment of the present invention preferably contains a solvent. The solvent is preferably an organic solvent. The solvent is not particularly limited as long as it satisfies the solubility of the respective components or the coatability of the coloring composition.

Suitable examples of the organic solvent include esters such as ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl alkyloxyacetate esters (for example, methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), alkyl 3-alkyloxypropionate esters (for example, methyl 3-alkyloxypropionate and ethyl 3-alkyloxypropionate (for example, methyl 3-methoxypropionate, ethyl 3-methoxypropionate, methyl 3-ethoxypropionate, and ethyl 3-ethoxypropionate)), alkyl 2-alkyloxypropionate esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methyl propionate and ethyl 2-alkyloxy-2-methyl propionate (for example, methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate; ethers, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, diethylene glycol monoethyl ether acetate (ethyl carbitol acetate), diethylene glycol monobutyl ether acetate (butyl carbitol acetate), propylene glycol monomethyl ether, propylene glycol monomethyl ether acetate, propylene glycol monoethyl ether acetate, and propylene glycol monopropyl ether acetate; ketones, for example, methyl ethyl ketone, cyclohexanone, cyclopentanone, 2-heptanone, and 3-heptanone; and aromatic hydrocarbons, for example, toluene and xylene. However, it is preferable in some cases to reduce aromatic hydrocarbons (benzene, toluene, xylene, ethylbenzene, and the like) (for example, the amount can be set to 50 parts per million (ppm) by mass or less, 10 ppm by mass or less, or 1 ppm by mass or less with respect to the total amount of the organic solvent) as a solvent for a reason such as an environmental aspect.

The organic solvents may be used singly or in combination of two or more kinds thereof. In a case where the organic solvents are used in combination of two or more kinds thereof, the solvent is particularly preferably a mixed solution formed of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, diethylene glycol monoethyl ether acetate (ethyl carbitol acetate), diethylene glycol monobutyl ether acetate (butyl carbitol acetate), propylene glycol methyl ether, and propylene glycol methyl ether acetate.

In the present invention, the organic solvent preferably has a content of peroxides of 0.8 mmol/L or less, and more preferably, it does not substantially include peroxides. Further, it is preferable to use an organic solvent having a small metal content, and for example, the metal content of the organic solvent is preferably 10 parts per billion (ppb) by mass or less. The metal content of the organic solvent is at a level of parts per trillion (ppt) by mass, as desired, and such a high-purity solvent is provided by, for example, Toyo Kasei Kogyo Co., Ltd. (The Chemical Daily, Nov. 13, 2015).

The content of the solvent is preferably an amount such that the total solid content of the coloring composition is 5% to 80% by mass. The lower limit is preferably an amount such that the total solid content of the coloring composition is 10% by mass or more. The upper limit is an amount such that the total solid content of the coloring composition is preferably 60% by mass or less, more preferably 50% by mass or less, and still more preferably 40% by mass or less.

<<Photopolymerization Initiator>>

The coloring composition of the embodiment of the present invention preferably contains a photopolymerization initiator. The photopolymerization initiator is not particularly limited as long as it can initiate the polymerization of a polymerizable compound, and can be appropriately selected from known photopolymerization initiators. For example, the photopolymerization initiator is preferably a compound that is photosensitive to rays from an ultraviolet region to a visible region. Further, it may be a compound that causes a certain action with a photoexcited sensitizer to generate active radicals.

Examples of the photopolymerization initiator include halogenated hydrocarbon derivatives (for example, a compound having a triazine skeleton and a compound having an oxadiazole skeleton), acylphosphine compounds such as acylphosphine oxide, hexaaryl biimidazole, oxime compounds such as an oxime derivative, organic peroxides, thio compounds, ketone compounds, aromatic onium salts, ketoxime ethers, aminoacetophenone compounds, and hydroxyacetophenone compounds. Moreover, from the viewpoint of the exposure sensitivity, as the photopolymerization initiator, a compound selected from the group consisting of a trihalomethyl triazine compound, a benzyl dimethyl ketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, a hydroxyacetophenone compound, an aminoacetophenone compound, a cyclopentadiene-benzene-iron complex and a salt thereof, a halomethyl oxadiazole compound, and a 3-aryl-substituted coumarin compound is preferable. With regard to specific examples of the photopolymerization initiator, reference can be made to the description in paragraph Nos. 0265 to 0268 of JP2013-029760A, the contents of which are incorporated herein by reference.

For the photopolymerization initiator, a hydroxyacetophenone compound, an aminoacetophenone compound, and an acylphosphine compound can also be suitably used. For example, the aminoacetophenone compound described in JP1998-291969A (JP-H10-291969A), and the acylphosphine compound described in JP4225898B can also be used. As the hydroxyacetophenone compound, IRGACURE-184, DAROCUR-1173, IRGACURE-500, IRGACURE-2959, and IRGACURE-127 (trade names, all manufactured by BASF) can be used. As the aminoacetophenone compound, IRGACURE-907, IRGACURE-369, and IRGACURE-379 (trade names: all manufactured by BASF) which are commercially available products can be used. As the aminoacetophenone compound, the compound described in JP2009-191179A, of which an absorption wavelength matches with a light source at a long wavelength of 365 nm, 405 nm, or the like can also be used. In addition, as the acylphosphine compound, IRGACURE-819 or DAROCUR-TPO (trade names, both manufactured by BASF) which is a commercially available product can be used.

More preferred examples of the photopolymerization initiator include an oxime compound. In a case where the coloring composition of the embodiment of the present invention is used for the manufacture of a color filter, it is necessary to form micropatterns in a sharp shape, and thus, it is important to perform development without residues in the unexposed area, together with curability. From such a viewpoint, it is preferable to use an oxime compound as the photopolymerization initiator.

As an example of the oxime compound, the compound described in JP2001-233842A, the compounds described in JP2000-080068A or the compounds described in JP2006-342166A can be used. Specific examples of the oxime compound such as an oxide derivative, which can be suitably used as the photopolymerization initiator in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

As the oxime compound, the compounds described in J. C. S. Perkin II (1979), pp. 1653 to 1660, J. C. S. Perkin II (1979), pp. 156 to 162, Journal of Photopolymer Science and Technology (1995), pp. 202 to 232, each of the publications of JP2000-066385A, JP2000-080068A, JP2004-534797A, and JP2006-342166A, or the like can also be used. As a commercially available product of the oxime compound, IRGACURE-OXE01, IRGACURE-OXE02, IRGACURE-OXE03, and IRGACURE-OXEO4 (all manufactured by BASF) are also suitably used. In addition, TRONLY TR-PBG-304, TRONLY TR-PBG-309, and TRONLY TR-PBG-305 (manufactured by CHANGZHOU TRONLY NEW ELECTRONIC MATERIALS CO., LTD.), or ADEKA ARKLS NCI-930 and ADEKA OPTOMER N-1919 (all manufactured by ADEKA Corporation, a photopolymerization initiator 2 described in JP2012-014052A) can also be used.

Furthermore, as oxime compounds other than the above-described oxime compounds, the compound described in JP2009-519904A in which oxime is linked to an N-position of carbazole ring, the compound described in U.S. Pat. No. 7,626,957B in which a hetero-substituent is introduced into a benzophenone moiety, the compounds described in JP2010-015025A and US2009/292039A in which a nitro group is introduced into a coloring agent moiety, the ketoxime compound described in WO2009/131189A, the compound described in U.S. Pat. No. 7,556,910B, which contains a triazine skeleton and an oxime skeleton in the same molecule, the compound described in JP2009-221114A, which has maximum absorption at 405 nm and has excellent sensitivity to a light source of g-rays, and the like, may be used. Preferably, reference can be made to the descriptions in, for example, paragraph Nos. 0274 to 0306 of JP2013-029760A, the contents of which are incorporated herein by reference.

As the oxime compound, a compound represented by Formula (OX-1) is preferable. In addition, the compound represented by Formula (OX-1) may be an oxime compound in which an N—O bond of oxime forms an (E) isomer, an oxime compound in which the N—O bond forms a (Z) isomer, or a mixture in which the N—O bond forms a mixture of the (E) isomer and the (Z) isomer.

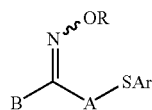
(OX-1)

In General Formula (OX-1), R and B each independently represent a monovalent substituent, A represents a divalent organic group, and Ar represents an aryl group.

In General Formula (OX-1), as the monovalent substituent represented by R, a monovalent non-metal atomic group is preferable. Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. Further, these groups may have one or more substituents. In addition, the above-mentioned substituents may further be substituted with other substituents. Examples of the substituents include a halogen atom, an aryloxy group, an alkoxycarbonyl group, an aryloxycarbonyl group, an acyloxy group, an acyl group, an alkyl group, and an aryl group.

In General Formula (OX-1), as the monovalent substituent represented by B, an aryl group, a heterocyclic group, an arylcarbonyl group, or a heterocyclic carbonyl group is preferable. These groups may have one or more substituents. Examples of the substituent include the above-mentioned substituents.

In General Formula (OX-1), as the divalent organic group represented by A, an alkylene group having 1 to 12 carbon atoms, or an alkynylene group is preferable. These groups may have one or more substituents. Examples of the substituent include the above-mentioned substituents.

In the present invention, an oxime compound having a fluorene ring can be used as the photopolymerization initiator. Specific examples of the oxime compound having a fluorene ring include the compounds described in JP2014-137466A, the contents of which are incorporated herein by reference.

In the present invention, an oxime compound having a benzofuran skeleton can also be used as the photopolymerization initiator. Specific examples thereof include compounds OE-01 to OE-75 described in WO2015/036910A.

In the present invention, an oxime compound having a fluorine atom can be used as the photopolymerization initiator. The oxime compound having a fluorine atom is preferably a compound represented by Formula (1).

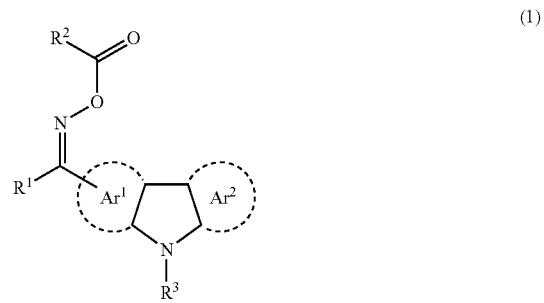
(1)

In Formula (1), $Ar^1$ and $Ar^2$ each independently represent an aromatic hydrocarbon ring which may have a substituent, and $R^1$ to $R^3$ each independently represent an alkyl group or an aryl group; provided that at least one of $R^1$ to $R^3$, $Ar^1$, or $Ar^2$ has a fluorine atom or a group having a fluorine atom.

The aromatic hydrocarbon ring represented by $Ar^1$ and $Ar^2$ may be a monocycle or a fused ring. The number of carbon atoms constituting the ring of the aromatic hydrocarbon ring is preferably 6 to 20, more preferably 6 to 15, and particularly preferably 6 to 10. The aromatic hydrocarbon ring is preferably a benzene ring or a naphthalene ring. It is preferable that at least one of $Ar^1$ or $Ar^2$ is a benzene ring, and the other is a naphthalene ring. Further, it is more preferable that $Ar^1$ is a benzene ring. $Ar^2$ is preferably a benzene ring or a naphthalene ring, and more preferably a naphthalene ring.

Examples of the substituent which may be contained in the aromatic hydrocarbon represented by $Ar^1$ and $Ar^2$ include an alkyl group, an aryl group, a heterocyclic group, a nitro group, a cyano group, a halogen atom, $—OR^{X1}$, $—SR^{X1}$, $—COR^{X1}$, $—COOR^{X1}$, $—OCOR^{X1}$, $—NR^{X1}R^{X2}$, $—NHCOR^{X1}$, $—CONR^{X1}R^{X2}$, $—NHCONR^{X1}R^{X2}$, $—NHCOOR^{X1}$, $—SO_2R^{X1}$, $—SO_2OR^{X1}$, and $—NHSO_2R^{X1}$. $R^{X1}$ and $R^{X2}$ each independently represent a hydrogen atom, an alkyl group, an aryl group, or a heterocyclic group.

Examples of the halogen atom include a fluorine atom, a chlorine atom, a bromine atom, and an iodine atom, and the fluorine atom is preferable.

The number of carbon atoms of the alkyl group as the substituent and the alkyl group represented by $R^{X1}$ and $R^{X2}$ is preferably 1 to 30. The alkyl group may be in any one of a linear, branched, or cyclic form, but is preferably linear or branched. In the alkyl group, some or all of the hydrogen atoms may be substituted with halogen atoms (preferably a fluorine atom). Further, in the alkyl group, some or all of the hydrogen atoms may be substituted with the substituents.

The number of carbon atoms in the aryl group as the substituent or the aryl group represented by $R^{X1}$ and $R^{X2}$ is preferably 6 to 20, more preferably 6 to 15, and still more preferably 6 to 10. The aryl group may be a monocycle or a fused ring. Further, in the aryl group, some or all of the hydrogen atoms may be substituted with the substituents.

The heterocyclic group as the substituent or the heterocyclic group represented by each of $R^{X1}$ and $R^{X2}$ is preferably a 5- or 6-membered ring. The heterocyclic group may be a monocycle or a fused ring. The number of carbon atoms constituting the heterocyclic group is preferably 3 to 30, more preferably 3 to 18, and still more preferably 3 to 12. The number of heteroatoms constituting the heterocyclic group is preferably 1 to 3. The heteroatom constituting the heterocyclic group is preferably a nitrogen atom, an oxygen atom, or a sulfur atom. Further, in the heterocyclic group, some or all of the hydrogen atoms may be substituted with the substituents.

In Formula (1), the aromatic hydrocarbon ring represented by $Ar^2$ preferably has a substituent. As the substituent, $-COR^{X1}$ is preferable. $R^{X1}$ is preferably an alkyl group, an aryl group, or a heterocyclic group, and more preferably an aryl group. The aryl group may have a substituent or may be unsubstituted. Examples of the substituent include an alkyl group having 1 to 10 carbon atoms.

In Formula (1), $R^1$ to $R^3$ each independently represent an alkyl group or an aryl group. $R^1$ is preferably an alkyl group or an aryl group, and more preferably an aryl group. $R^2$ and $R^3$ are each independently preferably an alkyl group.

The number of carbon atoms of the alkyl group is preferably 1 to 30. The alkyl group may be linear, branched, or cyclic. The alkyl group may be unsubstituted or may have a substituent.

The number of carbon atoms of the aryl group is preferably 6 to 20, more preferably 6 to 15, and still more preferably 6 to 10. The aryl group may be a monocycle or a fused ring.

Further, the aryl group may be unsubstituted or may have a substituent.

In Formula (1), it is preferable that at least one of $R^1$ to $R^3$, $Ar^1$, or $Ar^2$ has a fluorine atom or a group having a fluorine atom.

The group including a fluorine atom is preferably an alkyl group having a fluorine atom (hereinafter also referred to as a fluorine-containing alkyl group) or a group containing an alkyl group having a fluorine atom (hereinafter also referred to as a fluorine-containing group). As the fluorine-containing group, at least one group selected from $-OR^{X11}$, $-SR^{X11}$, $-COR^{X11}$, $-COOR^{X11}$, $-OCOR^{X11}$, $-NR^{X11}R^{X12}$, $-NHCOR^{X11}$, $-CONR^{X11}R^{X12}$, $-NHCONR^{X11}R^{X12}$, $-NHCOOR^{X11}$, $-SO_2R^{X11}$, $-SO_2OR^{X11}$, or $-NHSO_2R^{X11}$ is preferable. $R^{X11}$ represents a fluorine-containing alkyl group, and $R^{X12}$ represents a hydrogen atom, an alkyl group, a fluorine-containing alkyl group, an aryl group, or a heterocyclic group. The fluorine-containing group is more preferably $-OR^{X11}$.

The group including a fluorine atom is preferably a fluorine-containing alkyl group or $-OR^{X11}$.

The group including a fluorine atom preferably has a terminal structure represented by Formula (F1) or (F2). * in the formula represents a bond.

$$*-CHF_2 \quad (F1)$$

$$*-CF_3 \quad (F2)$$

The number of carbon atoms of the fluorine-containing alkyl group is preferably 1 to 20, more preferably 1 to 15, still more preferably 1 to 10, and particularly preferably 1 to 4. The fluorine-containing alkyl group may be in any one of a linear, branched, or cyclic form, and is preferably linear or branched.

The fluorine-containing alkyl group has a substitution rate of fluorine atoms of preferably 40% to 100%, more preferably 50% to 100%, and still more preferably 60% to 100%. Further, the substitution rate of fluorine atoms in the fluorine-containing alkyl group is a value in percentage showing a ratio of the numbers of the hydrogen atoms of the alkyl group, which are substituted with fluorine atoms.

In Formula (1), $R^1$ is preferably an aryl group having a group including a fluorine atom. Examples of the group including a fluorine atom include the above-mentioned alkyl group having a fluorine atom (fluorine-containing alkyl group), and a group including an alkyl group having a fluorine atom (fluorine-containing group). A preferred range is also the same.

The content of the oxime compound including a fluorine atom (preferably, the compound represented by Formula (1)) in the total amount of the photopolymerization initiator is preferably 20% to 70% by mass.

Specific examples of the oxime compound having a fluorine atom include the compounds described in JP2010-262028A, the compounds 24, and 36 to 40 described in JP2014-500852A, and the compounds (C-3) described in JP2013-164471A, the contents of which are incorporated herein by reference.

In the present invention, an oxime compound having a nitro group can be used as the photopolymerization initiator. It is also preferable that the oxime compound having a nitro group is a dimer. Specific examples of the oxime compound having a nitro group include the compounds described in paragraph Nos. 0031 to 0047 of JP2013-114249A, the compounds described in paragraph Nos. 0008 to 0012 and 0070 to 0079 of JP2014-137466A, and the compounds described in paragraph Nos. 0007 to 0025 of JP4223071B, and ADEKA ARKLS NCI-831 (manufactured by ADEKA Corporation).

Specific examples of the oxime compound that is preferably used in the present invention are shown below, but the present invention is not limited thereto.

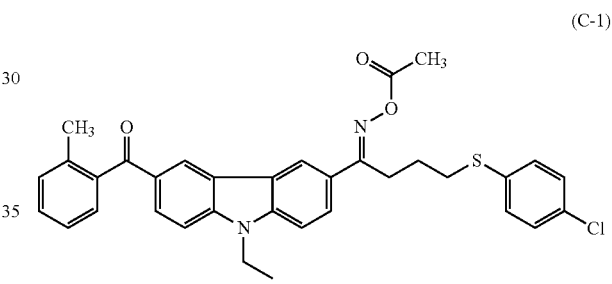

(C-1)

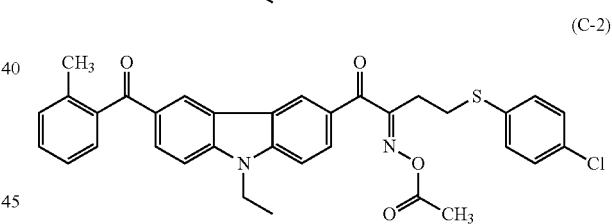

(C-2)

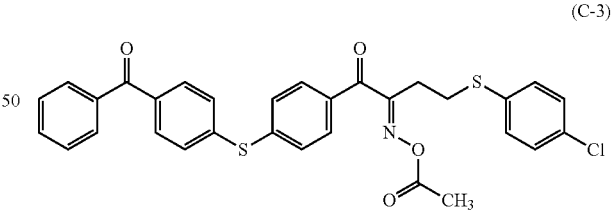

(C-3)

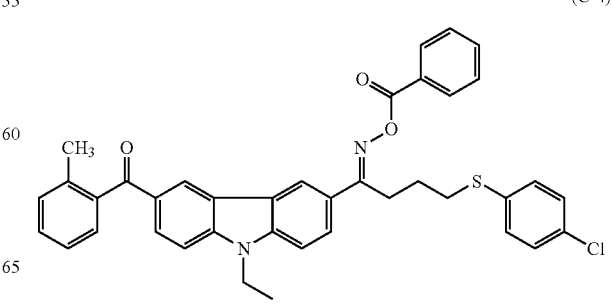

(C-4)

(C-5) 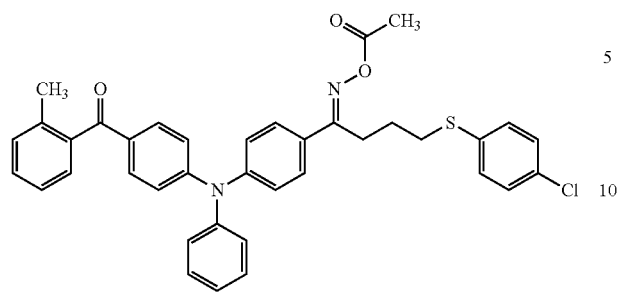
(C-10) 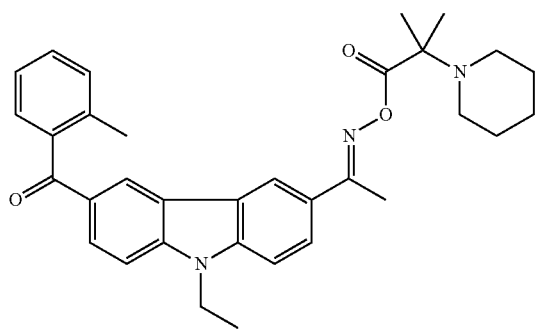
(C-6) 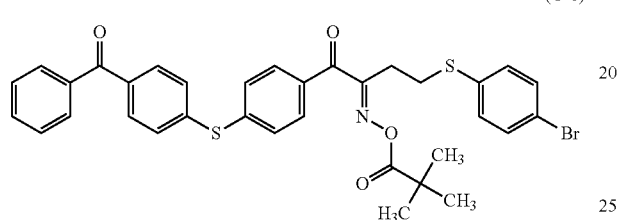
(C-11) 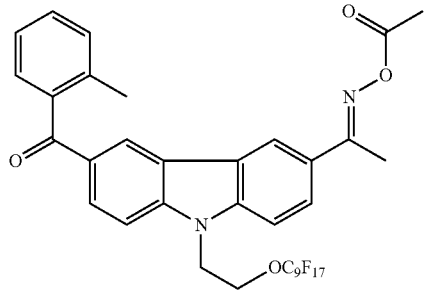
(C-7) 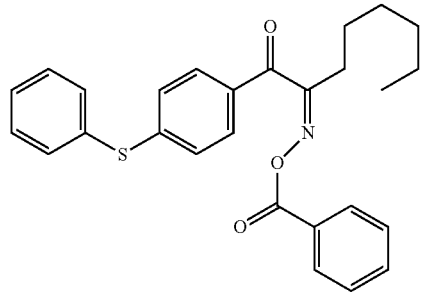
(C-12) 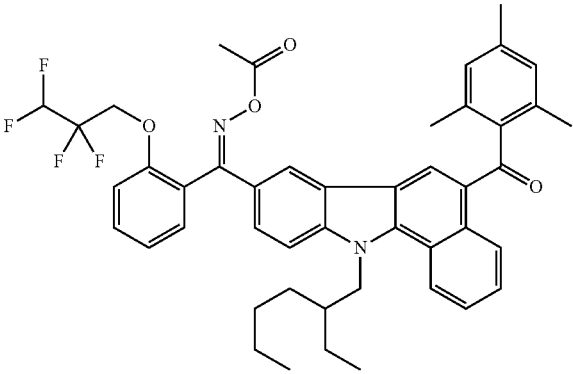
(C-8) 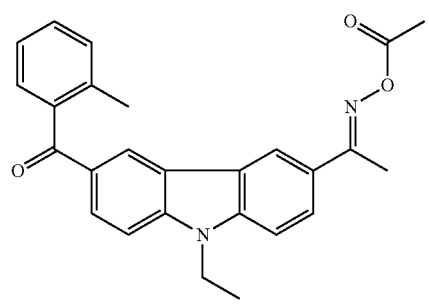
(C-13)
(C-9) 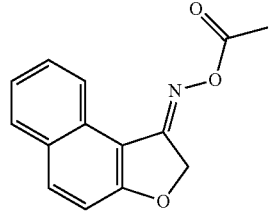
(C-14) 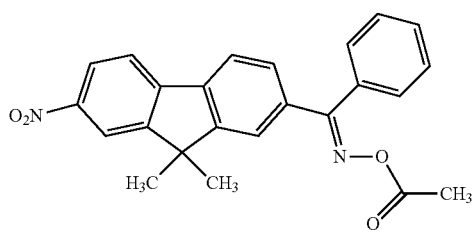

As the oxime compound, the compound having a maximum absorption wavelength in a wavelength range of 350 nm to 500 nm is preferable, the compound having an absorption wavelength in a wavelength range of 360 nm to 480 nm is more preferable. The oxime compound is particularly preferably a compound showing a high absorbance at 365 nm and 405 nm.

From the viewpoint of sensitivity, the molar light absorption coefficient at 365 nm or 405 nm of the oxime compound is preferably 1,000 to 300,000, more preferably 2,000 to 300,000, and particularly preferably 5,000 to 200,000. The molar light absorption coefficient of the compound can be measured using a known method, but specifically, it is preferably measured, for example, by means of an ultraviolet and visible light spectrophotometer (Cary-5 spectrophotometer manufactured by Varian) at a concentration of 0.01 g/L using an ethyl acetate solvent.

The photopolymerization initiator may be used in combination of two or more kinds thereof, as desired.

In a case where the coloring composition of the embodiment of the present invention contains a photopolymerization initiator, the content of the photopolymerization initiator is preferably 0.1% to 50% by mass, more preferably 0.5% to 30% by mass, and still more preferably 1% to 20% by mass, with respect to the total solid content of the coloring composition. Within this range, better sensitivity and pattern forming properties are obtained. The coloring composition of the embodiment of the present invention may include one kind or two or more kinds of the photopolymerization initiators. In a case where two or more kinds of the photopolymerization initiators are included, the total amount thereof is preferably within the range.

<<Curing Accelerator>>

A curing accelerator may be added to the coloring composition of the embodiment of the present invention for the purpose of promoting the reaction of a polymerizable compound or lowering a curing temperature. Examples of the curing accelerator include polyfunctional thiol compounds having two or more mercapto groups in a molecule thereof. The polyfunctional thiol compounds may also be added for the purpose of improving stability, smell, resolution, developability, adhesiveness, or the like. The polyfunctional thiol compounds are preferably secondary alkanethiols, and particularly preferably compounds having structures represented by Formula (T1).

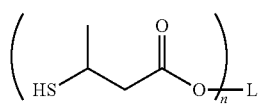

Formula (T1)

(In Formula (T1), n represents an integer of 2 to 4, and L represents a divalent to tetravalent linking group.)

In Formula (T1), it is preferable that the linking group L is an aliphatic group having 2 to 12 carbon atoms, and it is particularly preferable that n is 2 and L is an alkylene group having 2 to 12 carbon atoms. Specific examples of the polyfunctional thiol compounds are compounds represented by Structural Formulae (T2) to (T4), with the compound represented by Formula (T2) being particularly preferable. These polyfunctional thiol compounds can be used singly or in combination of two or more kinds thereof.

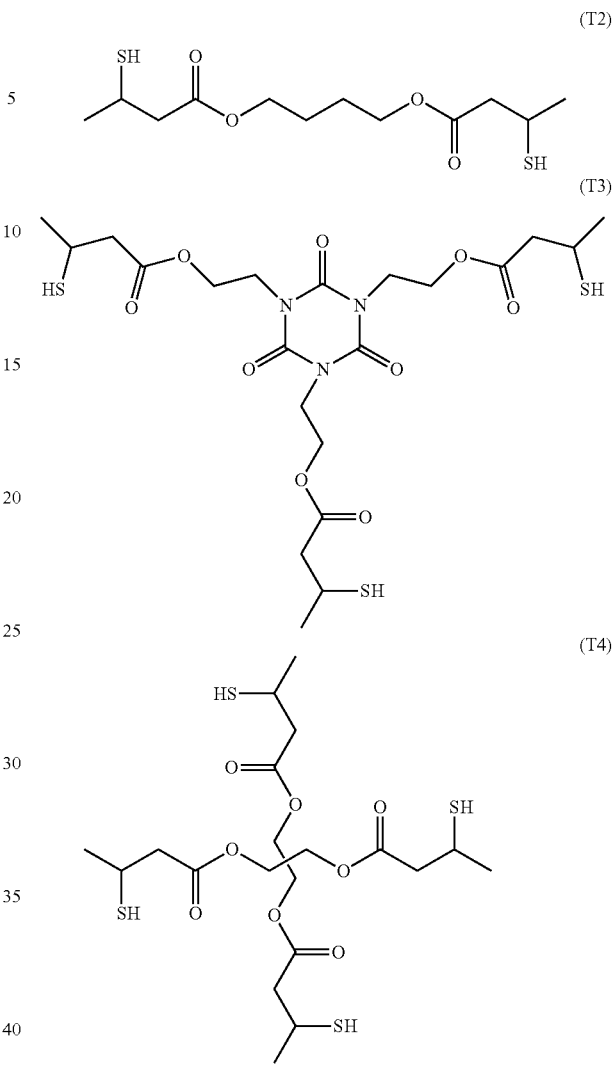

Moreover, as the curing accelerator, a methylol-based compound (for example, the compounds exemplified as a crosslinking agent in paragraph No. 0246 of JP2015-034963A), amines, phosphonium salts, amidine salts, amide compounds (each of which are the curing agents described in, for example, paragraph No. 0186 of JP2013-041165A), base generators (for example, the ionic compounds described in JP2014-055114A), cyanate compounds (for example, the compounds described in paragraph No. 0071 of JP2012-150180A), alkoxysilane compounds (for example, the alkoxysilane compounds having epoxy groups, described in JP2011-253054A), onium salt compounds (for example, the compounds exemplified as an acid generator in paragraph No. 0216 of JP2015-034963A, and the compounds described in JP2009-180949A), or the like can be used.

In a case where the coloring composition of the embodiment of the present invention contains the curing accelerator, the content of the curing accelerator is preferably 0.3% to 8.9% by mass, and more preferably 0.8% to 6.4% by mass, with respect to the total solid content of the coloring composition.

<<Pigment Derivative>>

The coloring composition of the embodiment of the present invention preferably contains a pigment derivative.

The pigment derivative is preferably a compound having a structure in which a portion of a chromophore is substituted with an acidic group, a basic group, or a phthalimidomethyl group. Examples of the acid group include a sulfo group, a carboxyl group, and a quaternary ammonium base thereof. Examples of the basic group include an amino group.

For a reason that it is easy to obtain the effect of the present invention, as the pigment derivative, a pigment derivative having a basic group is preferable, a pigment derivative having an amino group is more preferable, and a pigment derivative having a tertiary amino group is still more preferable.

Examples of the chromophore for constituting the pigment derivative include a quinoline skeleton, a benzimidazolone skeleton, a diketopyrrolopyrrole skeleton, an azo skeleton, a phthalocyanine skeleton, an anthraquinone skeleton, a quinacridone skeleton, a dioxazine skeleton, a perinone skeleton, a perylene skeleton, a thioindigo skeleton, an isoindoline skeleton, an isoindolinone skeleton, a quinophthalone skeleton, a threne skeleton, and a metal complex skeleton. The chromophore for constituting the pigment derivative is preferably the quinoline skeleton, the benzimidazolone skeleton, the diketopyrrolopyrrole skeleton, the azo skeleton, the quinophthalone skeleton, the isoindoline skeleton, or the phthalocyanine skeleton, and more preferably the azo skeleton or the benzimidazolone skeleton. For the pigment derivative, for example, the following compounds can be used. With regard to details of the pigment derivative, reference can be made to the descriptions in paragraph Nos. 0162 to 0183 of JP2011-252065A, the contents of which are incorporated herein by reference.

case of preparation of a coating liquid using the coloring composition are further improved, and thus, the evenness of coating thickness or liquid saving properties can be further improved. That is, in a case where a film is formed using to which a coloring composition containing the fluorine-based surfactant has been applied, the interface tension between a surface to be coated and the coating liquid is reduced to improve wettability with respect to the surface to be coated, and enhance coatability with respect to the surface to be coated. Therefore, formation of a film with a uniform thickness which exhibits little thickness unevenness can be more suitably performed.

The fluorine content in the fluorine-based surfactant is preferably 3% to 40% by mass, more preferably 5% to 30% by mass, and particularly preferably 7% to 25% by mass. The fluorine-based surfactant in which the fluorine content falls within this range is effective in terms of the evenness of the thickness of the coating film or liquid saving properties, and the solubility of the surfactant in the coloring composition is also good.

Examples of the fluorine-based surfactant include MEGAFACE F171, F172, F173, F176, F177, F141, F142, F143, F144, R30, F437, F475, F479, F482, F554, and F780 (all manufactured by DIC Corporation), FLUORAD FC430, FC431, and FC171 (all manufactured by Sumitomo 3M), SURFLON S-382, SC-101, SC-103, SC-104, SC-105, SC-1068, SC-381, SC-383, and S-393, and SURFLON KH-40 (all manufactured by Asahi Glass Co., Ltd.), and PF636, PF656, PF6320, PF6520, and PF7002 (all manufactured by OMNOVA). Further, as the fluorine-based surfactant, the compounds described in paragraph Nos. 0015 to

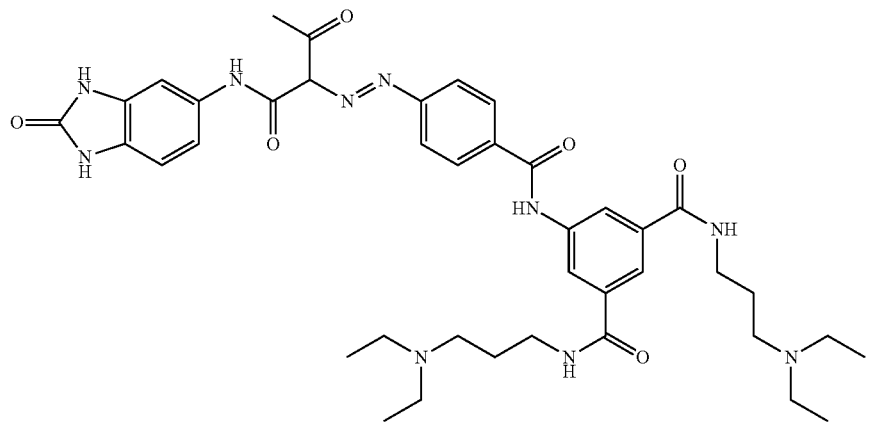 [SMILES: CCN(CC)CCCNC(=O)c1cc(NC(=O)c2ccc(/N=N/C(C(C)=O)C(=O)Nc3ccc4[nH]c(=O)[nH]c4c3)cc2)cc(C(=O)NCCCN(CC)CC)c1]

The content of the pigment derivative in the coloring composition of the embodiment of the present invention is preferably 1% to 30% by mass, and more preferably 3% to 20% by mass, with respect to the total mass of the pigment. The pigment derivative may be used singly or in combination of two or more kinds thereof.

<<Surfactant>>

From the viewpoint of further improving coatability, the coloring composition of the embodiment of the present invention may contain various surfactants. As the surfactant, various surfactants such as a fluorine-based surfactant, a nonionic surfactant, a cationic surfactant, an anionic surfactant, and a silicon-based surfactant can be used.

By incorporating the fluorine-based surfactant into the coloring composition of the embodiment of the present invention, liquid characteristics (in particular, fluidity) in a 0158 of JP2015-117327A, and the compounds described in paragraph Nos. 0117 to 0132 of JP2011-132503A can be used. As the fluorine-based surfactant, a block polymer can also be used, and specific examples thereof include the compounds described in JP2011-089090A.

As the fluorine-based surfactant, an acrylic compound in which by application of heat to a molecular structure containing a functional group having a fluorine atom, in which the functional group containing a fluorine atom is cut to volatilize a fluorine atom, can also be suitably used. Examples of the fluorine-based surfactant include MEGAFACE DS series (manufactured by DIC Corporation, The Chemical Daily, Feb. 22, 2016, Nikkei Business Daily, Feb. 23, 2016), for example, MEGAFACE DS-21.

As the fluorine-based surfactant, a fluorine-containing polymer compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) can also be preferably used, and the following compounds are also exemplified as a fluorine-based surfactant for use in the present invention. In the following in the formula, % representing the ratio of the repeating unit is % by mole.

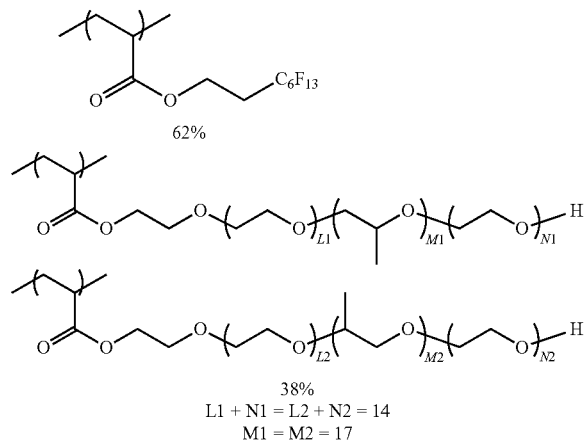

The weight-average molecular weight of the compounds is preferably 3,000 to 50,000, and is. for example 14,000.

A fluorine-containing polymer having an ethylenically unsaturated bonding group in a side chain can also be used as the fluorine-based surfactant. Specific examples thereof 0295 of JP2010-164965A. Examples of commercially available products thereof include MEGAFACE RS-101, RS-102, RS-718-K, and RS-72-K, all of which are manufactured by DIC Corporation.

Examples of the nonionic surfactant include glycerol, trimethylolpropane, trimethylolethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters, PLURONIC L1, L31, L61, L62, 10R5, 17R2, and 25R2 (manufactured by BASF), TETRONIC 304, 701, 704, 901, 904, and 150R1 (manufactured by BASF), SOLSEPERSE 20000 (manufactured by Lubrizol Japan Ltd.), NCW-101, NCW-1001, and NCW-1002 (manufactured by Wako Pure Chemical Industries, Ltd.), PIONIN D-6112, D-6112-W, and D-6315 (manufactured by Takemoto Oil & Fat Co., Ltd.), and OLFINE E1010, and SURFYNOL 104, 400, and 440 (manufactured by Nissin chemical industry Co., Ltd.).

Specific examples of the cationic surfactant include an organosiloxane polymer KP341 (manufactured by Shin-Etsu Chemical Co., Ltd.), a (meth)acrylic acid-based (co)polymer POLYFLOW No. 75, No. 90, and No. 95 (manufactured by KYOEISHA CHEMICAL CO., LTD.), and W001 (manufactured by Yusho Co., Ltd.).

Examples of the anionic surfactant include W004, W005, and W017 (manufactured by Yusho Co., Ltd.), and BL (manufactured by Sanyo Chemical Industries, Ltd.).

Examples of the silicon-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all manufactured by Dow Corning Toray Co., Ltd.), TSF-4440, TSF-4300, TSF-4445, TSF-4460, and TSF-4452 (all manufactured by Momentive Performance Materials Co., Ltd.), KP341, KF6001, and KF6002 (all manufactured by Shin-Etsu Chemical Co., Ltd.), and BYK307, BYK323, and BYK330 (all manufactured by BYK Chemie). Further, as the silicon-based surfactant, the following compound can be used.

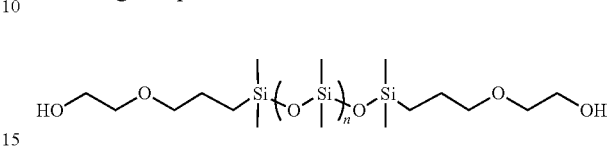

<<Silane Coupling Agent>>

The coloring composition of the embodiment of the present invention can contain a silane coupling agent. As the silane coupling agent, a silane compound having at least two kinds of functional groups having different reactivities per molecule is preferable. The silane coupling agent is preferably a silane compound having at least one selected from a vinyl group, an epoxy group, a styryl group, a methacryl group, an amino group, an isocyanurate group, a ureido group, a mercapto group, a sulfide group, and an isocyanate group, and an alkoxy group. Specific examples of the silane coupling agent include N-β-aminoethyl-γ-aminopropyl methyldimethoxysilane (KBM-602, manufactured by Shin-Etsu Chemical Co., Ltd.), N-β-aminoethyl-γ-aminopropyl trimethoxysilane (KBM-603, manufactured by Shin-Etsu Chemical Co., Ltd.), N-β-aminoethyl-γ-aminopropyl triethoxysilane (KBE-602, manufactured by Shin-Etsu Chemical Co., Ltd.), γ-aminopropyl trimethoxysilane (KBM-903, manufactured by Shin-Etsu Chemical Co., Ltd.), γ-aminopropyl triethoxysilane (KBE-903, manufactured by Shin-Etsu Chemical Co., Ltd.), 3-methacryloxypropyl trimethoxysilane (KBM-503, manufactured by Shin-Etsu Chemical Co., Ltd.), and 3-glycidoxypropyl trimethoxysilane (KBM-403, manufactured by Shin-Etsu Chemical Co., Ltd.). With regard to details of the silane coupling agent, reference can be made to the descriptions in paragraph Nos. 0155 to 0158 of JP2013-254047A, the contents of which are incorporated herein by reference.

In a case where the coloring composition of the embodiment of the present invention contains a silane coupling agent, the content of the silane coupling agent is preferably 0.001% to 20% by mass, more preferably 0.01% to 10% by mass, and particularly preferably 0.1% by mass to 5% by mass, with respect to the total solid content of the coloring composition. The coloring composition of the embodiment of the present invention may include one kind or two or more kinds of the silane coupling agents. In a case where the coloring composition includes two or more kinds of the silane coupling agent, the total amount thereof is preferably within the range.

<<Polymerization Inhibitor>>

It is also preferable that to the coloring composition of the embodiment of the present invention contains a polymerization inhibitor. Examples of the polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), and a N-nitrosophenylhydroxylamine salt (an ammonium salt, a cerous salt, or the like)

In a case where the coloring composition of the embodiment of the present invention contains a polymerization inhibitor, the content of the polymerization inhibitor is preferably 0.01% to 5% by mass with respect to the total solid content of the coloring composition. The coloring composition of the embodiment of the present invention may include one kind or two or more kinds of the polymerization inhibitor. In a case where the coloring composition includes two or more kinds of the polymerization inhibitor, the total amount thereof is preferably within the range.

<<Ultraviolet Absorber>>

The coloring composition of the embodiment of the present invention may contain an ultraviolet absorber. As the ultraviolet absorber, a conjugated diene-based compound is preferable. Examples of commercially available products of the ultraviolet absorber include UV-503 (manufactured by Daito Chemical Co., Ltd.). Further, as the ultraviolet absorber, an aminodiene compound, a salicylate compound, a benzophenone compound, a benzotriazole compound, an acrylonitrile compound, a triazine compound, or the like can be used. Specific examples thereof include the compounds described in JP2013-068814A. In addition, as the benzotriazole compound, MYUA series manufactured by Miyoshi Oil & Fat Co., Ltd. (The Chemical Daily, Feb. 1, 2016) may be used.

In a case where the coloring composition of the embodiment of the present invention contains an ultraviolet absorber, the content of the ultraviolet absorber is preferably 0.1% to 10% by mass, more preferably 0.1% to 5% by mass, and particularly preferably 0.1% to 3% by mass, with respect to the total solid content of the coloring composition. Further, only one kind or two or more kinds of the ultraviolet absorbers may be used. In a case where two or more kinds of the ultraviolet absorbers are included, the total amount thereof is preferably within the range.

<<Other Additives>>

Various additives such as, for example, a filler, an adhesion promoter, an antioxidant, and an aggregation inhibitor can be blended into the coloring composition of the embodiment of the present invention, as desired. Examples of these additives include the additives described in paragraph Nos. 0155 and 0156 of JP2004-295116A, the contents of which are incorporated herein by reference. Further, as the antioxidant, for example, a phenol compound, a phosphorus-based compound (for example, the compounds described in paragraph No. 0042 of JP2011-090147A), a thioether compound, or the like can be used. Examples of a commercially available product of the antioxidant include ADEKA STAB series (AO-20, AO-30, AO-40, AO-50, AO-50F, AO-60, AO-60G, AO-80, AO-330, and the like), all of which are manufactured by ADEKA. Only one kind or two or more kinds of the antioxidants may be used as a mixture of two or more kinds thereof. The coloring composition of the embodiment of the present invention can contain the sensitizers or the light stabilizers described in paragraph No. 0078 of JP2004-295116A, or the thermal polymerization inhibitors described in paragraph No. 0081 of the same publication.

There are some cases where a metal element is included in the coloring composition according to raw materials and the like, but from the viewpoint of suppression of generation of defects, or the like, the content of Group 2 elements (calcium, magnesium, and the like) in the coloring composition is preferably 50 parts per million (ppm) by mass or less, and preferably controlled to 0.01 to 10 ppm by mass. Further, the total amount of the inorganic metal salts in the coloring composition is preferably 100 ppm by mass or less, and more preferably 0.5 to 50 ppm by mass.

<Method for Preparing Coloring Composition>

The coloring composition of the embodiment of the present invention can be prepared by mixing the above-mentioned components. In the preparation of the coloring composition, the respective components may be blended at once, or the respective components may be dissolved and/or dispersed in a solvent, and then sequentially blended. Further, the order of the components to be introduced or the operational conditions during the blending is not particularly limited. For example, the coloring composition may be prepared by dissolving and/or dispersing all the components in a solvent at the same time, or by appropriately leaving the respective components in two or more solutions or dispersion liquids, and mixing them into a solution during the use (during the coating), as desired.

It is preferable that in the preparation of the coloring composition, a composition formed by mixing the respective components is filtered through a filter for the purpose of removing foreign matters, reducing defects, or the like. As the filter, any filters that have been used in the related art for filtration use and the like may be used without particular limitation. Examples of the filter include filters formed of materials including, for example, a fluorine resin such as polytetrafluoroethylene (PTFE), a polyamide-based resin such as nylon (for example, nylon-6 and nylon-6,6), and a polyolefin resin (including a polyolefin resin having a high density and/or an ultrahigh molecular weight) such as polyethylene and polypropylene (PP). Among these materials, polypropylene (including a high-density polypropylene) and nylon are preferable.

The pore diameter of the filter is suitably approximately 0.01 to 7.0 µm, preferably approximately 0.01 to 3.0 µm, and more preferably approximately 0.05 to 0.5 m.

In addition, a fibrous filter material is also preferably used as the filter. Examples of the fibrous filter material include a polypropylene fiber, a nylon fiber, and a glass fiber. Examples of a filter using the fibrous filter material include filter cartridges of SBP type series (SBP008 and the like), TPR type series (TPR002, TPR005, and the like), or SHPX type series (SHPX003 and the like), manufactured by Roki Techno Co., Ltd.

In a case of using a filter, different filters may be combined. Here, the filtration with each of the filters may be run once or may be repeated twice or more times.

For example, filters having different pore diameters within the above-mentioned range may be combined. With regard to the pore diameter of the filter herein, reference can be made to nominal values of filter manufacturers. A commercially available filter may be selected from, for example, various filters provided by Nihon Pall Corporation (DFA4201NIEY and the like), Toyo Roshi Kaisha., Ltd., Nihon Entegris K. K. (formerly Nippon Microlith Co., Ltd.), Kitz Micro Filter Corporation, and the like.

In addition, the filtration through the first filter may be performed with only a dispersion liquid, the other components may be mixed therewith, and then the filtration through the second filter may be performed. As the second filter, a filter formed of the same material as that of the first filter, or the like can be used.

The coloring composition of the embodiment of the present invention can be used after its viscosity is adjusted for the purposes of adjusting the state of a film surface (flatness or the like), adjusting a film thickness, or the like. The value of the viscosity can be appropriately selected as desired, and is, for example, preferably 0.3 mPa·s to 50 mPa·s, and more preferably 0.5 mPa·s to 20 mPa·s at 25° C. As for a method for measuring the viscosity, the viscosity can be measured, for example, with a temperature being adjusted to 25° C., using a viscometer RE85L (rotor: 1°34'× R24, measurement range of 0.6 to 1,200 mPa·s) manufactured by Toki Sangyo Co., Ltd.

The moisture content in the coloring composition of the embodiment of the present invention is usually 3% by mass or less, preferably 0.01% to 1.5% by mass, and more preferably in the range of 0.1% to 1.0% by mass. With regard to the light resistance, it is preferable that the moisture content of the coloring composition is low, but from the viewpoints of the liquid stability of the coloring composition, production suitability, and the like, it may be preferable in some cases that the coloring composition contains a small amount of water. The moisture content is a value measured by a Karl Fischer method.

<Applications of Coloring Composition>

The coloring composition of the embodiment of the present invention can be preferably used for the formation of a colored layer of a color filter since it can form a film having excellent light resistance. Further, the coloring composition of the embodiment of the present invention can be suitably used for forming a colored pattern of a color filter or the like used in a solid-state imaging element such as a charge-coupled device (CCD) and a complementary metal-oxide semiconductor (CMOS), an image display device such as a liquid crystal display device, or the like. In addition, the coloring composition of the embodiment of the present invention can also be suitably used in applications of a print ink, an ink jet ink, a paint, and the like. Among those, the coloring composition of the embodiment of the present invention can also be suitably used in the production of a color filter for a solid-state imaging element such as a CCD and a CMOS.

<Color Filter>

Next, the color filter of an embodiment of the present invention will be described.

The color filter of the embodiment of the present invention is formed using the above-mentioned coloring composition of the embodiment of the present invention. The film thickness of the color filter of the embodiment of the present invention can be appropriately adjusted depending on the purposes. The film thickness is preferably 20 μm or less, more preferably 10 μm or less, and still more preferably 5 μm or less. The lower limit of the film thickness is preferably 0.1 μm or more, more preferably 0.2 μm or more, and still more preferably 0.3 μm or more. The color filter of the embodiment of the present invention can be used for a solid-state imaging element such as a charge coupled device (CCD) and a complementary metal-oxide semiconductor (CMOS), an image display device, or the like.

In a case where the coloring compound of the embodiment of the present invention is used in applications for a liquid crystal display device, the voltage holding ratio of a liquid crystal display element comprising a color filter is preferably 70% or more, and more preferably 90% or more. Known means for obtaining a high voltage holding ratio can be incorporated as appropriate, and examples of typical means include a use of high-purity materials (for example, reduction in ionic impurities) and a control of the amount of acidic functional groups in a composition. The voltage holding ratio can be measured by, for example, the methods described in paragraph 0243 of JP2011-008004A and paragraphs 0123 to 0129 of JP2012-224847A.

<Pattern Forming Method>

The pattern forming method of an embodiment of the present invention includes a step of forming a coloring composition layer on a support using the coloring composition of the embodiment of the present invention, and a step of forming a pattern onto the coloring composition layer by a photolithographic method or a dry etching method.

Pattern formation by the photolithographic method preferably includes a step of forming a coloring composition layer on a support using the coloring composition, a step of patternwise exposing the coloring composition layer, and a step of removing unexposed areas by development to form a pattern. A step of baking the coloring composition layer (pre-baking step) and a step of baking the developed pattern (post-baking step) may be provided, as desired. Further, pattern formation by a dry etching method preferably includes a step of forming a coloring composition layer on a support using the coloring composition, a step of performing curing to form a cured product layer, a step of forming a photoresist layer on the cured product layer, a step of performing exposure and development to pattern the photoresist layer, thereby obtaining a resist pattern, and a step of dry etching the cured product layer using the resist pattern as an etching mask to form a pattern. Hereinafter, the respective steps will be described.

<<Step of Forming Coloring Composition Layer>>

In the step of forming a coloring composition layer, the coloring composition layer is formed on a support, using the coloring composition.

The support is not particularly limited, and can be appropriately selected depending on applications. Examples of the support include a glass substrate, a substrate for a solid-state imaging element, on which a solid-state imaging element (light-receiving element) such as a CCD and a CMOS is provided, and a silicon substrate. Further, an undercoat layer may be provided on the support, as desired, so as to improve adhesion to a layer above the support, to prevent diffusion of materials, or to flatten a surface of the substrate.

As a method for applying the coloring composition onto the support, various coating methods such as slit coating, an ink jet method, spin coating, cast coating, roll coating, and a screen printing method can be used.

The coloring composition layer formed on the support may be dried (pre-baked). In a case of forming a pattern by a low-temperature process, pre-baking may not be performed. In a case of performing the pre-baking, the pre-baking temperature is preferably 150° C. or lower, more preferably 120° C. or lower, and still more preferably 110° C. or lower. The lower limit may be set to, for example, 50° C. or higher, or to 80° C. or higher. By performing the pre-baking at 150° C. or lower, these characteristics can be more effectively maintained in a case of a configuration in which a photo-electric conversion film of an image sensor is formed of organic materials. The pre-baking time is preferably 10 seconds to 300 seconds, more preferably 40 to 250 seconds, and still more preferably 80 to 220 seconds. Drying can be performed using a hot plate, an oven, or the like.

(Case of Forming Pattern by Photolithographic Method)

<<Exposing Step>>

Next, the coloring composition layer formed on the support is patternwise exposed (exposing step). For example, the coloring composition layer can be subjected to patternwise exposure by performing exposure using an exposure device such as a stepper through a mask having a predetermined mask pattern. Thus, the exposed portion can be cured.

As the radiation (light) which can be used during the exposure, ultraviolet rays such as g-rays and i-rays (particularly preferably i-rays) are preferably used. The irradiation dose (exposure dose) is, for example, preferably 0.03 to 2.5 J/cm$^2$, and more preferably 0.05 to 1.0 J/cm$^2$.

The oxygen concentration during the exposure can be appropriately selected, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume), in addition to an atmospheric air. Further, the exposure illuminance can be appropriately set, and can be usually selected from a range of 1,000 W/m$^2$ to 100,000 W/m$^2$ (for example, 5,000 W/m$^2$, 15,000 W/m$^2$, or 35,000 W/m$^2$). Appropriate conditions of each of the oxygen concentration and the illuminance of exposure energy may be combined, and for example, a combination of the oxygen concentration of 10% by volume and the illuminance of 10,000 W/m$^2$, a combination of the oxygen concentration of 35% by volume and the illuminance of 20,000 W/m$^2$, or the like is available.

<<Developing Step>>

Next, the unexposed areas are removed by development to form a pattern. The removal of the unexposed areas by development can be carried out using a developer. Thus, the coloring composition layer of the unexposed areas in the exposing step is eluted into the developer, and as a result, only a photocured portion remains.

As the developer, an organic alkali developer causing no damage on the underlying solid-state imaging element, circuit, or the like is preferable.

The temperature of the developer is preferably for example, 20° C. to 30° C., and the development time is preferably 20 to 180 seconds. Further, in order to improve residue removing properties, a step of removing the developer by shaking per 60 seconds and supplying a fresh developer may be repeated multiple times.

As the developer, an aqueous alkaline solution obtained by diluting an alkali agent with pure water is preferably used. Examples of the alkali agent include organic alkaline compounds such as aqueous ammonia, ethylamine, diethylamine, dimethylethanolamine, diglycol amine, diethanolamine, hydroxyamine, ethylenediamine, tetramethylammonium hydroxide, tetraethylammonium hydroxide, tetrapropylammonium hydroxide, tetrabutylammonium hydroxide, benzyltrimethylammonium hydroxide, dimethylbis(2-hydroxyethyl)ammonium hydroxide, choline, pyrrole, piperidine, and 1,8-diazabicyclo[5,4,0]-7-undecene, and inorganic alkaline compounds such as sodium hydroxide, potassium hydroxide, sodium carbonate, sodium hydrogen carbonate, sodium silicate, and sodium metasilicate. The concentration of the alkali agent in the aqueous alkaline solution is preferably 0.001% to 10% by mass, and more preferably 0.01% to 1% by mass. Moreover, the developer may further include a surfactant. Examples of the surfactant include the surfactants described as the above-mentioned coloring composition, and the surfactant is preferably a nonionic surfactant.

In addition, in a case where a developer including such an aqueous alkaline solution is used, it is preferable to perform washing (rinsing) with pure water after development.

After the development, a heating treatment (post-baking) can also be performed after carrying out drying. The post-baking is a heating treatment after development so as to complete the curing of the film. In a case of performing the post-baking, the post-baking temperature is preferably, for example, 100° C. to 240° C. From the viewpoint of curing of the film, the post-baking temperature is more preferably 200° C. to 230° C. The Young's modulus of the film after post-baking is preferably 0.5 to 20 GPa, and more preferably 2.5 to 15 GPa. In addition, in a case of using an organic electroluminescence (organic EL) element as a light-emitting light source or a case of constituting a photo-electric conversion film of an image sensor with organic materials, the post-baking temperature is preferably 150° C. or lower, more preferably 120° C. or lower, still more preferably 100° C. or lower, and particularly preferably 90° C. or lower. The lower limit can be set to, for example, 50° C. or higher.

The post-baking can be performed continuously or batchwise by using a heating means such as a hot plate, a convection oven (hot-air circulating dryer), and a high-frequency heater so that the film after development (cured film) satisfies the conditions. Further, in a case of forming a pattern by a low-temperature process, the post-baking may not be carried out.

The cured film preferably has high flatness. Specifically, the surface roughness Ra is preferably 100 nm or less, more preferably 40 nm or less, and still more preferably 15 nm or less. The lower limit is not specified, but is preferably, for example 0.1 nm or more. The surface roughness can be measured, for example, using an atomic force microscope (AFM) Dimension 3100 manufactured by Veeco Instruments, Inc.

In addition, the contact angle of water on the cured film can be appropriately set to a preferred value, but is typically in the range of 50° to 110°. The contact angle can be measured, for example, using a contact angle meter CV-DT·A Model (manufactured by Kyowa Interface Science Co., Ltd.).

A higher volume resistivity value of each pattern (pixel) is desired. Specifically, the volume resistivity value of the pixel is preferably 10$^9$ Ω·cm or more, and more preferably 10$^{11}$ Ω·cm or more. The upper limit is not defined, but is, for example, preferably 10$^{14}$ Ω·cm or less. The volume resistivity value of the pixel can be measured, for example, using an ultra high resistance meter 5410 (manufactured by Advantest Corporation).

(Case of Forming Pattern by Dry Etching Method)

Pattern formation by a dry etching method can be carried out by curing a colorant composition layer formed on a support to form a cured product layer, and then etching the obtained cured product layer with an etching gas, using the patterned photoresist layer as a mask.

As for the photoresist layer, it is preferable that a positive tone or negative tone radiation-sensitive composition is applied onto a cured product layer, and dried to form a photoresist layer. As the radiation-sensitive composition used for formation of the photoresist layer, a positive tone radiation-sensitive composition is preferably used. As the positive tone radiation-sensitive composition, a radiation-sensitive composition which is sensitive to radiations such as far ultraviolet-rays including ultraviolet rays (g-rays, h-rays, and i-rays), KrF-rays, ArF-rays, and the like, electron beams, ion beams, and X-rays is preferable. The above-mentioned positive tone radiation-sensitive composition is preferably a radiation-sensitive composition which is sensitive to KrF-rays, ArF-rays, i-rays, or X-rays, and from the viewpoint of micromachining, it is more preferably a radiation-sensitive composition which is sensitive to KrF-rays. As the positive tone photosensitive resin composition, the positive tone resist compositions described in JP2009-237173A or JP2010-134283A is suitably used.

In the formation of a photoresist layer, an exposing step with the radiation-sensitive composition is preferably performed with KrF-rays, ArF-rays, i-rays, X-rays, or the like, more preferably performed with KrF-rays, ArF-rays, X-rays, or the like, and still more preferably performed with KrF-rays.

<Solid-State Imaging Element>

The solid-state imaging element of an embodiment of the present invention has the above-mentioned color filter of the embodiment of the present invention. The configuration of the solid-state imaging element of the embodiment of the present invention is not particularly limited as long as the solid-state imaging element is configured to include the color filter in the embodiment of the present invention and function as a solid-state imaging element. However, examples thereof include the following configurations.

The solid-state imaging element is configured to have a plurality of photodiodes constituting a light receiving area of the solid-state imaging element (a charge coupled device (CCD) image sensor, a complementary metal-oxide semiconductor (CMOS) image sensor, or the like), and a transfer electrode formed of polysilicon or the like on a substrate; have a light-shielding film having openings only over the light receiving portion of the photodiode, on the photodiodes and the transfer electrodes; have a device-protective film formed of silicon nitride or the like, which is formed to coat the entire surface of the light-shielding film and the light receiving portion of the photodiodes, on the light-shielding film; and have a color filter on the device-protective film. In addition, the solid-state imaging element may also be configured, for example, such that it has a light collecting means (for example, a microlens, which is the same hereinafter) on a device-protective film under a color filter (a side closer to the substrate), or has a light collecting means on a color filter. Further, the color filter may have a structure in which a cured film forming each color pixel is embedded in, for example, a space partitioned in a lattice shape by a partition wall. The partition wall in this case preferably has a low refractive index for each color pixel. Examples of an imaging element having such a structure include the devices described in JP2012-227478A and JP2014-179577A.

An imaging element comprising the solid-state imaging element of the embodiment of the present invention can also be used as a vehicle camera or a monitoring camera, in addition to a digital camera or electronic equipment (mobile phones or the like) having an imaging function.

<Image Display Device>

The color filter of the embodiment of the present invention can be used for an image display device such as a liquid crystal display device and an organic electroluminescence display device. The definitions of image display devices or the details of the respective image display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and can be applied to, for example, liquid crystal display devices employing various systems described in the "Liquid Crystal Display Technology for Next Generation".

EXAMPLES

Hereinbelow, the present invention will be described in more detail with reference to Examples. The materials, the amounts of materials used, the proportions, the treatment details, the treatment procedure, or the like shown in the Examples below may be modified if appropriate as long as the modifications do not depart from the spirit of the present invention. Therefore, the scope of the present invention should not be construed as being limited to the specific Examples shown below. In addition, "parts" and "%" are on a mass basis unless otherwise specified.

Furthermore, PGMEA is hereinafter an abbreviation of propylene glycol monomethyl ether acetate.

<Measurement of Weight-Average Molecular Weight>

The weight-average molecular weight was measured by the following method.

Types of columns: Columns formed by connection of TOSOH TSKgel Super HZM-H, TOSOH TSKgel Super HZ4000, and TOSOH TSKgel Super HZ2000

Developing solvent: Tetrahydrofuran

Column temperature: 40° C.

Flow amount (amount of a sample to be injected): 1.0 µL (sample concentration: 0.1% by mass)

Device name: HLC-8220GPC manufactured by Tosoh Corporation

Detector: Refractive index (RI) detector

Calibration curve base resin: Polystyrene

<Method for Measuring Acid Value>

A measurement sample was dissolved in a mixed solvent of tetrahydrofuran/water=9/1 (mass ratio), and the obtained solution was titrated by neutralization with a 0.1-mol/L aqueous sodium hydroxide solution, using a potentiometric titrator (trade name: AT-510, manufactured by Kyoto Denshi K. K.) at 25° C. By using the inflection point in a titration pH curve as a titration end point, an acid value was calculated by the following equation.

$$A = 56.11 \times Vs \times 0.1 \times f/w$$

A: Acid value (mgKOH/g)

Vs: Use amount (mL) of a 0.1-mol/L aqueous sodium hydroxide solution required for titration f: Titer of a 0.1-mol/L aqueous sodium hydroxide solution w: Mass (g) (in terms of a solid content) of a measurement sample Test Example 1

<Production of Pigment Dispersion Liquid>

The raw materials described in the following table were mixed to obtain a mixed solution. The obtained mixed solution was subjected to a dispersion treatment using ULTRA APEX MILL (trade name) manufactured by Kotobuki Industries Co., Ltd. as a circulation type dispersing device (beads mill) to obtain a dispersion liquid. The solid content of the obtained dispersion liquid was 20.05% by mass. Further, the numerical values described in the section of the resin 1 are values of the solid contents.

TABLE 1

| | Pigment dispersion liquid 1 | Pigment dispersion liquid 2 | Pigment dispersion liquid 3-1 | Pigment dispersion liquid 3-2 | Pigment dispersion liquid 3-3 | Pigment dispersion liquid 3-4 | Pigment dispersion liquid 3-5 | Pigment dispersion liquid 3-6 |
|---|---|---|---|---|---|---|---|---|
| PG58 | 883 | 883 | | | | | | |
| G2 | | | 883 | | | | | |
| G3 | | | | 883 | | | | |
| G4 | | | | | 883 | | | |
| G5 | | | | | | 883 | | |

TABLE 1-continued

|  | Pigment dispersion liquid 1 | Pigment dispersion liquid 2 | Pigment dispersion liquid 3-1 | Pigment dispersion liquid 3-2 | Pigment dispersion liquid 3-3 | Pigment dispersion liquid 3-4 | Pigment dispersion liquid 3-5 | Pigment dispersion liquid 3-6 |
|---|---|---|---|---|---|---|---|---|
| G6 |  |  |  |  |  |  | 883 |  |
| G7 |  |  |  |  |  |  |  | 883 |
| PY185 | 379 |  | 379 | 379 | 379 | 379 | 379 | 379 |
| PY139 |  | 379 |  |  |  |  |  |  |
| Pigment derivative (S-1) | 140 | 140 | 140 | 140 | 140 | 140 | 140 | 140 |
| Resin 1 | 350 | 350 | 350 | 350 | 350 | 350 | 350 | 350 |
| PGMEA | 6,990 | 6,990 | 6,990 | 6,990 | 6,990 | 6,990 | 6,990 | 6,990 |

TABLE 2

|  | Pigment dispersion liquid 4 | Pigment dispersion liquid 5 | Pigment dispersion liquid 6 | Pigment dispersion liquid 7 | Pigment dispersion liquid 8 | Pigment dispersion liquid 9 | Pigment dispersion liquid 10 | Pigment dispersion liquid 11 | Pigment dispersion liquid 12 |
|---|---|---|---|---|---|---|---|---|---|
| PG58 | 1,073 | 1,010 | 947 | 821 | 757 | 694 | 1,136 | 631 | 505 |
| PY185 | 189 | 252 | 315 | 441 | 505 | 568 | 126 | 631 | 757 |
| Pigment derivative (S-1) | 140 | 140 | 140 | 140 | 140 | 140 | 140 | 140 | 140 |
| resin 1 | 350 | 350 | 350 | 350 | 350 | 350 | 350 | 350 | 350 |
| PGMEA | 6,990 | 6,990 | 6,990 | 6,990 | 6,990 | 6,990 | 6,990 | 6,990 | 6,990 |

TABLE 3

|  | Pigment dispersion liquid 13 |
|---|---|
| PG58 | 731 |
| PY185 | 183 |
| Pigment derivative (S-1) | 95 |
| Resin 1 | 389 |
| PGMEA | 5,575 |

The raw materials described in the tables are as follows.
PY185: C. I. Pigment Yellow 185 (isoindoline pigment)
PY139: C. I. Pigment Yellow 139 (isoindoline pigment)
PG58: C. I. Pigment Green 58 (halogenated zinc phthalocyanine pigment)
G2 to G7: Halogenated zinc phthalocyanine pigments synthesized by the method which will be described later
Pigment derivative S-1: Compound with the following structure

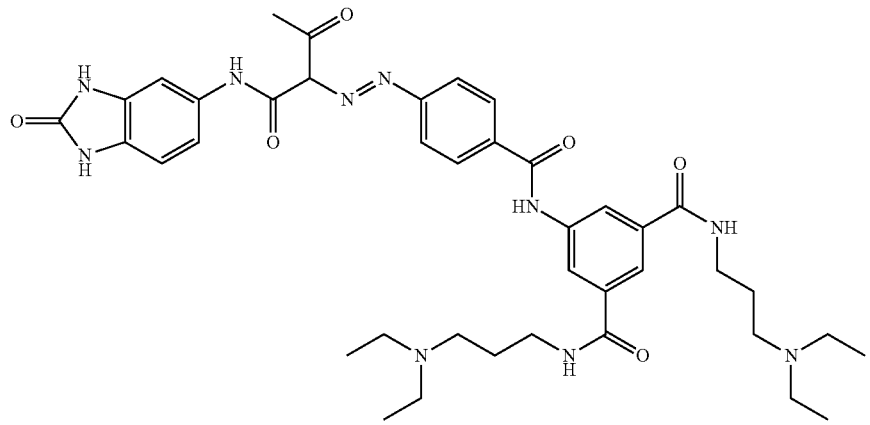 [SMILES: CCN(CC)CCCNC(=O)c1cc(NC(=O)c2ccc(/N=N/C(C(C)=O)C(=O)Nc3ccc4[nH]c(=O)[nH]c4c3)cc2)cc(C(=O)NCCCN(CC)CC)c1]

Resin 1: A 30%-by-mass PGMEA solution of a resin with the following structure (weight-average molecular weight=24,000, acid value=50 mgKOH/g, the numerical values appended to the main chains are molar ratios, and the numerical values appended to the side chains are the repetition numbers of repeating units)

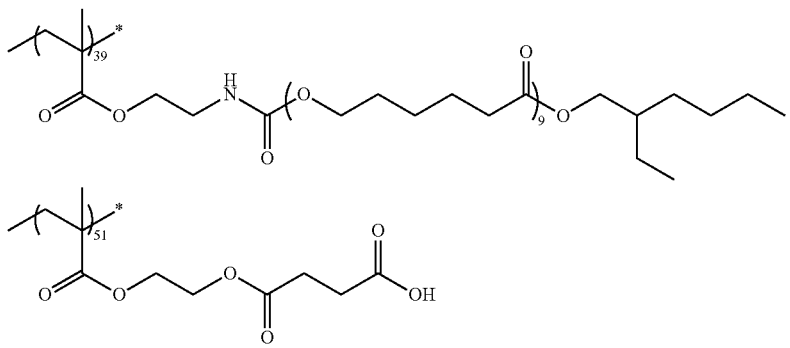

<Synthesis of Halogenated Zinc Phthalocyanine Pigment G2>

91 parts of sulfuryl chloride, 109 parts of aluminum chloride, 15 parts of sodium chloride, 30 parts of zinc phthalocyanine, and 74 parts of bromine were introduced. The mixture was warmed to 130° C. for 40 hours, extracted with water, and then filtered to obtain a green coloring pigment. 20 parts of the obtained green coloring pigment, 140 parts of pulverized sodium chloride, 32 parts of diethylene glycol, and 1.8 parts of xylene were introduced into a twin-arm type kneader, and kneaded at 100° C. for 6 hours. After kneading, the product was extracted with 1,800 parts of water at 80° C., and after stirring for 1 hour, the residue was filtered, washed with hot water, dried, and pulverized to obtain a halogenated zinc phthalocyanine pigment G2. The obtained halogenated zinc phthalocyanine pigment G2 was subjected to halogen content analysis by mass spectrometry and flask combustion ion chromatography, and it was found that the atomic ratio of halogen and hydrogen 14:2.

<Synthesis of Halogenated Zinc Phthalocyanine Pigments G3 to G7>

By the same method as for the halogenated zinc phthalocyanine pigment G2 except that the atomic ratio of halogen to hydrogen was changed as in the following table by adjusting the amount of bromine to be added, halogenated zinc phthalocyanine pigments G3 to G7 were synthesized.

TABLE 4

| Halogenated zinc phthalocyanine pigment | Halogen:hydrogen (atomic ratio) |
| --- | --- |
| G2 | 14:2 |
| G3 | 13.5:2.5 |
| G4 | 13:3 |
| G5 | 12.5:3.5 |
| G6 | 12:4 |
| G7 | 11.5:4.5 |

<Preparation of Coloring Composition>

The raw materials described in the following composition were mixed to prepare a coloring composition.

Furthermore, in Examples 45 to 47, D-10, D-C, and D-D were mixed and used at a ratio of D-10/D-C/D-D=1/0.7/0.3 in terms of mass ratio as the polymerizable compound D, and OXE01 and I-1 were mixed and used at a ratio of OXE01/I-1=5/3.5 in terms of mass ratio as the photopolymerization initiator.

(Composition) Examples 1 to 44

PGMEA: 35.47 parts by mass

Resin C described in the following table: 1.67 parts by mass

Polymerizable compound described in the following table: 2.42 parts by mass

Surfactant W-1 (siloxane-based): 0.01 parts by mass

Photopolymerization initiator described in the following table: 0.93 parts by mass Compound having an epoxy group (trade name "EHPE 3150" manufactured by Daicel Chemical Industries, Ltd.): 0.34 parts by mass Polymerization inhibitor (p-methoxyphenol): 0.01 parts by mass Pigment dispersion liquid described in the following table: 59.15 parts by mass (11.83 parts by mass in terms of a solid content)

(Composition) Examples 45 to 47

PGMEA: 25.33 parts by mass

Resin C described in the following table: 1.41 parts by mass

Polymerizable compound described in the following table: 2.10 parts by mass

Surfactant W-1 (siloxane-based): 0.008 parts by mass

Photopolymerization initiator described in the following table: 0.85 parts by mass Compound having an epoxy group (trade name "EHPE 3150" manufactured by Daicel Chemical Industries, Ltd.): 0.38 parts by mass Polymerization inhibitor (p-methoxyphenol): 0.0011 parts by mass Pigment dispersion liquid described in the following table: 69.73 parts by mass (13.98 parts by mass in terms of a solid content)

Silane coupling agent 1: 0.19 parts by mass

Surfactant W-1: Compound with the following structure (weight-average molecular weight of 14,000)

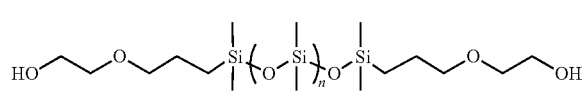

Silane coupling agent 1: Compound with the following structure (Et in the structural formula is an ethyl group)

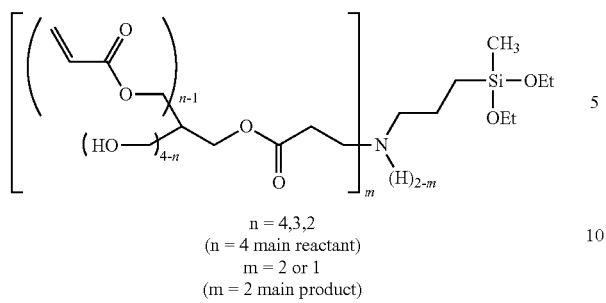

n = 4,3,2
(n = 4 main reactant)
m = 2 or 1
(m = 2 main product)

TABLE 5

|  | Pigment dispersion liquid | | | | Resin C | Photopolymerization initiator | Polymerizable compound |
| --- | --- | --- | --- | --- | --- | --- | --- |
|  | Type | (A) | (B) | (A):(B) | | | |
| Example 1 | Pigment dispersion liquid 1 | PG58 | PY185 | 70:30 | C-1 | OXE02 | TMMT |
| Example 2 | Pigment dispersion liquid 1 | PG58 | PY185 | 70:30 | C-2 | OXE02 | TMMT |
| Example 3 | Pigment dispersion liquid 1 | PG58 | PY185 | 70:30 | C-3 | OXE02 | TMMT |
| Example 4 | Pigment dispersion liquid 1 | PG58 | PY185 | 70:30 | C-4 | OXE02 | TMMT |
| Example 5 | Pigment dispersion liquid 2 | PG58 | PY139 | 70:30 | C-4 | OXE02 | TMMT |
| Example 6 | Pigment dispersion liquid 3-1 | G-2 | PY185 | 70:30 | C-4 | OXE02 | TMMT |
| Example 7 | Pigment dispersion liquid 3-2 | G-3 | PY185 | 70:30 | C-4 | OXE02 | TMMT |
| Example 8 | Pigment dispersion liquid 3-3 | G-4 | PY185 | 70:30 | C-4 | OXE02 | TMMT |
| Example 9 | Pigment dispersion liquid 3-4 | G-5 | PY185 | 70:30 | C-4 | OXE02 | TMMT |
| Example 10 | Pigment dispersion liquid 3-5 | G-6 | PY185 | 70:30 | C-4 | OXE02 | TMMT |
| Example 11 | Pigment dispersion liquid 3-6 | G-7 | PY185 | 70:30 | C-4 | OXE02 | TMMT |
| Example 12 | Pigment dispersion liquid 4 | PG58 | PY185 | 85:15 | C-4 | OXE02 | TMMT |
| Example 13 | Pigment dispersion liquid 5 | PG58 | PY185 | 80:20 | C-4 | OXE02 | TMMT |
| Example 14 | Pigment dispersion liquid 6 | PG58 | PY185 | 75:25 | C-4 | OXE02 | TMMT |
| Example 15 | Pigment dispersion liquid 7 | PG58 | PY185 | 65:40 | C-4 | OXE02 | TMMT |
| Example 16 | Pigment dispersion liquid 8 | PG58 | PY185 | 60:40 | C-4 | OXE02 | TMMT |
| Example 17 | Pigment dispersion liquid 9 | PG58 | PY185 | 55:45 | C-4 | OXE02 | TMMT |
| Example 18 | Pigment dispersion liquid 1 | PG58 | PY185 | 70:30 | C-5 | OXE02 | TMMT |
| Example 19 | Pigment dispersion liquid 1 | PG58 | PY185 | 70:30 | C-6 | OXE02 | TMMT |
| Example 20 | Pigment dispersion liquid 1 | PG58 | PY185 | 70:30 | C-7 | OXE02 | TMMT |
| Example 21 | Pigment dispersion liquid 1 | PG58 | PY185 | 70:30 | C-8 | OXE02 | TMMT |
| Example 22 | Pigment dispersion liquid 1 | PG58 | PY185 | 70:30 | C-9 | OXE02 | TMMT |
| Example 23 | Pigment dispersion liquid 1 | PG58 | PY185 | 70:30 | C-10 | OXE02 | TMMT |
| Example 24 | Pigment dispersion liquid 1 | PG58 | PY185 | 70:30 | C-11 | OXE02 | TMMT |
| Example 25 | Pigment dispersion liquid 1 | PG58 | PY185 | 70:30 | C-4 | OXE02 | TMMT |
| Example 26 | Pigment dispersion liquid 1 | PG58 | PY185 | 70:30 | C-4 | OXE02 | TMMT |
| Example 27 | Pigment dispersion liquid 1 | PG58 | PY185 | 70:30 | C-4 | OXE02 | TMMT |
| Example 28 | Pigment dispersion liquid 1 | PG58 | PY185 | 70:30 | C-12-1 | OXE02 | TMMT |
| Example 29 | Pigment dispersion liquid 1 | PG58 | PY185 | 70:30 | C-12-2 | OXE02 | TMMT |
| Example 30 | Pigment dispersion liquid 1 | PG58 | PY185 | 70:30 | C-12-3 | OXE02 | TMMT |
| Example 31 | Pigment dispersion liquid 1 | PG58 | PY185 | 70:30 | C-12-4 | OXE02 | TMMT |
| Example 32 | Pigment dispersion liquid 1 | PG58 | PY185 | 70:30 | C-12-5 | OXE02 | TMMT |
| Example 33 | Pigment dispersion liquid 1 | PG58 | PY185 | 70:30 | C-12-6 | OXE02 | TMMT |
| Example 34 | Pigment dispersion liquid 1 | PG58 | PY185 | 70:30 | C-13-1 | OXE02 | TMMT |
| Example 35 | Pigment dispersion liquid 1 | PG58 | PY185 | 70:30 | C-13-2 | OXE02 | TMMT |
| Example 36 | Pigment dispersion liquid 1 | PG58 | PY185 | 70:30 | C-13-3 | OXE02 | TMMT |
| Example 37 | Pigment dispersion liquid 1 | PG58 | PY185 | 70:30 | C-4 | I-1 | TMMT |
| Example 38 | Pigment dispersion liquid 1 | PG58 | PY185 | 70:30 | C-4 | OXE01 | TMMT |
| Example 39 | Pigment dispersion liquid 1 | PG58 | PY185 | 70:30 | C-4 | 1-2 | TMMT |
| Example 40 | Pigment dispersion liquid 1 | PG58 | PY185 | 70:30 | C-4 | 1-3 | TMMT |
| Example 41 | Pigment dispersion liquid 1 | PG58 | PY185 | 70:30 | C-14 | OXE02 | TMMT |
| Example 42 | Pigment dispersion liquid 1 | PG58 | PY185 | 70:30 | C-15 | OXE02 | TMMT |
| Example 43 | Pigment dispersion liquid 1 | PG58 | PY185 | 70:30 | C-14 | OXE02 | D-3 |
| Example 44 | Pigment dispersion liquid 1 | PG58 | PY185 | 70:30 | C-14 | OXE02 | D-10 |
| Comparative Example 1 | Pigment dispersion liquid 10 | PG58 | PY185 | 90:10 | C-3 | OXE02 | TMMT |
| Comparative Example 2 | Pigment dispersion liquid 11 | PG58 | PY185 | 50:50 | C-3 | OXE02 | TMMT |
| Comparative Example 3 | Pigment dispersion liquid 12 | PG58 | PY185 | 40:60 | C-3 | OXE02 | TMMT |
| Comparative Example 4 | Pigment dispersion liquid 1 | PG58 | PY185 | 70:30 | C-A | OXE02 | TMMT |
| Comparative Example 5 | Pigment dispersion liquid 1 | PG58 | PY185 | 70:30 | C-B | OXE02 | TMMT |
| Comparative Example 6 | Pigment dispersion liquid 1 | PG58 | PY185 | 70:30 | C-C | OXE02 | TMMT |
| Comparative Example 7 | Pigment dispersion liquid 1 | PG58 | PY185 | 70:30 | C-D | OXE02 | TMMT |

TABLE 5-continued

| | Pigment dispersion liquid | | | | | Photopolymerization | Polymerizable |
|---|---|---|---|---|---|---|---|
| | Type | (A) | (B) | (A):(B) | Resin C | initiator | compound |
| Comparative Example 8 | Pigment dispersion liquid 1 | PG58 | PY185 | 70:30 | C-E | OXE02 | TMMT |

TABLE 6

| | Pigment dispersion liquid | | | | | Photopolymerization | Polymerizable |
|---|---|---|---|---|---|---|---|
| | Type | (A) | (B) | (A):(B) | Resin C | initiator | compound |
| Example 45 | Pigment dispersion liquid 13 | PG58 | PY185 | 80:20 | C-12-1 | OXE01, I-1 | D-10, D-C, D-D |
| Example 46 | Pigment dispersion liquid 13 | PG58 | PY185 | 80:20 | C-18 | OXE01, I-1 | D-10, D-C, D-D |
| Example 47 | Pigment dispersion liquid 13 | PG58 | PY185 | 80:20 | C-19 | OXE01, I-1 | D-10, D-C, D-D |

(Photopolymerization Initiators)

OXE01: IRGACURE OXE-01 (manufactured by BASF)

OXE02: IRGACURE OXE-02 (manufactured by BASF)

I-1 to I-3: Compounds with the following structures

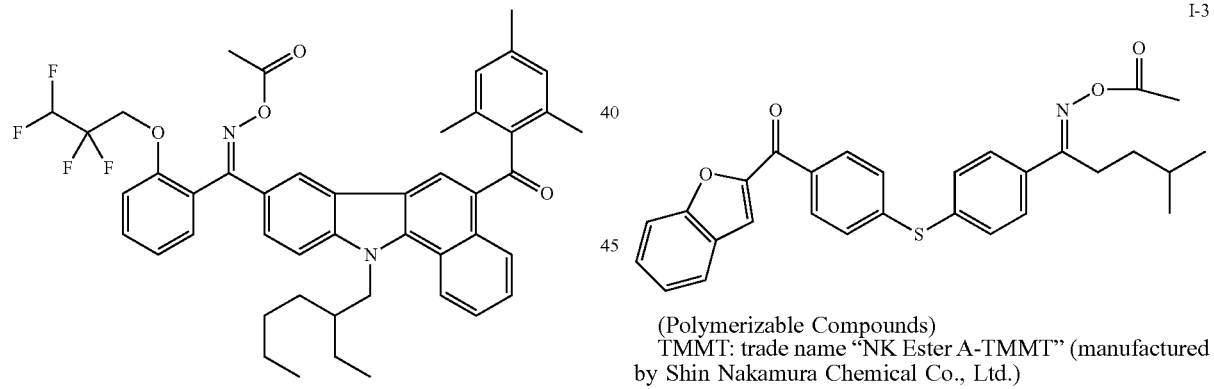

I-1

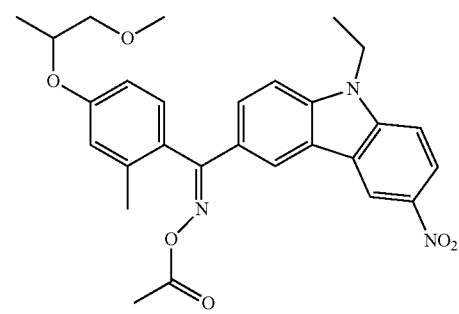

I-2

I-3

(Polymerizable Compounds)
TMMT: trade name "NK Ester A-TMMT" (manufactured by Shin Nakamura Chemical Co., Ltd.)
D-3 and D-10: Compounds with the following structures

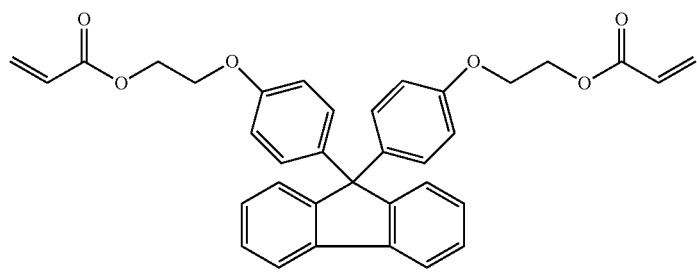

D-3

CLogP: 8.0

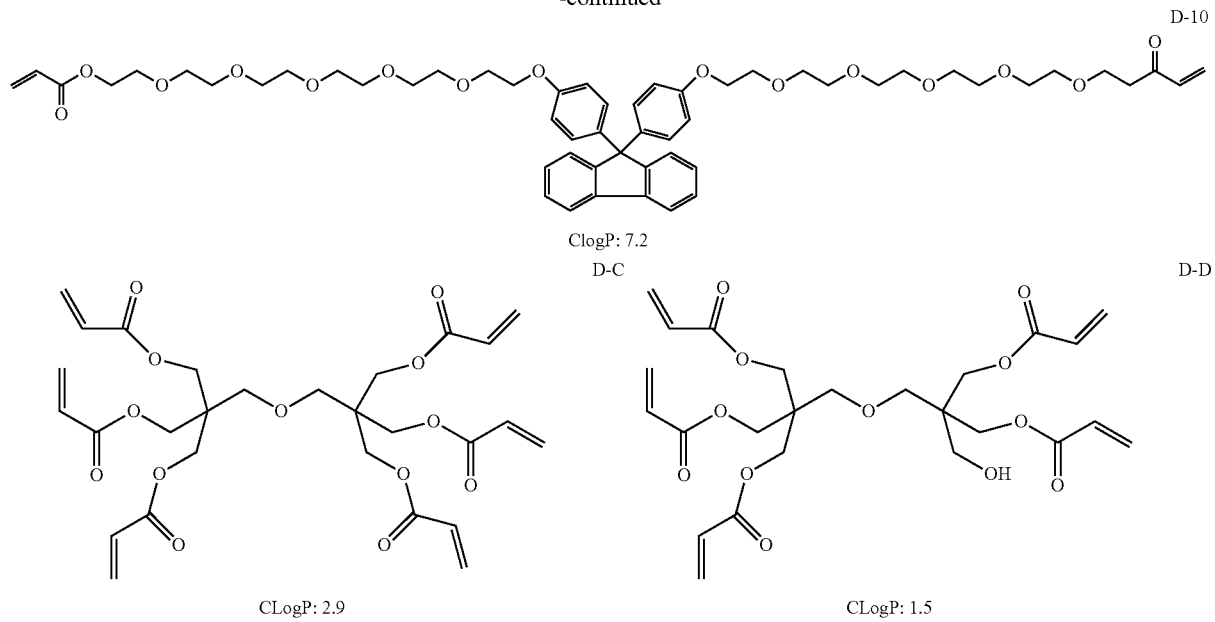
(Resins)
C-1 to C-11, C-12-1 to C-12-6, C-13-1 to C-13-3, C-14, C-15, C-18, C-19, and C-A to C-E: Resins with the following structures. The numerical values appended to the main chains are molar ratios.
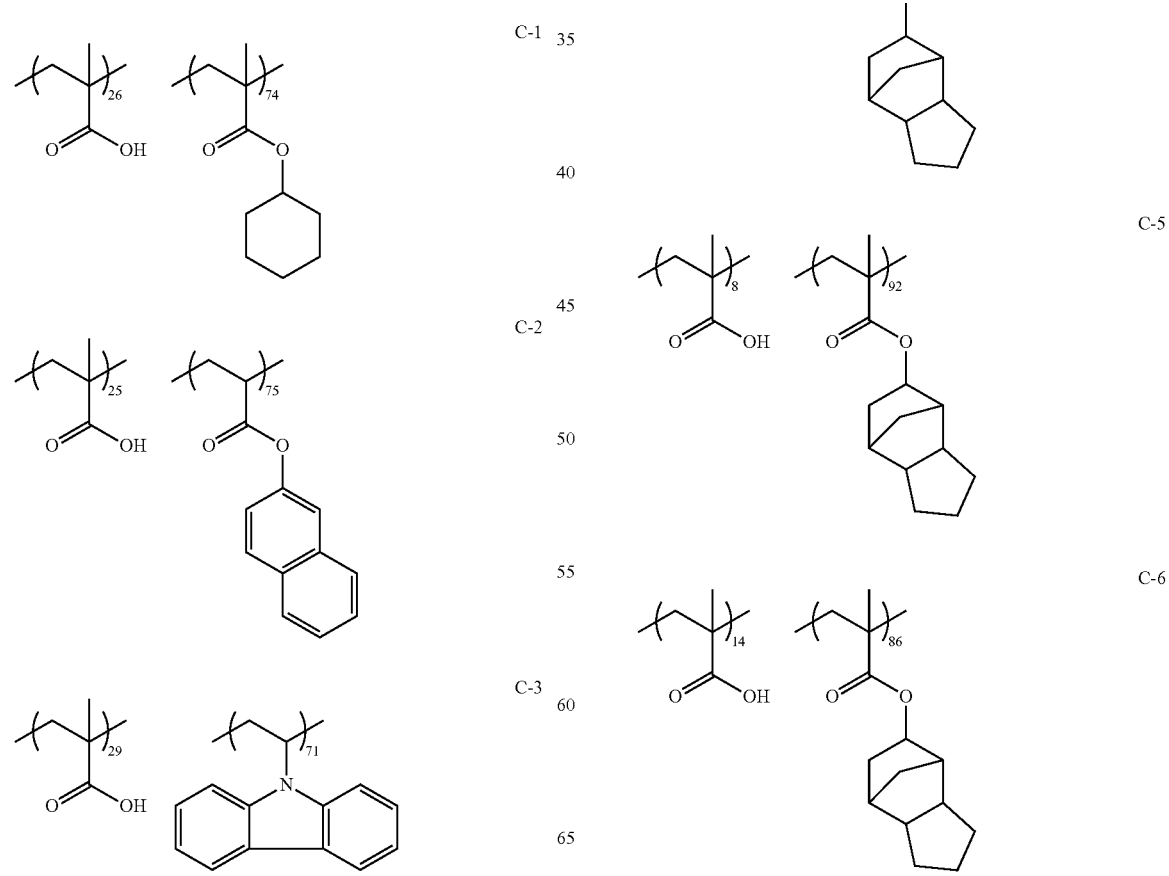

-continued
C-7 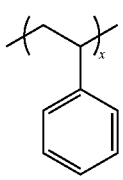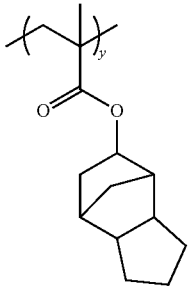
C-8
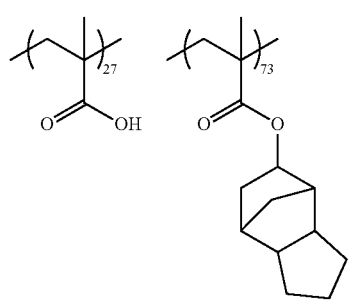
C-9 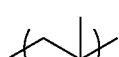
|  | x | y | z |
|---|---|---|---|
| C-12-1 | 10 | 30 | 60 |
| C-12-2 | 10 | 30 | 60 |
| C-12-3 | 10 | 30 | 60 |
| C-12-4 | 40 | 30 | 30 |
| C-12-5 | 40 | 30 | 30 |
| C-12-6 | 40 | 30 | 30 |
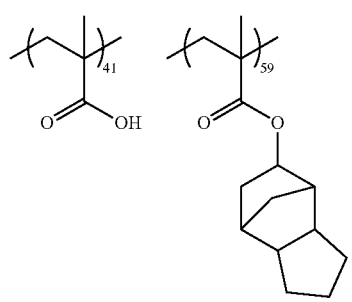
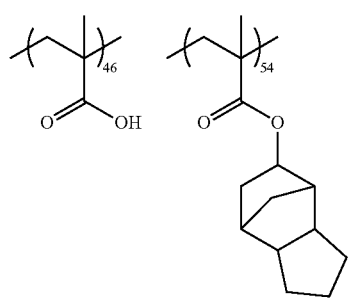
C-10 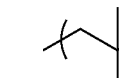
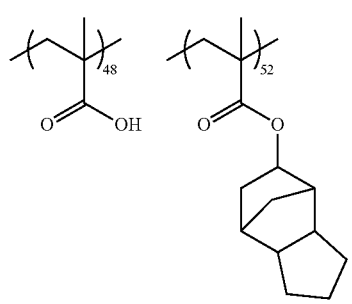
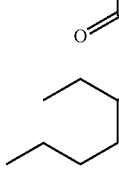
C-11 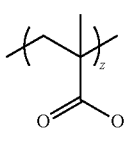
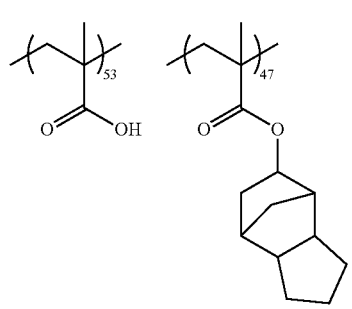
|  | x | y | z |
|---|---|---|---|
| C-13-1 | 20 | 30 | 50 |
| C-13-2 | 20 | 30 | 50 |
| C-13-3 | 20 | 30 | 50 |

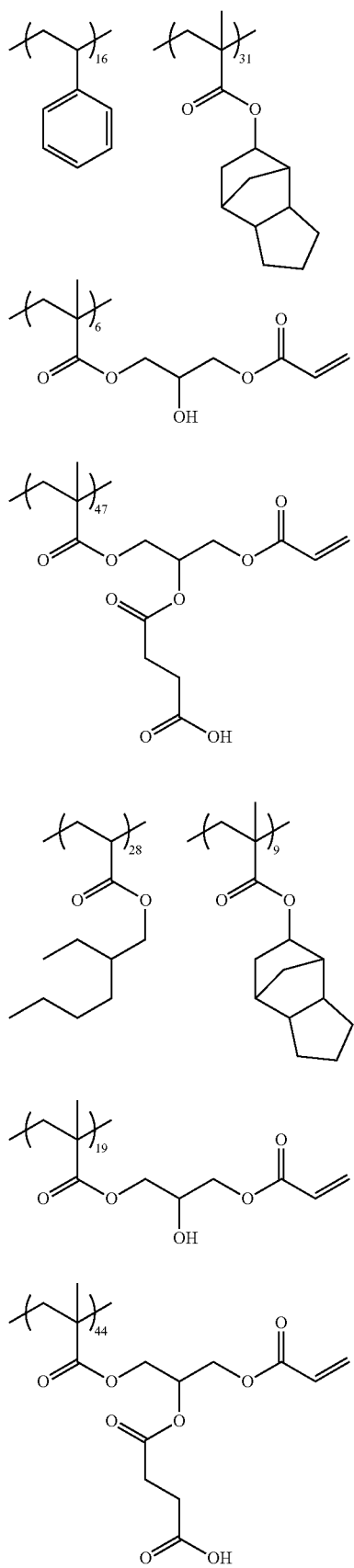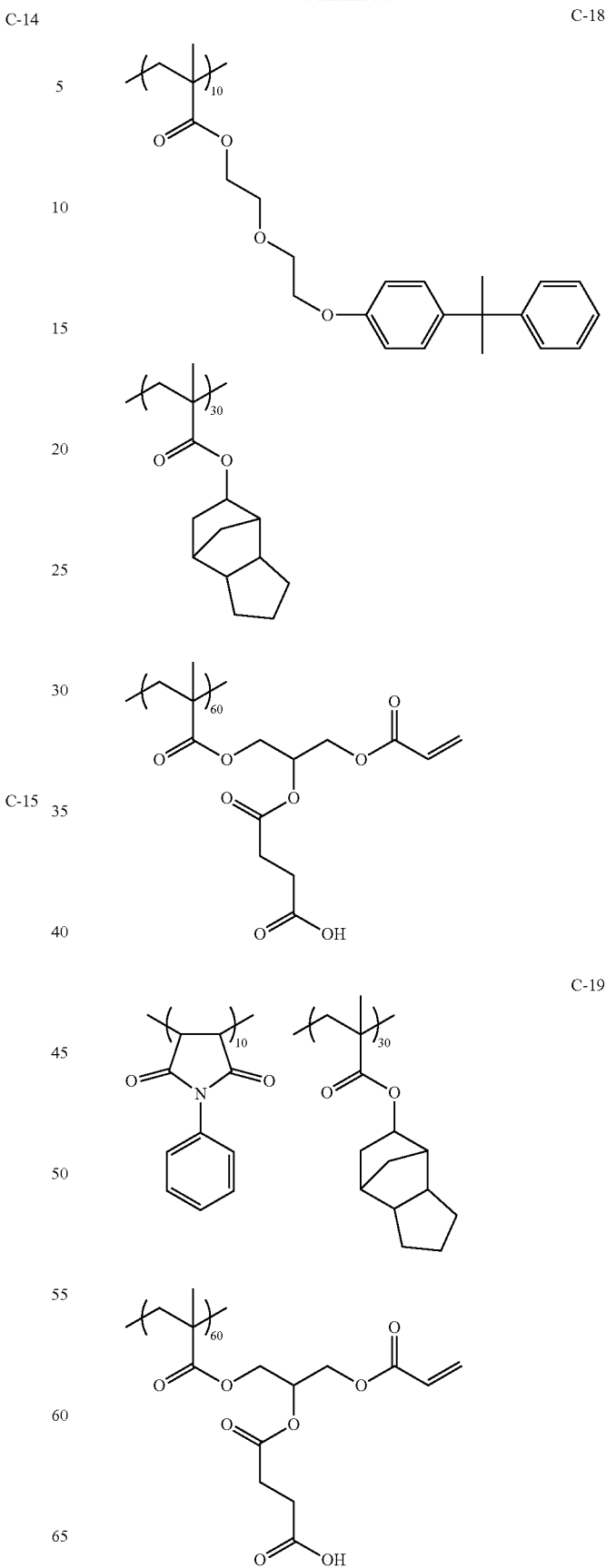

-continued

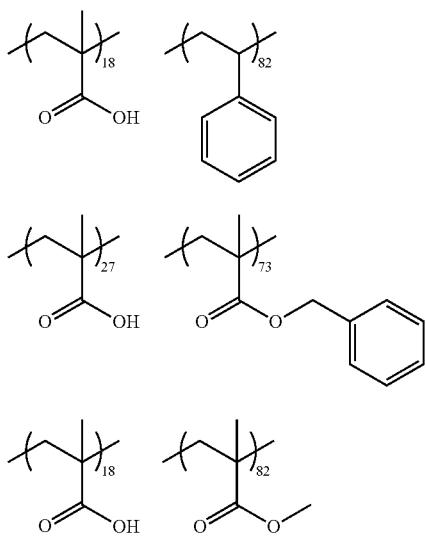

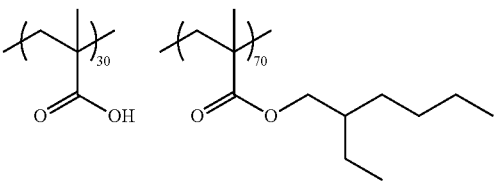

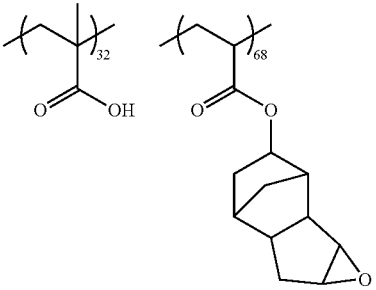

TABLE 7

| | Weight-average molecular weight | Acid value (mgKOH/g) | Copolymerization component | Copolymerization component having highest CLogP value, or copolymerization component having CLogP value of 3.0 or more | | |
|---|---|---|---|---|---|---|
| | | | | Type | CLogP value | Presence or absence of cyclic structure |
| C-1 | 10,000 | 100 | Cm-1, Cm-5 | Cm-1 | 3.1 | Present |
| C-2 | 10,000 | 100 | Cm-2, Cm-5 | Cm-2 | 4.0 | Present |
| C-3 | 10,000 | 100 | Cm-3, Cm-5 | Cm-3 | 4.2 | Present |
| C-4 | 10,000 | 100 | Cm-4, Cm-5 | Cm-4 | 4.3 | Present |
| C-5 | 10,000 | 20 | Cm-4, Cm-5 | Cm-4 | 4.3 | Present |
| C-6 | 10,000 | 40 | Cm-4, Cm-5 | Cm-4 | 4.3 | Present |
| C-7 | 10,000 | 80 | Cm-4, Cm-5 | Cm-4 | 4.3 | Present |
| C-8 | 10,000 | 140 | Cm-4, Cm-5 | Cm-4 | 4.3 | Present |
| C-9 | 10,000 | 160 | Cm-4, Cm-5 | Cm-4 | 4.3 | Present |
| C-10 | 10,000 | 170 | Cm-4, Cm-5 | Cm-4 | 4.3 | Present |
| C-11 | 10,000 | 200 | Cm-4, Cm-5 | Cm-4 | 4.3 | Present |
| C-12-1 | 5,000 | 120 | Cm-4, Cm-8, Cm-11 | Cm-4 | 4.3 | Present |
| C-12-2 | 10,000 | 120 | Cm-4, Cm-8, Cm-11 | Cm-4 | 4.3 | Present |
| C-12-3 | 20,000 | 120 | Cm-4, Cm-8, Cm-11 | Cm-4 | 4.3 | Present |
| C-12-4 | 5,000 | 100 | Cm-4, Cm-8, Cm-11 | Cm-4 | 4.3 | Present |
| C-12-5 | 10,000 | 100 | Cm-4, Cm-8, Cm-11 | Cm-4 | 4.3 | Present |
| C-12-6 | 20,000 | 100 | Cm-4, Cm-8, Cm-11 | Cm-4 | 4.3 | Present |
| C-13-1 | 5,000 | 100 | Cm-4, Cm-11, Cm-6 | Cm-4, Cm-6 | 4.3, 4.7 | Present |
| C-13-2 | 10,000 | 100 | Cm-4, Cm-11, Cm-6 | Cm-4, Cm-6 | 4.3, 4.7 | Present |
| C-13-3 | 20,000 | 100 | Cm-4, Cm-11, Cm-6 | Cm-4, Cm-6 | 4.3, 4.7 | Present |
| C-14 | 5,500 | 90 | Cm-4, Cm-8, Cm-11, Cm-12 | Cm-4 | 4.3 | Present |
| C-15 | 6,500 | 95 | Cm-4, Cm-11, Cm-12, Cm-13 | Cm4, Cm-13 | 4.3, 4.4 | Present |
| C-18 | 12,000 | 120 | Cm-14, Cm-4, Cm-11 | Cm-4 | 4.3 | Present |
| C-19 | 8,000 | 130 | Cm-15, Cm-4, Cm-11 | Cm-4 | 4.3 | Present |
| C-A | 10,000 | 100 | Cm-8, Cm-5 | Cm-8 | 2.9 | Present |
| C-B | 10,000 | 100 | Cm-9, Cm-5 | Cm-9 | 2.9 | Present |
| C-C | 10,000 | 100 | Cm-10, Cm-5 | Cm-10 | 1.1 | Absent |
| C-D | 10,000 | 100 | Cm-6, Cm-5 | Cm-6 | 4.7 | Absent |
| C-E | 10,000 | 100 | Cm-7, Cm-5 | Cm-7 | 1.8 | Present |

The copolymerization components described in the table are compounds shown below. Further, the numerical values of C log P appended to the following structural formulae are the C Log P values of the same compounds.
Cm-1
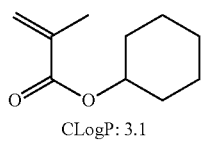
CLogP: 3.1
Cm-2
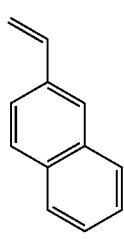
CLogP: 4.0
Cm-3
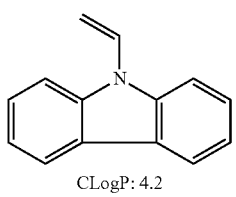
CLogP: 4.2
Cm-4
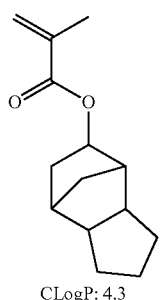
CLogP: 4.3
Cm-5
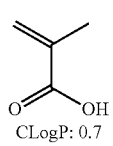
CLogP: 0.7
Cm-6
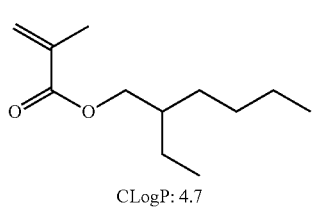
CLogP: 4.7
-continued
Cm-7
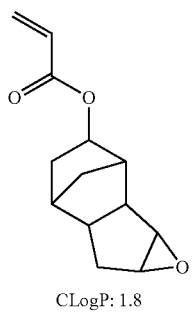
CLogP: 1.8
Cm-8
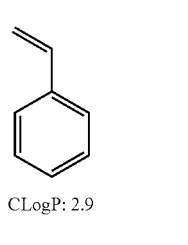
CLogP: 2.9
Cm-9
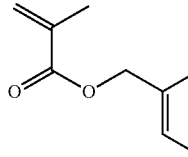
CLogP: 2.9
Cm-10
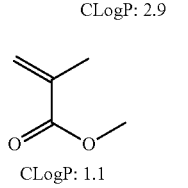
CLogP: 1.1
Cm-11
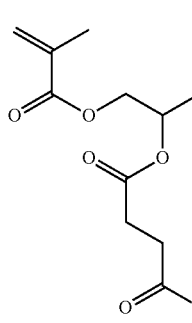
CLogP: 1.5
Cm-12
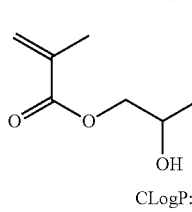
CLogP: 0.8
Cm-13
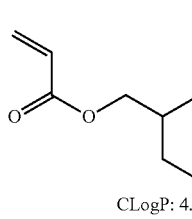
CLogP: 4.4

-continued

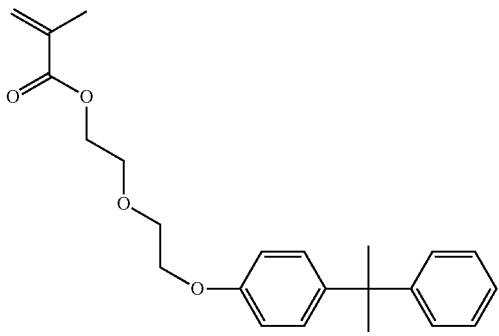

Cm-14

CLogP: 5.8

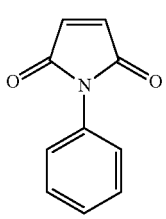

Cm-15

CLogP: 1.2

<Manufacture of Substrate for Spectroscopic Measurement>

Each of the coloring compositions was applied onto soda glass (75 mm×75 mm square, thickness of 1.1 mm) with a spin coater (H-360S [trade name], manufactured by Mikasa Co., Ltd.). Then, pre-baking was carried out at 100° C. for 2 minutes using a hot plate to obtain a coating film.

The obtained coating film was exposed at 1,000 mJ/cm$^2$ by an ultrahigh pressure mercury lamp ("USH-500BY" (trade name)) manufactured by Ushio Inc. Subsequently, the coating film after exposure was heated on a hot plate in an air atmosphere at 200° C. for 5 minutes to obtain a cured film having a film thickness of 0.5 m.

For the obtained cured film, a light transmittance (transmittance) in the range of 400 nm to 700 nm was measured using "MCPD-3000" (trade name) manufactured by Otsuka Electronics Co., Ltd. The test was carried out five times for each sample, and an average value of the results from the three tests excluding the maximum and minimum values was employed.

<Evaluation Test on Light Resistance>

(Light Resistance 1)

The cured film prepared above was equipped with an ultraviolet ray-shielding filter (KU-1000100 [trade name] manufactured by AS ONE Corporation), and irradiated with light at 100,000 lux for 50 hours (cumulative irradiation: 5,000,000 luxh), using a light resistance tester (Xenon Weather Meter SX75 [trade name] manufactured by Suga Test Instruments Co., Ltd.) to perform a light resistance test. A temperature of the cured film (a temperature within the test device) was set to 63° C. A relative humidity within the test device was set to 50%. A variation in the transmittance of the cured film after the light resistance test was measured, and the light resistance was evaluated in accordance with the following standard. The test was performed five times for the cured film prepared under the same conditions, and an average value of the results from the three tests excluding the maximum and minimum values was employed. Further, the variation in the transmittance indicates a variation with respect to a wavelength with the highest variation in the transmittance in the range of a wavelength of 400 nm to 700 nm (|the transmittance (%) before the light resistance test−the transmittance (%) after the light resistance test|).

5: The variation in the transmittance is 3% or less.
4: The variation in the transmittance is more than 3% and 5% or less.
3: The variation in the transmittance is more than 5% and 7% or less.
2: The variation in the transmittance is more than 7% and 10% or less.
1: The variation in the transmittance is more than 10%.

(Light Resistance 2)

The light resistance was evaluated by the same test method as in Light Resistance 1 except that the relative humidity within the device was changed from 50% to 90% with regard to the conditions for the light resistance 1.

(Light Resistance 3)

A 100-nm SiO$_2$ film was vapor-deposited on the cured film prepared above by a chemical vapor deposition (CVD) method. The obtained cured film after completion of the vapor deposition treatment was equipped with an ultraviolet ray-shielding filter (KU-1000100 [trade name] manufactured by AS ONE Corporation), and irradiated with light at 100,000 lux for 50 hours (cumulative irradiation: 5,000,000 luxh) using a light resistance tester (Xenon Weather Meter SX75 [trade name] manufactured by Suga Test Instruments Co., Ltd.) to perform a light resistance test. A temperature of the cured film (a temperature within the test device) was set to 63° C. A relative humidity within the test device was set to 50%. The light resistance was evaluated in accordance with the following standard, depending on a variation in the transmittance of the cured film after the light resistance test. The test was performed five times for the cured film prepared under the same conditions, and an average value of the results from the three tests excluding the maximum and minimum values was employed. In a similar manner to the above, the variation in the transmittance indicates a variation with respect to a wavelength with the highest variation in the transmittance in the range of a wavelength of 400 nm to 700 nm.

5: The variation in the transmittance is 3% or less.
4: The variation in the transmittance is more than 3% and 5% or less.
3: The variation in the transmittance is more than 5% and 7% or less.
2: The variation in the transmittance is more than 7% and 10% or less.
1: The variation in the transmittance is more than 10%.

(Light Resistance 4)

The cured film prepared above was equipped with an ultraviolet ray-shielding filter (KU-1000100 [trade name] manufactured by AS ONE Corporation). The cured film was irradiated with light at 100,000 lux for 100 hours (cumulative irradiation: 10,000,000 luxh), using a light resistance tester (Xenon Weather Meter SX75 [trade name] manufactured by Suga Test Instruments Co., Ltd.), to perform a light resistance test. A temperature of the cured film (a temperature within the test device) was set to 63° C. A relative humidity within the test device was set to 50%. The light resistance was evaluated in accordance with the evaluation standard in Light Resistance 1. Further, the test in Light Resistance 4 was carried out only for the cured films of Examples 41 to 44.

<Evaluation Test on Lithographic Property (Developability)>

The coloring composition obtained above was applied onto an 8-inch (1 inch=2.54 cm) silicon wafer with an undercoat layer by a spin coating method using Act8 [trade name] manufactured by Tokyo Electron Ltd. such that the film thickness after application reached 0.7 µm, and then heated on a hot plate at 100° C. for 2 minutes to obtain a cured film.

Subsequently, the obtained cured film was exposed (at an exposure dose of 50 to 1,700 mJ/cm$^2$) through a mask with a pattern in 2.0 µm×2.0 µm, using an i-ray stepper exposure device "FPA-3000i5+" (trade name, manufactured by Canon Inc.).

Then, the cured film after exposure was developed using a developing device (Act8 [trade name] manufactured by Tokyo Electron Ltd.). Shower development was performed at 23° C. for 60 seconds using a 0.3%-by-mass aqueous tetramethylammonium hydroxide (TMAH) solution as a developer. Thereafter, rinsing was performed by spin shower using pure water to obtain a pattern.

The obtained pattern was observed using a scanning electron microscope (SEM) (S-4800H [trade name], manufactured by Hitachi High-Technologies Corporation) at a magnification of 20,000. Further, based on the observed image, the lithographic performance was evaluated in accordance with the following standard. The evaluation test on the lithographic performance was performed three times for each of the coloring compositions, and the results were comprehensively evaluated.

5: The pattern is clear and there is no residue.
4: The pattern is clear and there are little residues.
3: The pattern is in a slightly tapered shape but there are little residues.
2: The pattern is in a tapered shape and there are many residues.
1: A pattern is not formed.

TABLE 8

| | Light resistance 1 | Light resistance 2 | Light resistance 3 | Light resistance 4 | Lithographic property |
|---|---|---|---|---|---|
| Example 1 | 4 | 4 | 3 | — | 5 |
| Example 2 | 5 | 4 | 4 | — | 5 |
| Example 3 | 4 | 3 | 3 | — | 5 |
| Example 4 | 5 | 5 | 5 | — | 5 |
| Example 5 | 5 | 4 | 5 | — | 5 |
| Example 6 | 5 | 5 | 5 | — | 5 |
| Example 7 | 5 | 5 | 5 | — | 5 |
| Example 8 | 5 | 5 | 5 | — | 5 |
| Example 9 | 5 | 5 | 5 | — | 5 |
| Example 10 | 5 | 5 | 5 | — | 5 |
| Example 11 | 5 | 5 | 5 | — | 5 |
| Example 12 | 5 | 5 | 3 | — | 5 |
| Example 13 | 5 | 5 | 4 | — | 5 |
| Example 14 | 5 | 5 | 5 | — | 5 |
| Example 15 | 5 | 4 | 5 | — | 5 |
| Example 16 | 5 | 3 | 5 | — | 5 |
| Example 17 | 4 | 3 | 4 | — | 5 |
| Example 18 | 5 | 4 | 4 | — | 3 |
| Example 19 | 5 | 5 | 4 | — | 4 |
| Example 20 | 5 | 5 | 5 | — | 5 |
| Example 21 | 5 | 5 | 5 | — | 5 |
| Example 22 | 5 | 4 | 4 | — | 5 |
| Example 23 | 4 | 3 | 3 | — | 5 |
| Example 24 | 4 | 3 | 3 | — | 4 |
| Example 25 | 4 | 3 | 3 | — | 5 |
| Example 26 | 5 | 4 | 4 | — | 5 |
| Example 27 | 5 | 5 | 4 | — | 5 |
| Example 28 | 5 | 5 | 5 | — | 5 |

TABLE 8-continued

| | Light resistance 1 | Light resistance 2 | Light resistance 3 | Light resistance 4 | Lithographic property |
|---|---|---|---|---|---|
| Example 29 | 5 | 5 | 5 | — | 5 |
| Example 30 | 5 | 5 | 5 | — | 4 |
| Example 31 | 5 | 5 | 5 | — | 5 |
| Example 32 | 5 | 5 | 5 | — | 5 |
| Example 33 | 5 | 5 | 5 | — | 4 |
| Example 34 | 5 | 5 | 5 | — | 5 |
| Example 35 | 5 | 5 | 5 | — | 5 |
| Example 36 | 5 | 5 | 5 | — | 4 |
| Example 37 | 5 | 5 | 5 | — | 5 |
| Example 38 | 5 | 5 | 5 | — | 5 |
| Example 39 | 5 | 5 | 5 | — | 5 |
| Example 40 | 5 | 5 | 5 | — | 5 |
| Example 41 | 5 | 5 | 5 | 4 | 5 |
| Example 42 | 5 | 4 | 4 | 3 | 5 |
| Example 43 | 5 | 5 | 5 | 5 | 5 |
| Example 44 | 5 | 5 | 5 | 5 | 5 |
| Example 45 | 5 | 5 | 5 | — | 5 |
| Example 46 | 5 | 5 | 5 | — | 5 |
| Example 47 | 5 | 5 | 5 | — | 5 |

TABLE 9

| | Light resistance 1 | Light resistance 2 | Light resistance 3 | Light resistance 4 | Lithographic property |
|---|---|---|---|---|---|
| Comparative Example 1 | 5 | 5 | 2 | — | 5 |
| Comparative Example 2 | 3 | 2 | 4 | — | 5 |
| Comparative Example 3 | 2 | 1 | 4 | — | 5 |
| Comparative Example 4 | 3 | 2 | 3 | — | 5 |
| Comparative Example 5 | 2 | 1 | 2 | — | 5 |
| Comparative Example 6 | 2 | 1 | 1 | — | 5 |
| Comparative Example 7 | 3 | 2 | 3 | — | 5 |
| Comparative Example 8 | 2 | 2 | 1 | — | 5 |

As clearly seen from the results, in Examples, any of evaluations of Light Resistance 1 to 3 (in Examples 41 to 44, any of evaluations of Light Resistance 1 to 4) were found to be "3" or more and the light resistance was excellent. To the contrary, in Comparative Examples, at least one of the evaluations of Light Resistance 1, 2 or 3 was found to be "1" or "2, and the light resistance was deteriorated.

Test Example 2

<Method for Preparing Coloring Composition for Dry Etching>

Example 101

PGMEA: 22.83 parts by mass
Resin C-12-4: 1.47 parts by mass
Surfactant W-1 (siloxane-based): 0.01 parts by mass
Compound having an epoxy group (trade name "EHPE 3150" manufactured by Daicel Chemical Industries, Ltd.): 0.69 parts by mass
Pigment dispersion liquid 1: 75.00 parts by mass (15.00 parts by mass in terms of a solid content)

Example 102

PGMEA: 22.80 parts by mass
Resin C-12-4: 1.47 parts by mass
Polymerizable compound (trade name "NK Ester A-TMMT" manufactured by Shin-Nakamura Chemical Co., Ltd.): 0.71 parts by mass
Surfactant W-1 (siloxane-based): 0.01 parts by mass
Polymerization inhibitor (p-methoxyphenol): 0.01 parts by mass
Pigment dispersion liquid described in the following table: 75.00 parts by mass (15.00 parts by mass in terms of a solid content)

Example 103

PGMEA: 24.54 parts by mass
Resin C-12-4: 1.59 parts by mass
Polymerizable compound (trade name "NK Ester A-TMMT" manufactured by Shin-Nakamura Chemical Co., Ltd.): 0.72 parts by mass
Surfactant W-1 (siloxane-based): 0.01 parts by mass
Photopolymerization initiator (IRGACURE OXE-02): 0.28 parts by mass
Polymerization inhibitor (p-methoxyphenol): 0.01 parts by mass
Pigment dispersion liquid 1: 72.85 parts by mass (14.57 parts by mass in terms of a solid content)

Example 104

The same composition as in Example 31.
<Patterning Method by Dry Etching>
Each of the coloring compositions obtained above was applied onto an 8-inch (1 inch=2.54 cm) silicon wafer with an undercoat layer by a spin coating method using Act8 [trade name] manufactured by Tokyo Electron Ltd. such that the film thickness after application reached 0.7 μm, and then heated on a hot plate at 100° C. for 2 minutes. Then, only in Examples 103 and 104, entire exposure was performed at an exposure dose of 1,000 mJ/cm² using an i-ray stepper exposure device "FPA-3000i5+" (trade name, manufactured by Canon Inc.).

Subsequently (after the heating in Examples 101 and 102, and after the exposure in Examples 102 and 103), the cured film was heated at 200° C. for 5 minutes using a hot plate in an air atmosphere to obtain a cured film (green layer).

Then, the photoresist composition described in Example 2 in paragraph 0328 of JP2010-134283A was applied onto the cured film (green layer) and heated at 120° C. for 60 seconds to form a photoresist layer with a film thickness of 0.7 μm. This photoresist layer was subjected to pattern exposure through a mask using a KrF excimer laser scanner (PAS5500/850C manufactured by ASML, wavelength of 248 nm, NA=0.70, and Sigma=0.80). After the irradiation, the photoresist layer was heated at 130° C. for 60 seconds, developed using a 2.38%-by-mass aqueous tetramethylammonium hydroxide (TMAH) solution for 60 seconds, then rinsed with water for 30 seconds, and subjected to a post-baking treatment at 110° C. for 1 minute to form a resist pattern with a film thickness of 0.8 μm.

Next, using the resist pattern as an etching mask, dry etching of the cured film (green layer) was performed in the following procedure.

A first-step etching treatment was performed for 80 seconds, using a dry etching device (U-621 manufactured by Hitachi High-Technologies Corporation) with an RF (radio frequency) power: 800 W, an antenna bias: 400 W, a wafer bias: 200 W, an internal pressure of a chamber: 4.0 Pa, a substrate temperature: 50° C., and types and flow rates of a mixed gas: $CF_4$: 80 mL/min, $O_2$: 40 mL/min, and Ar: 800 mL/min. Then, in the same etching chamber, a second-step etching treatment and an over-etching treatment were performed with an RF power: 600 W, an antenna bias: 100 W, a wafer bias: 250 W, an internal pressure of a chamber: 2.0 Pa, a substrate temperature: 50° C., the types and flow rates of a mixed gas: $N_2$: 500 mL/min, $O_2$: 50 mL/min, and Ar: 500 mL/min ($N_2/O_2/Ar$=10/1/10), and an over-etching rate of 20% in the total etching.

After carrying out the dry etching treatment under the conditions, a peeling treatment was carried out for 120 seconds using a photoresist peeling liquid "MS230C" (manufactured by Fujifilm Electronics Materials Co., Ltd.) to remove the resist pattern, and further, washing with pure water and spin drying were performed. Thereafter, a dehydration baking treatment was performed at 100° C. for 2 minutes, thereby obtaining a green pattern. The size of the green pattern was 0.8 μm.

In cases using any of the coloring compositions, a rectangular green pattern suitable for the manufacture of a solid-state imaging element was formed.

<Light Resistance Test>
For the patterns using the coloring compositions of Examples 101 to 104, the same light resistance test as in Test Example 1 was carried out, and thus, the results equivalent to those in Example 31 were obtained.

What is claimed is:

1. A coloring composition comprising:
   a halogenated zinc phthalocyanine pigment A;
   an isoindoline pigment B;
   a resin C; and
   a curable compound D,
   wherein the resin C includes a resin C1 which does not include an epoxy group, but has a repeating unit formed by polymerizing a polymerizable compound Cm having a C Log P value of 3.0 or more with the C Log P value being a calculated value of a Log P which is the common logarithm of a partition coefficient P of 1-octanol/water, and having a cyclic structure in a molecule thereof,
   a ratio of the mass of the halogenated zinc phthalocyanine pigment A to the mass of the isoindoline pigment B is 55:45 to 75:25 in terms of the mass of the halogenated zinc phthalocyanine pigment A:the mass of the isoindoline pigment B, and
   the coloring composition includes no coloring agents other than the halogenated zinc phthalocyanine pigment A and the isoindoline pigment B.

2. The coloring composition according to claim 1, wherein the resin C1 is contained in the amount of 5% by mass or more with respect to the total mass of the resin C.

3. The coloring composition according to claim 1, wherein the repeating unit formed by polymerizing the polymerizable compound Cm is contained in the amount of 5% to 95% by mole with respect to all the repeating units of the resin C1.

4. The coloring composition according to claim 1, wherein the resin C1 further has a repeating unit having an acid group.

5. The coloring composition according to claim 1, wherein the polymerizable compound Cm has at least one selected from an aliphatic ring or an aromatic hydrocarbon ring.

6. The coloring composition according to claim 1, wherein an acid value of the resin C1 is 10 to 160 mgKOH/g.

7. The coloring composition according to claim 1, wherein the curable compound D includes a polymerizable compound.

8. The coloring composition according to claim 7, further comprising a photopolymerization initiator.

9. The coloring composition according to claim 1, wherein the curable compound D includes a compound having an epoxy group.

10. The coloring composition according to claim 1, wherein the ratio of the mass of the halogenated zinc phthalocyanine pigment A to the mass of the isoindoline pigment B is 55:45 to 66:34.

11. The coloring composition according to claim 1, wherein the isoindoline pigment B is C. I. Pigment Yellow 139 or C. I. Pigment Yellow 185.

12. The coloring composition according to claim 1, wherein the isoindoline pigment B is C. I. Pigment Yellow 139.

13. The coloring composition according to claim 1, wherein the C Log P value of the polymerizable compound D1 is 4.0 to 12.0.

14. A pattern forming method comprising:
forming a coloring composition layer on a support using the coloring composition according to claim 1; and
forming a pattern on the coloring composition layer by a photolithographic method or a dry etching method.

15. A color filter using the coloring composition according to claim 1.

16. A solid-state imaging element comprising the color filter according to claim 15.

17. An image display device comprising the color filter according to claim 15.

* * * * *